United States Patent
Aoki et al.

(10) Patent No.: US 8,421,312 B2
(45) Date of Patent: Apr. 16, 2013

(54) ACCELERATION SENSOR HAVING POLARIZED PIEZOELECTRIC LAYER INTERPOSED BETWEEN SENSING ELECTRODES

(75) Inventors: Tsuyoshi Aoki, Kawasaki (JP); Kazuaki Kurihara, Kawasaki (JP); Shigeyoshi Umemiya, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 13/328,087

(22) Filed: Dec. 16, 2011

(65) Prior Publication Data

US 2012/0086311 A1 Apr. 12, 2012

Related U.S. Application Data

(63) Continuation of application No. PCT/JP2009/061983, filed on Jun. 30, 2009.

(51) Int. Cl.
*H01L 41/04* (2006.01)
(52) U.S. Cl.
USPC .......................................... 310/338; 310/328
(58) Field of Classification Search ............. 310/323.21; 73/514.34
See application file for complete search history.

(56) References Cited

U.S. PATENT DOCUMENTS

| 7,923,896 | B2* | 4/2011 | Kimura et al. ............ 310/313 A |
| 8,207,653 | B2* | 6/2012 | Kurihara et al. ............... 310/339 |
| 2012/0112765 | A1* | 5/2012 | Sparks et al. .................. 324/633 |

FOREIGN PATENT DOCUMENTS

| JP | 2002-162408 A | 6/2002 |
| JP | 2005-342817 A | 12/2005 |
| JP | 2007-107990 A | 4/2007 |
| JP | 2009-008512 A | 1/2009 |

OTHER PUBLICATIONS

Machine Translation for reference: JP 2007-107990 A.*
International Search Report of PCT/JP2009/061983, mailing date Sep. 29, 2009.

* cited by examiner

*Primary Examiner* — J. San Martin
(74) *Attorney, Agent, or Firm* — Westerman, Hattori, Daniels & Adrian, LLP

(57) ABSTRACT

An acceleration sensor includes a piezoelectric layer formed on a substrate, and sensing electrodes formed in the piezoelectric layer. In the acceleration sensor, the piezoelectric layer interposing between the sensing electrodes is polarized in a film thickness direction of the piezoelectric layer.

18 Claims, 70 Drawing Sheets

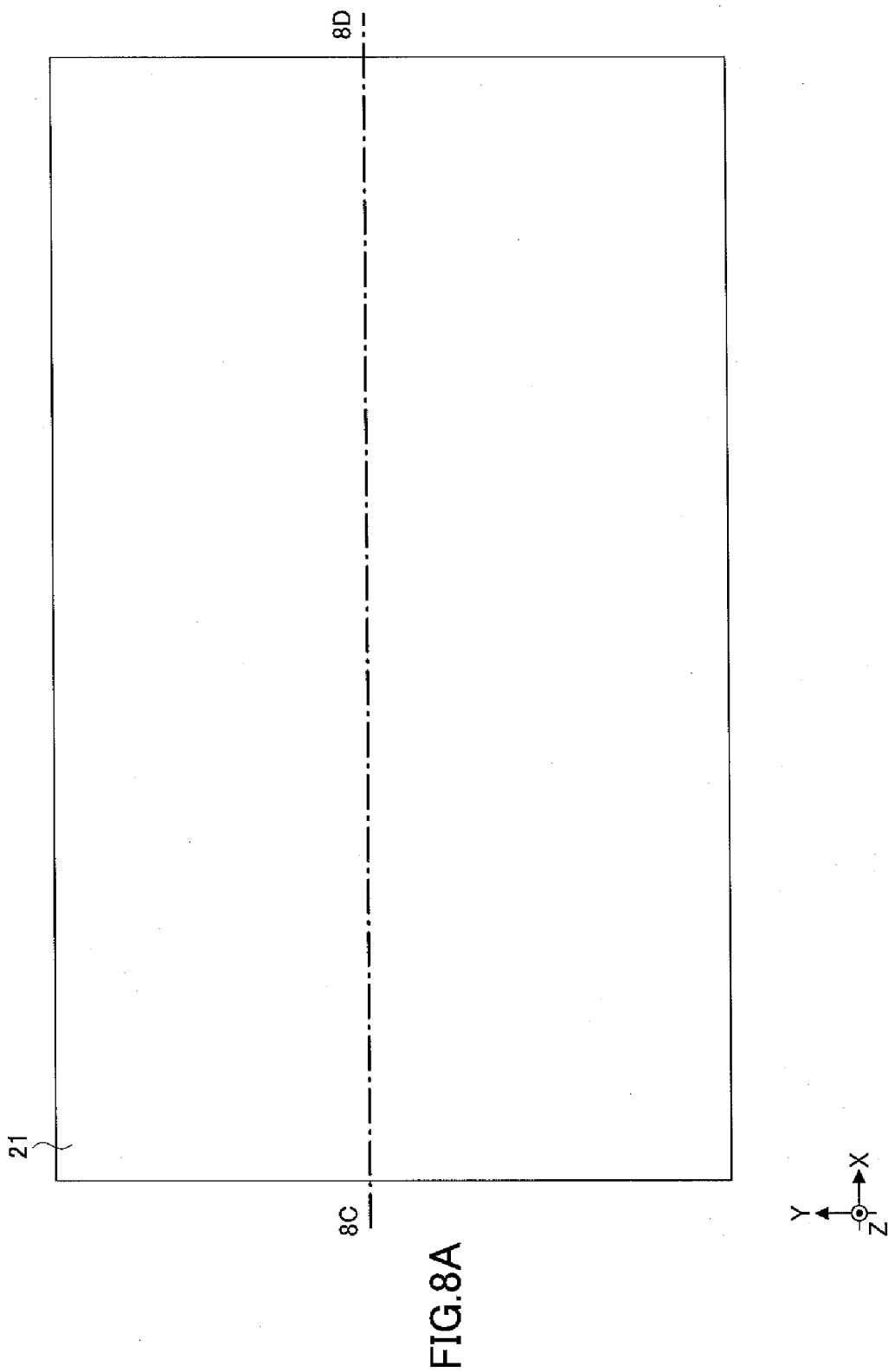

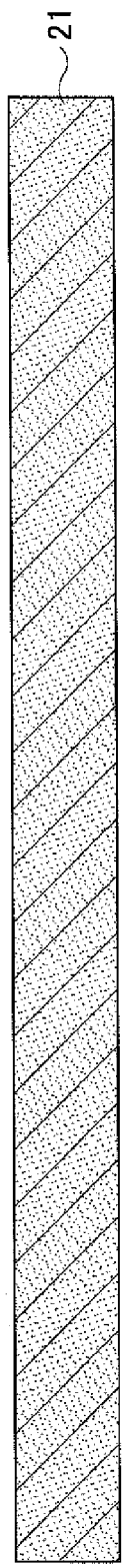
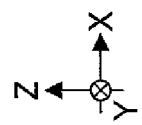
FIG.8B

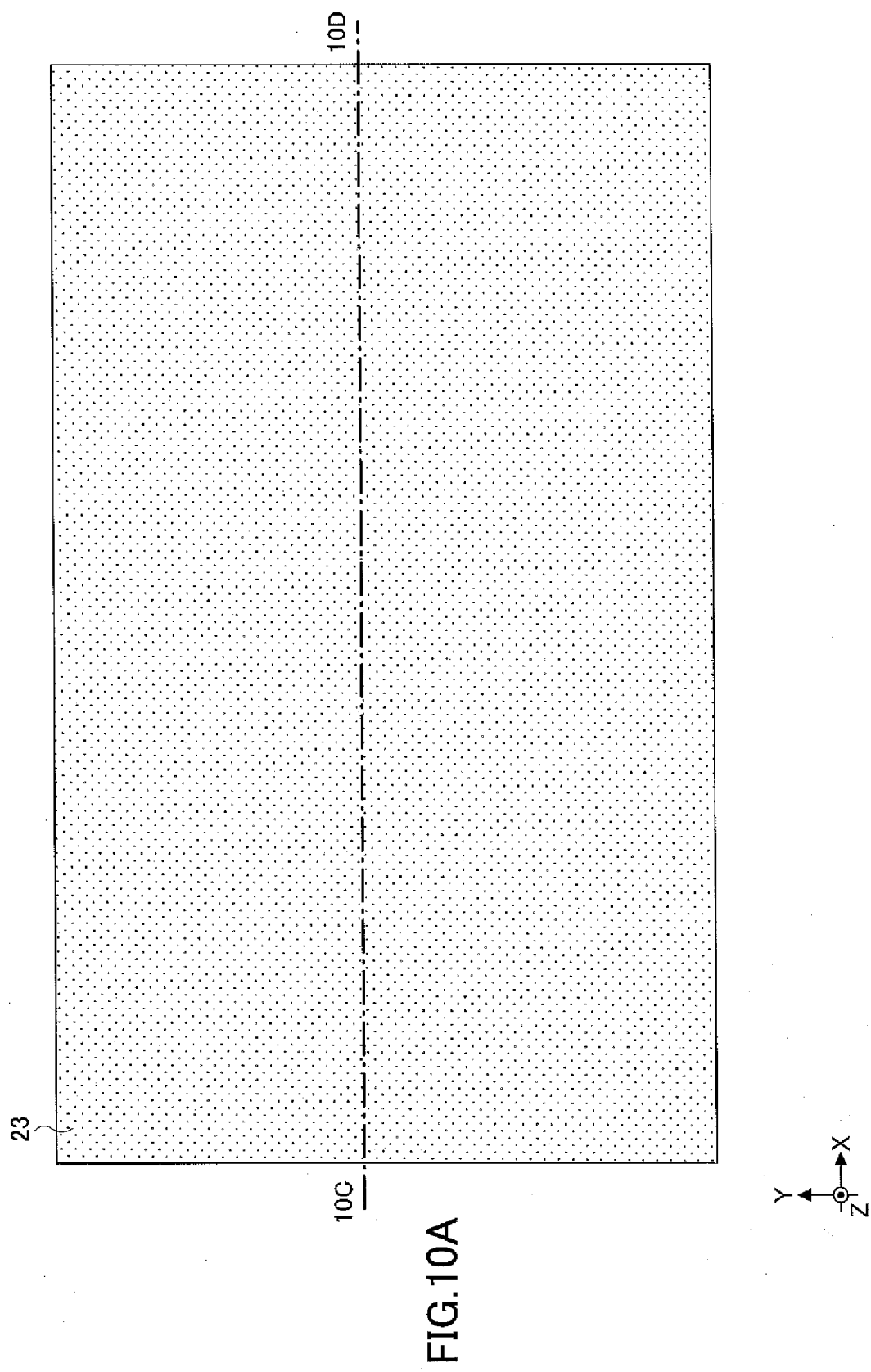

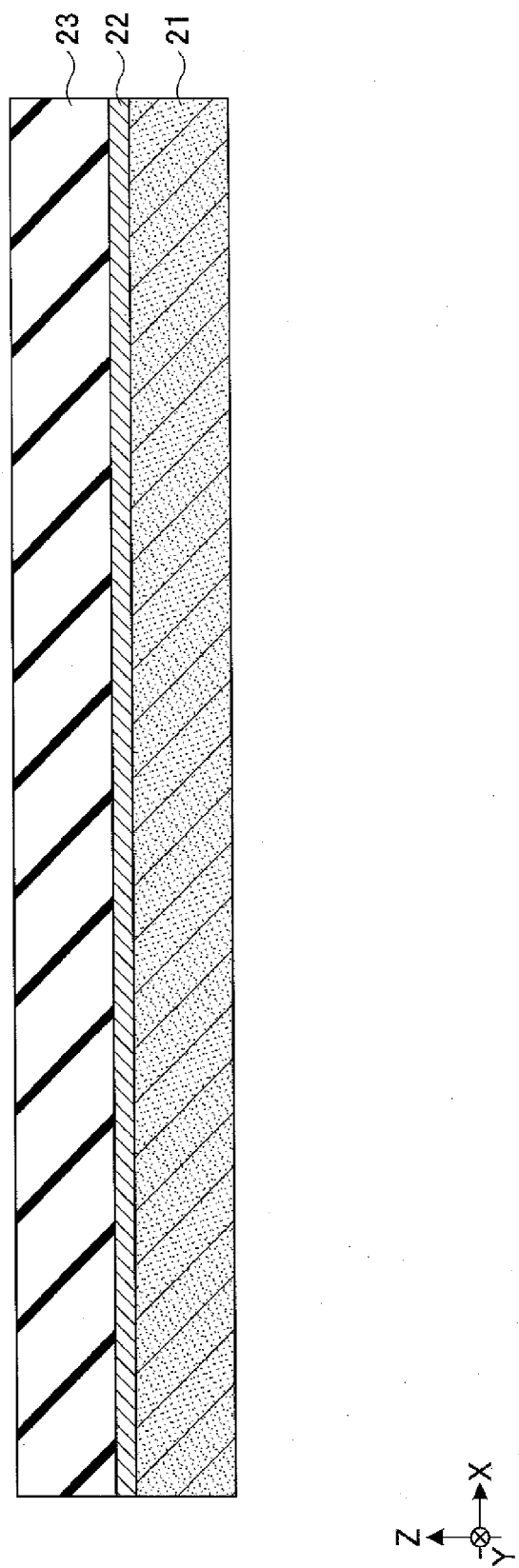

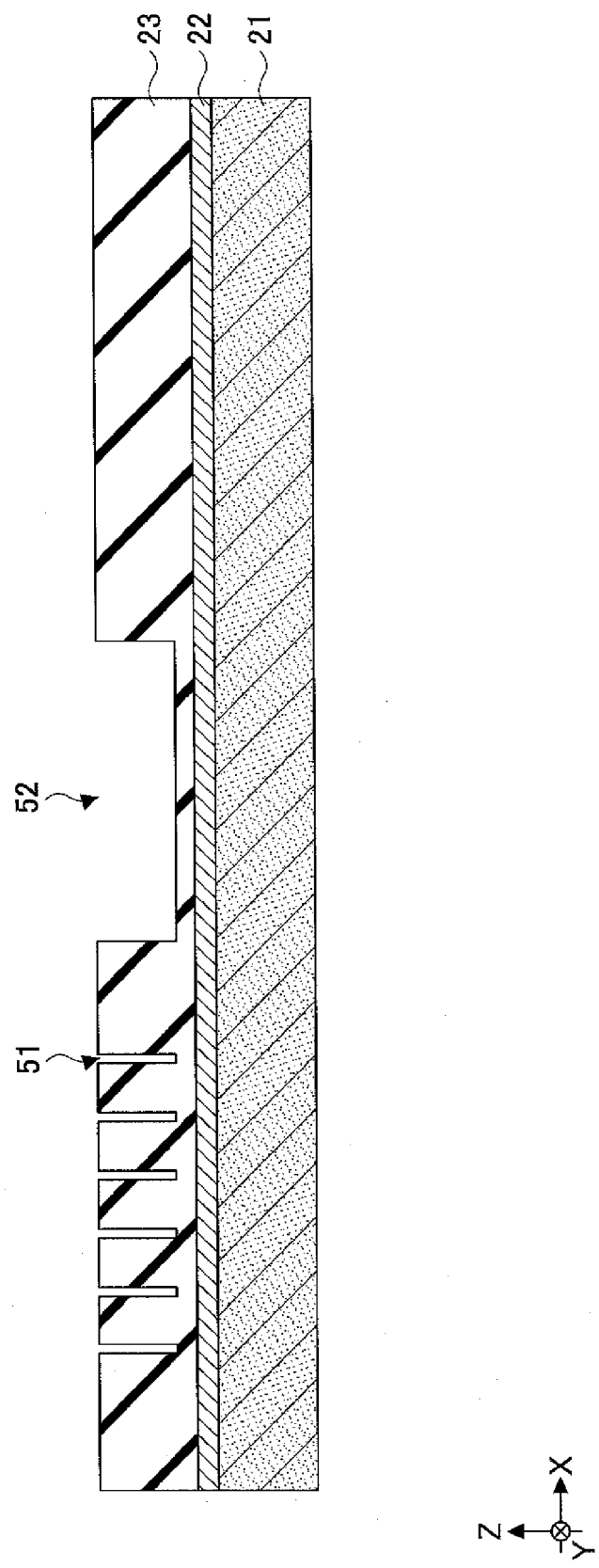

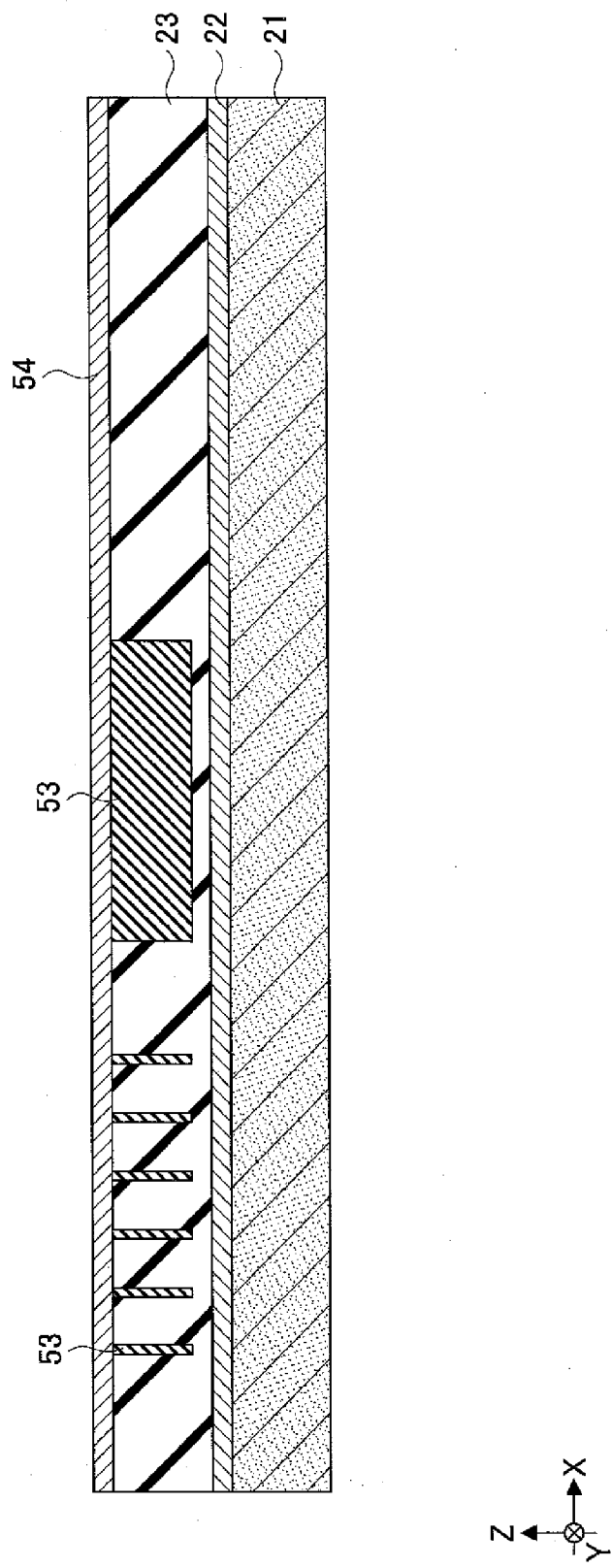

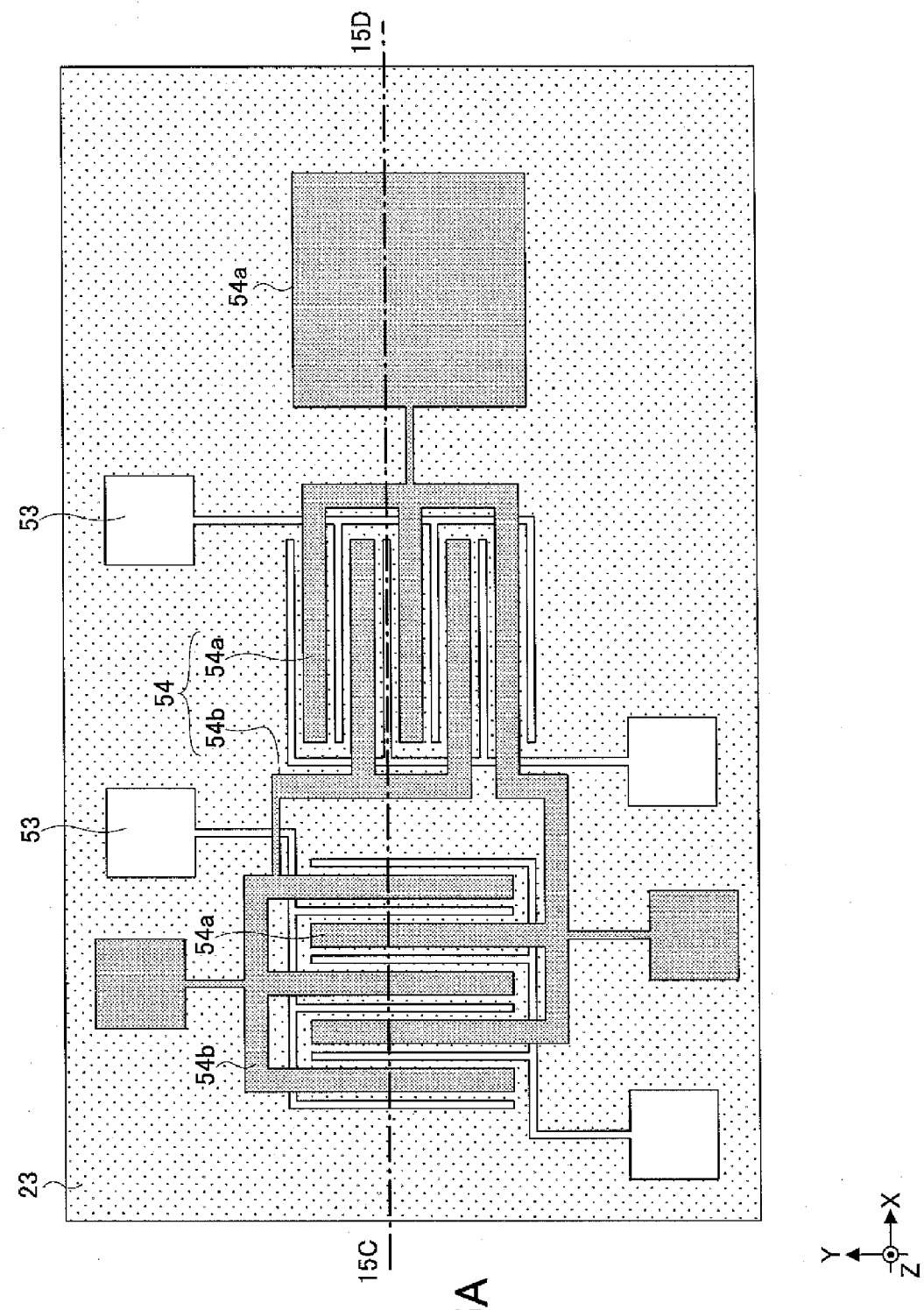

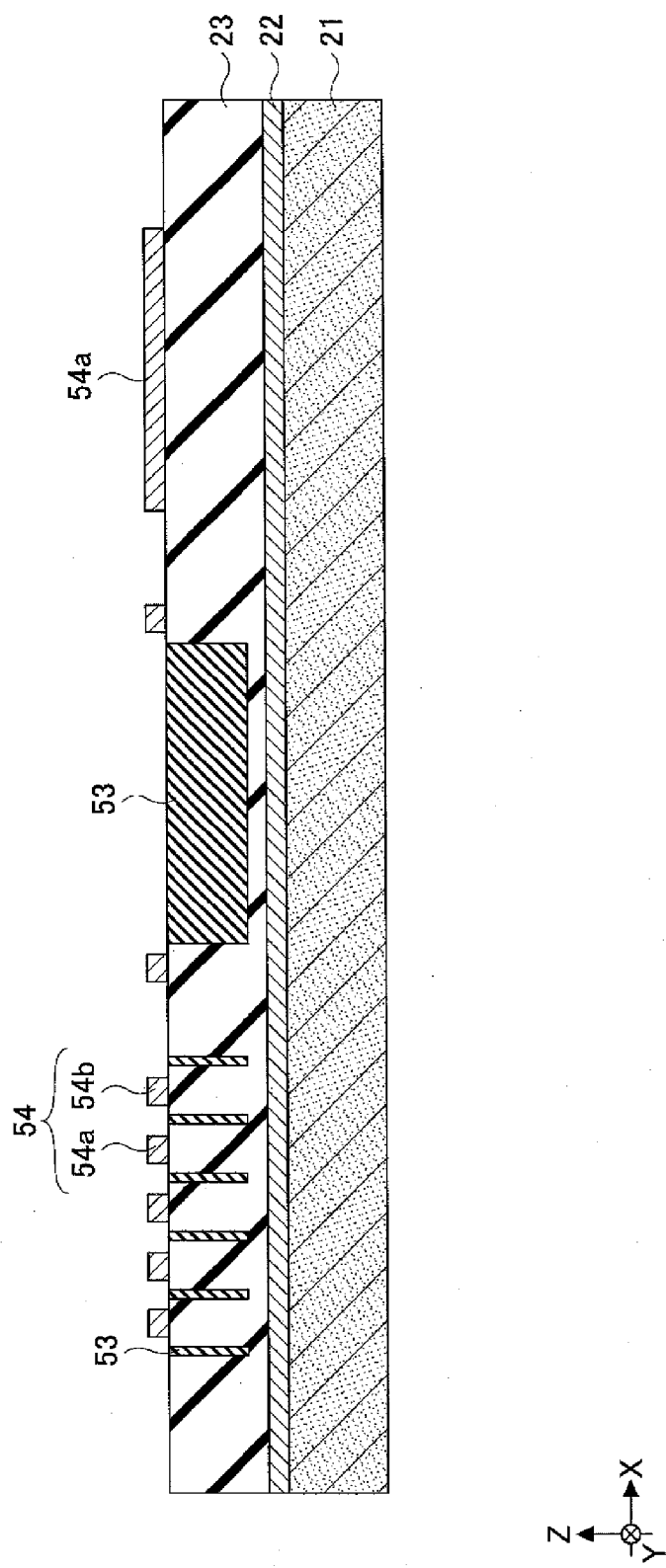

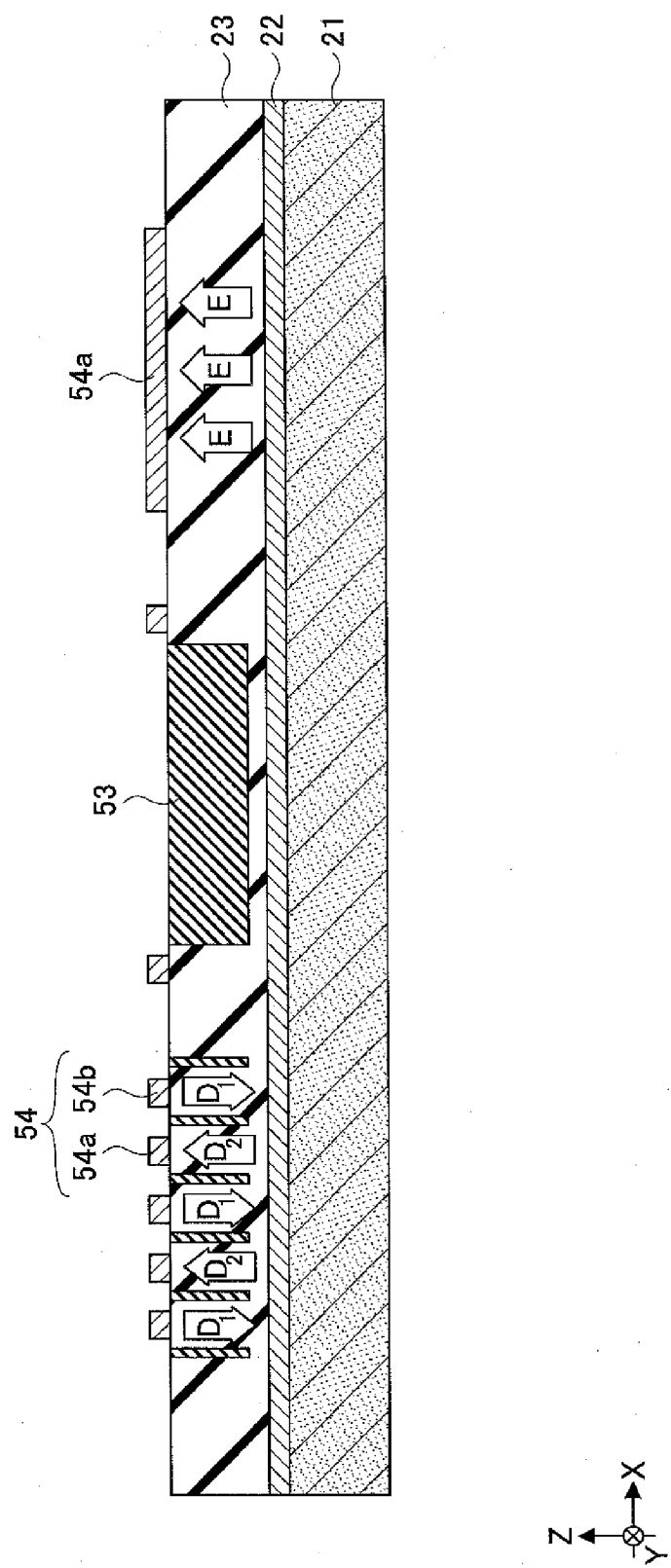

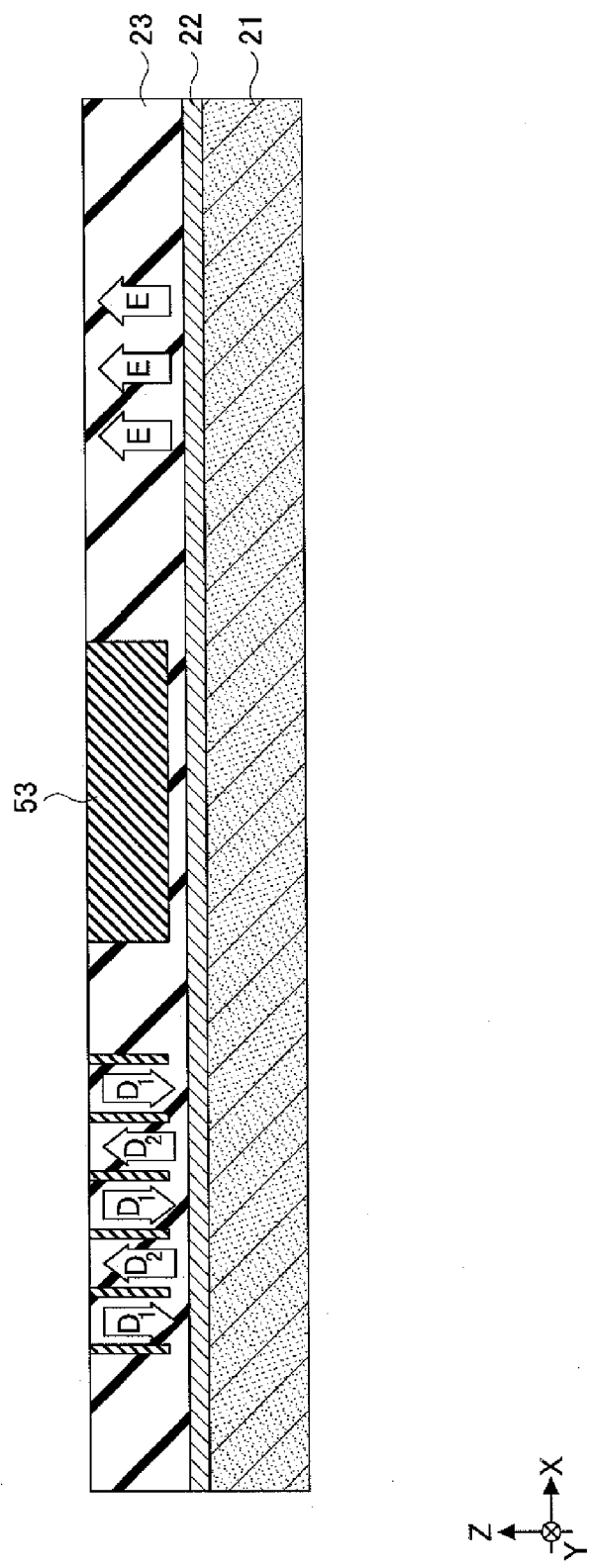

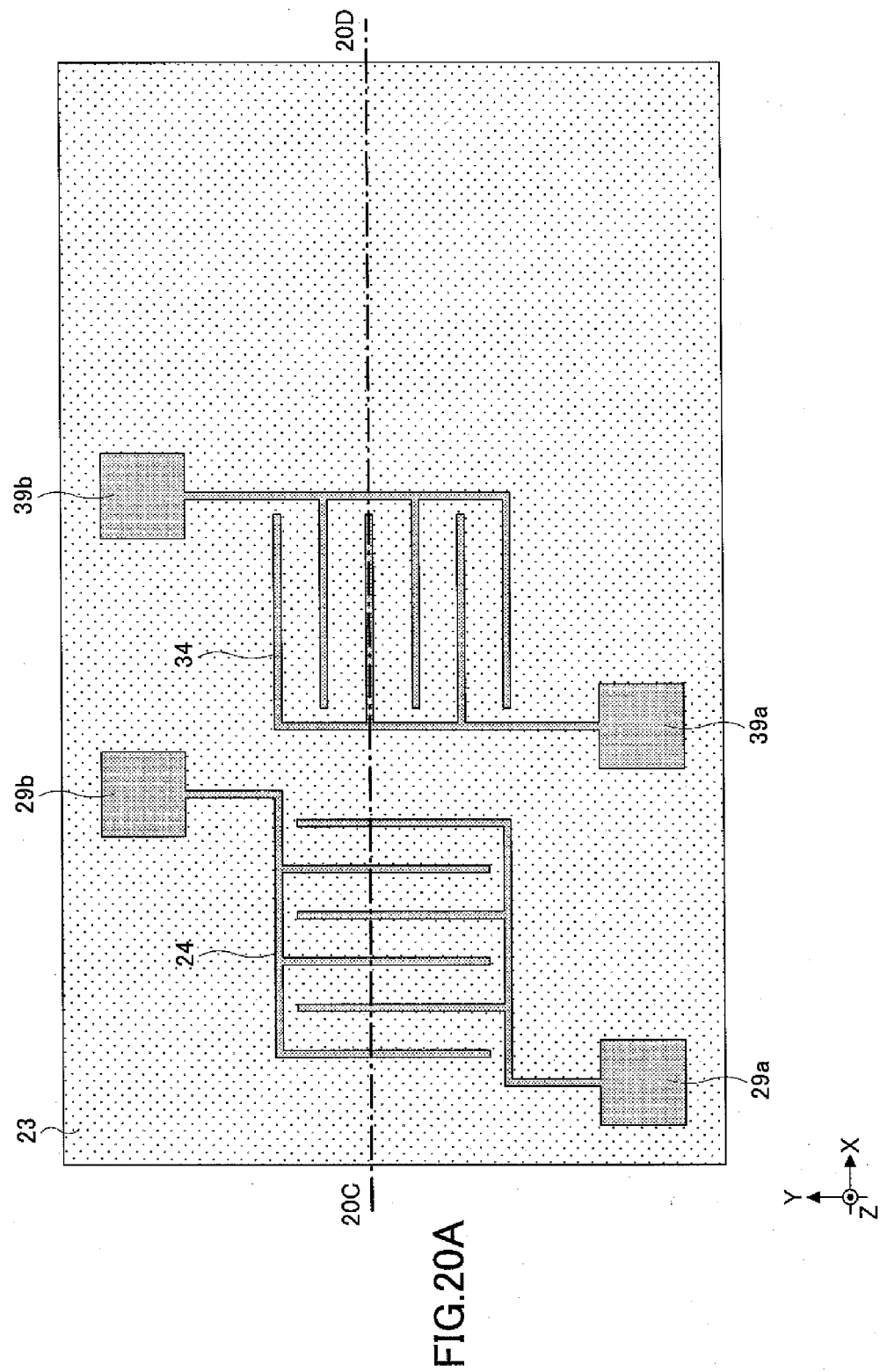

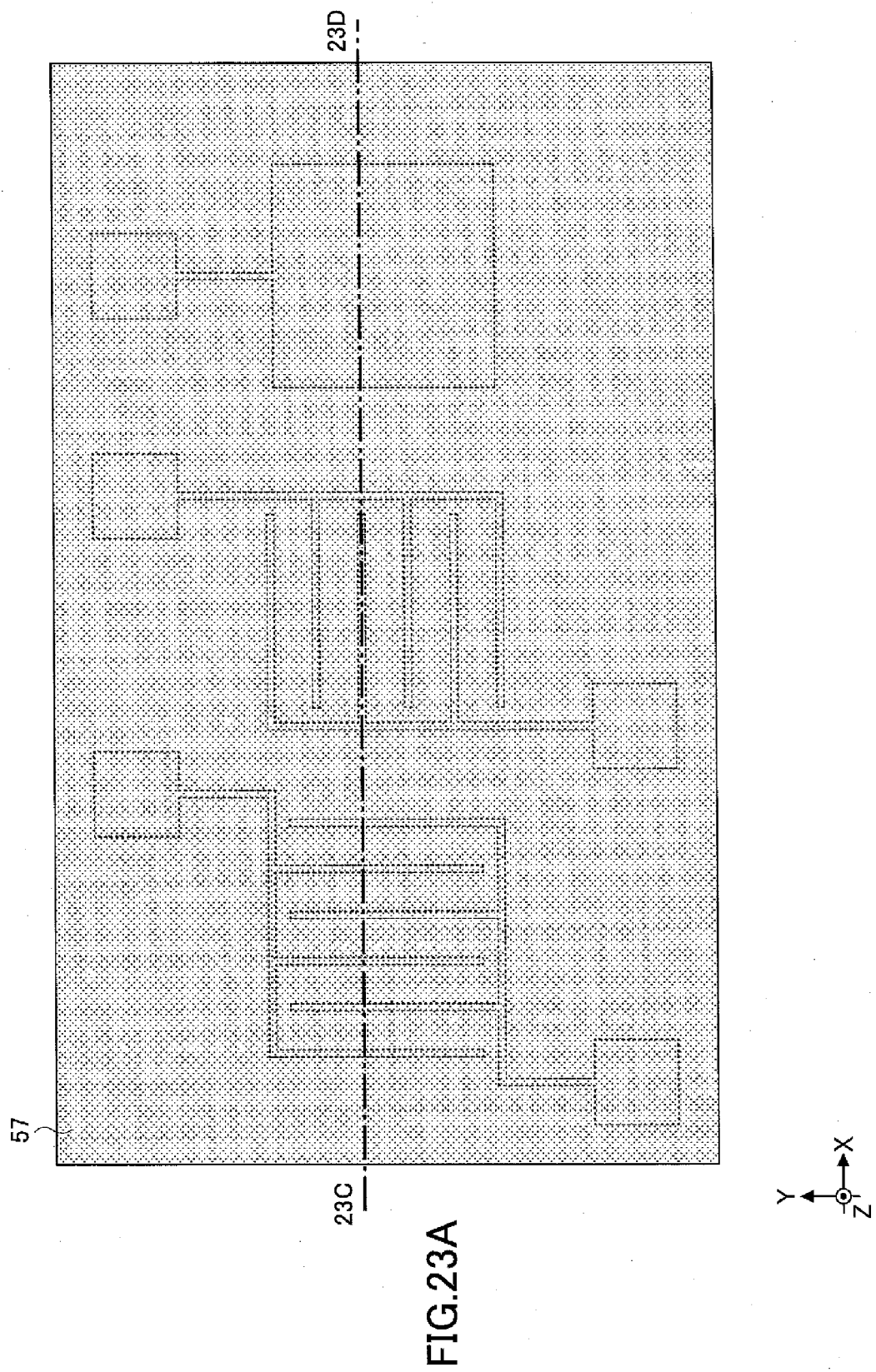

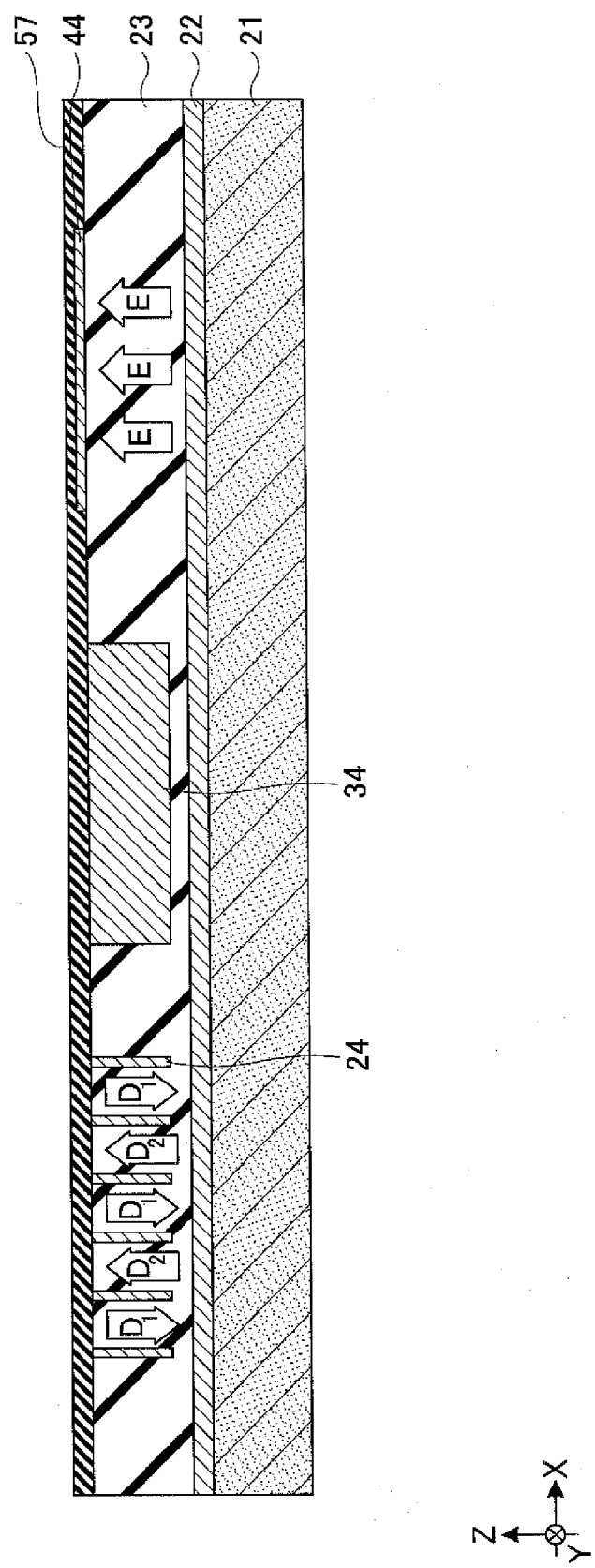

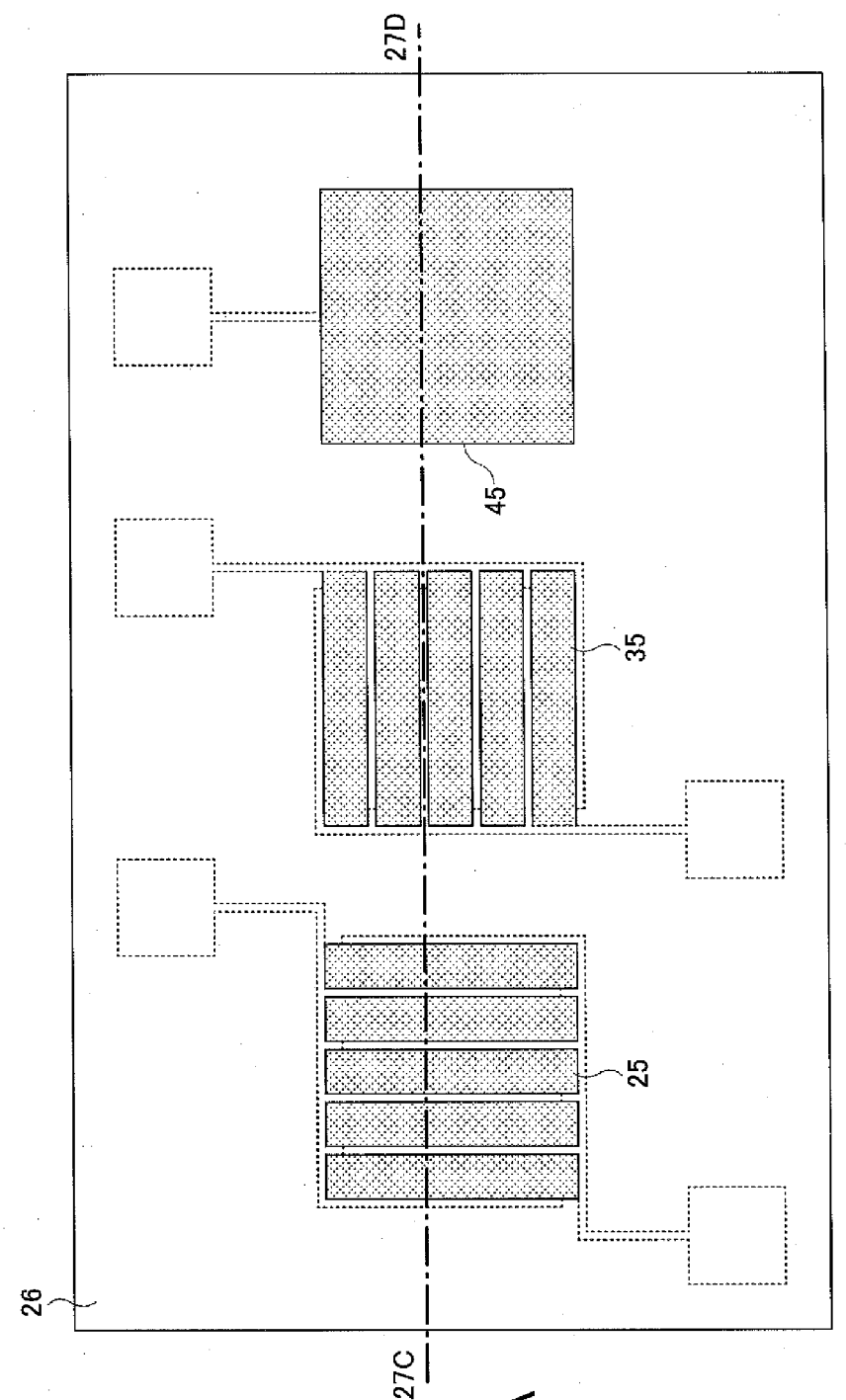

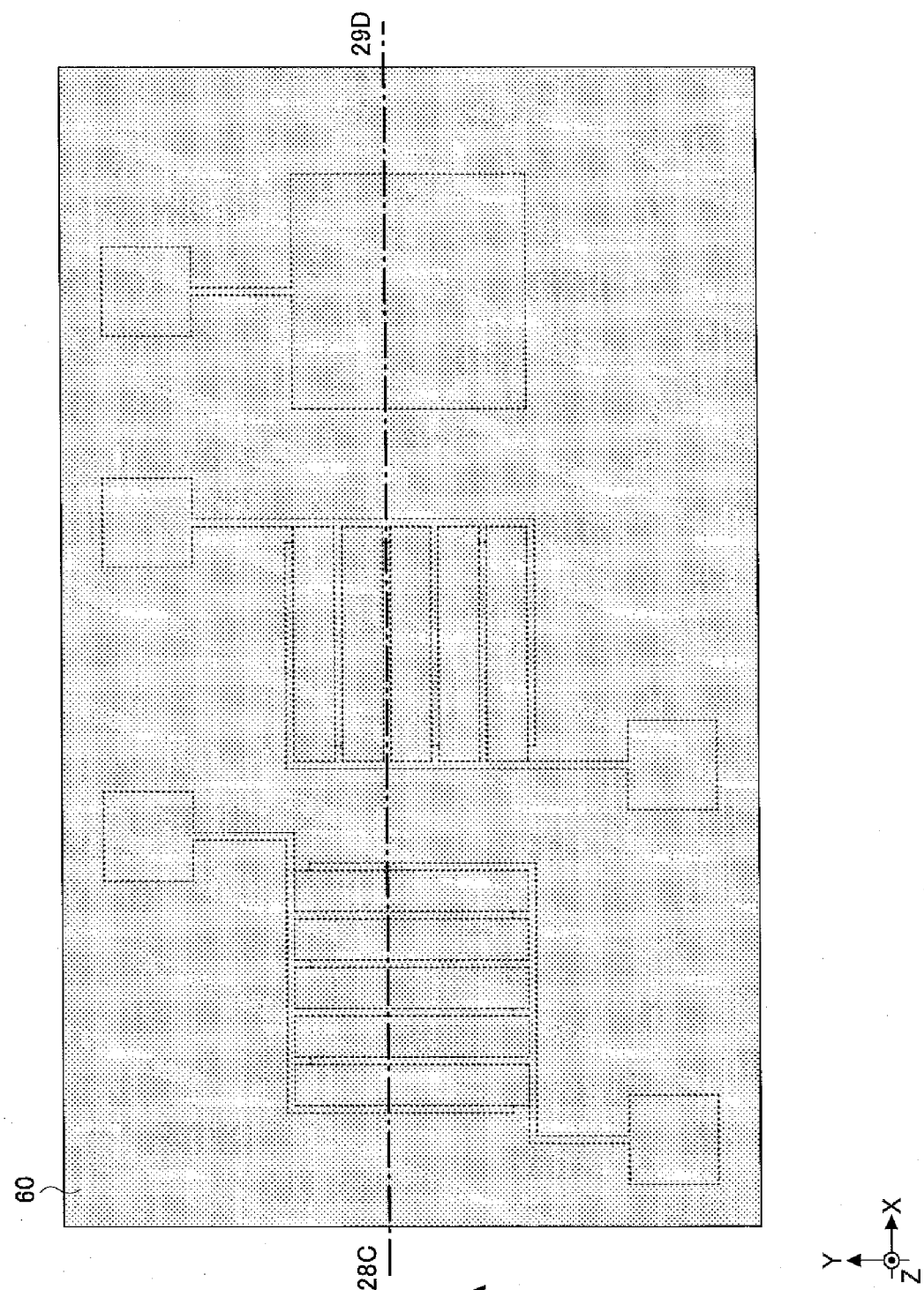

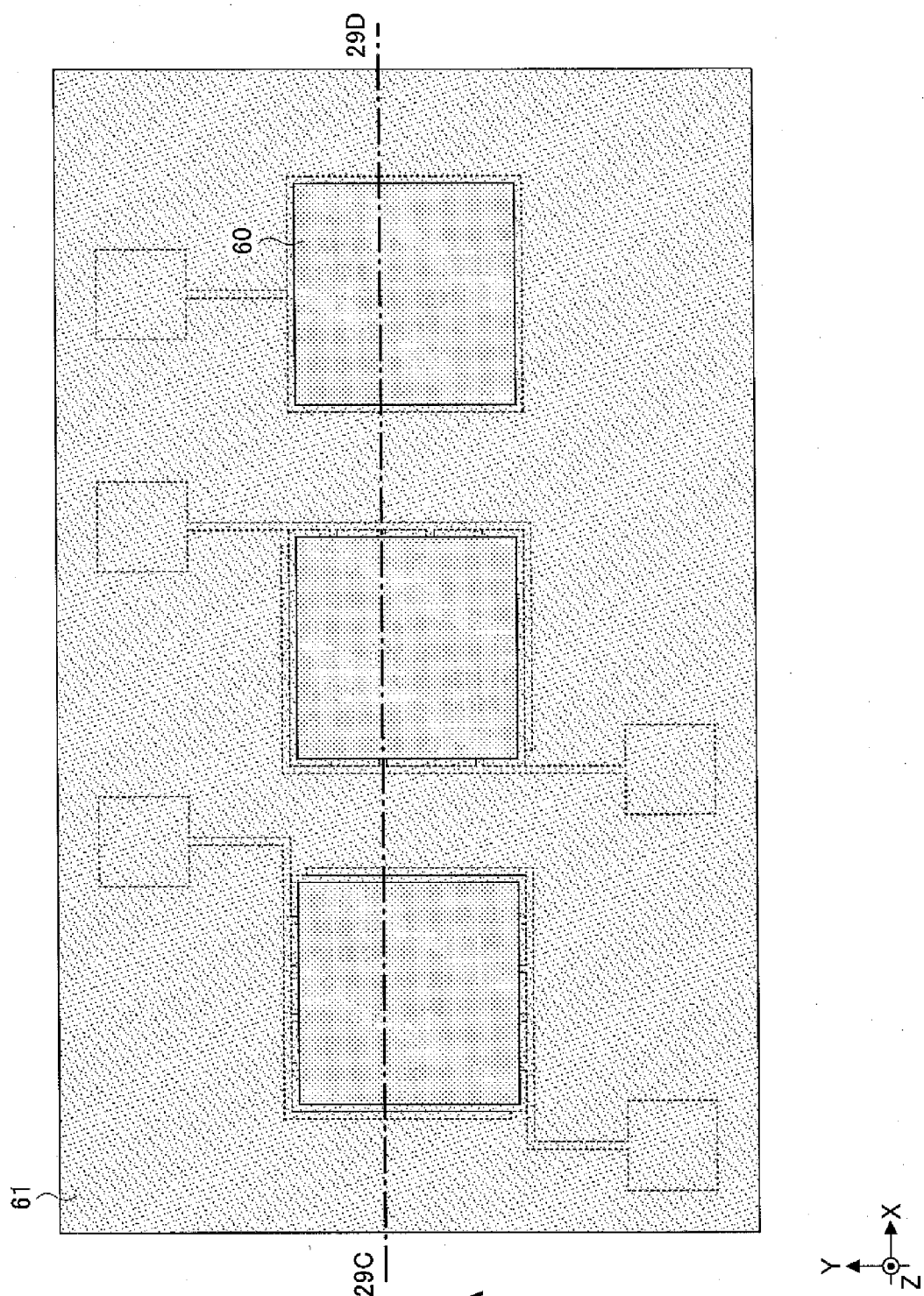

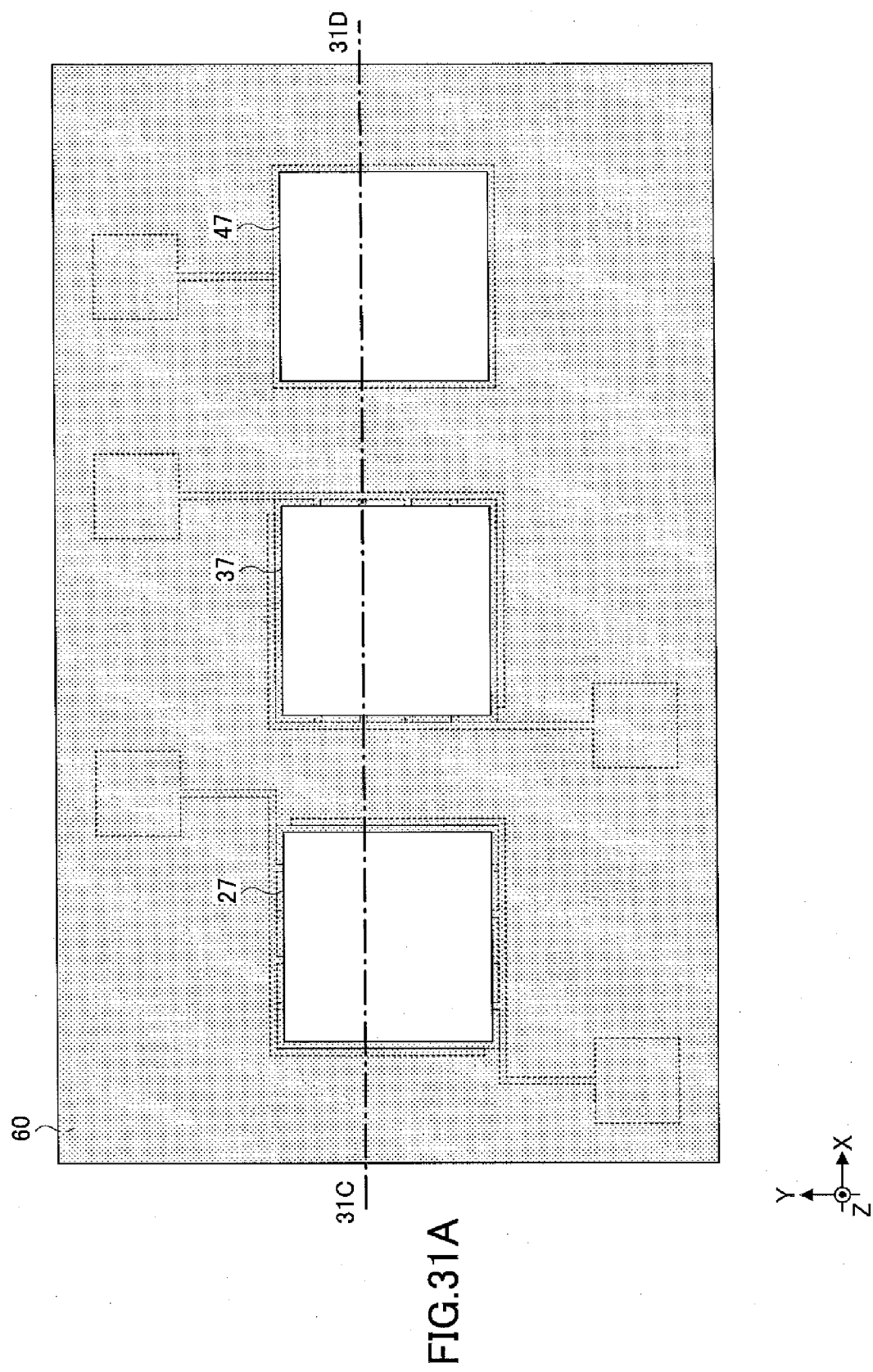

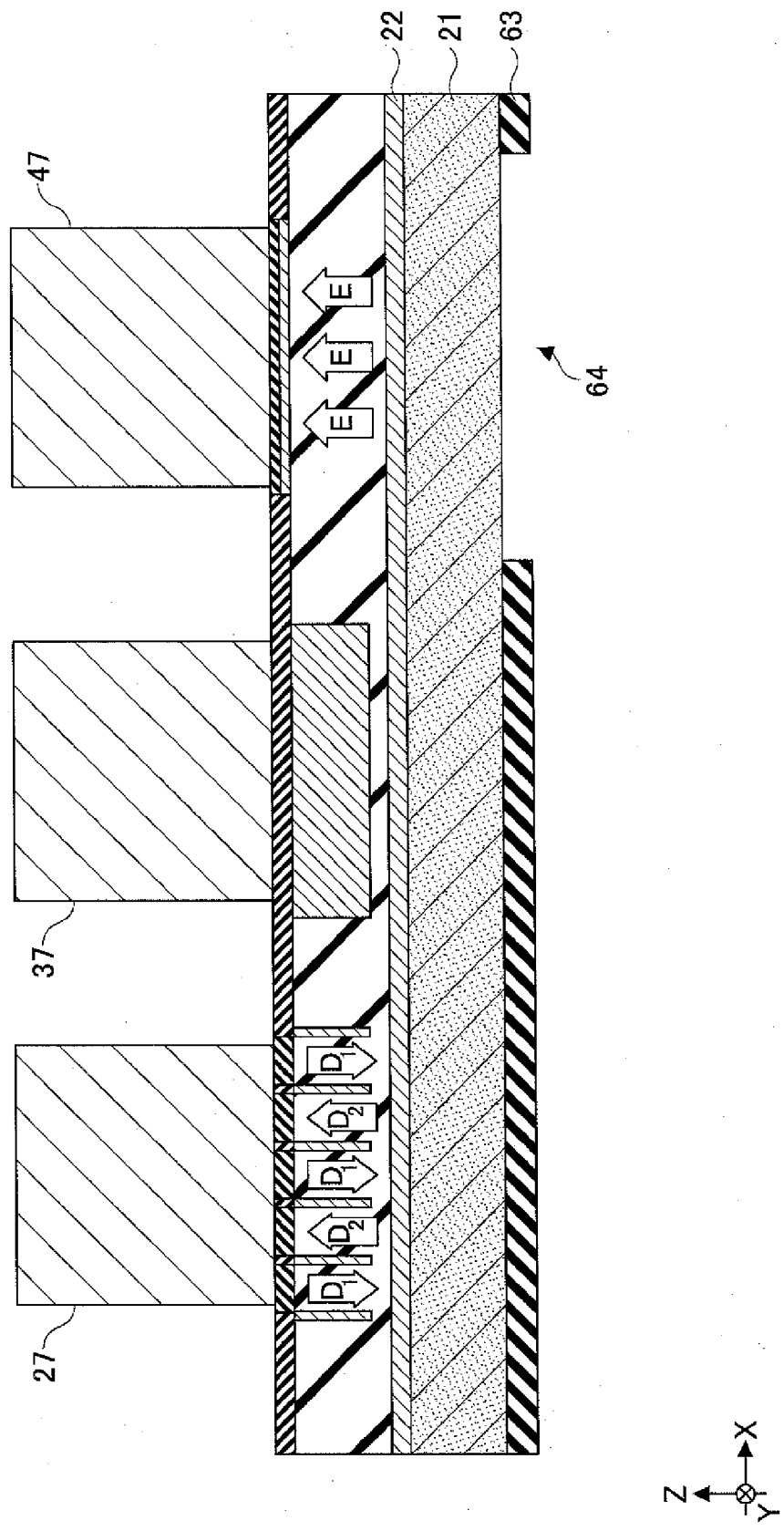

ACCELERATION SENSOR HAVING POLARIZED PIEZOELECTRIC LAYER INTERPOSED BETWEEN SENSING ELECTRODES

CROSS-REFERENCE TO RELATED APPLICATIONS

The present application is a U.S. continuation application filed under 35 USC 111(a) claiming benefit under 35 U.S.C. 120 and 365(c) of PCT International application No. PCT/JP2009/061983 filed on Jun. 30, 2009, the entire contents of which are incorporated herein by reference.

FIELD

The disclosures herein are related to an acceleration sensor, a vibration power generator device, and an acceleration sensor manufacturing method.

BACKGROUND

Electronic devices such as a hard disk drive (HDD), a notebook personal computer, and a camcorder generally include acceleration sensors for detecting acceleration of the electronic devices and shock received by the electronic devices as a result of external force applied to the electronic devices. Such acceleration sensors may be formed of a piezoelectric material (i.e., a piezoelectric acceleration sensor). In the piezoelectric acceleration sensor, the acceleration of gravity acting on the piezoelectric acceleration sensor causes stress, electromotive force or electric charges are induced by the piezoelectric effect that results from the stress, and the acceleration of the piezoelectric acceleration sensor is detected by detecting the electromotive force or electric charges.

Examples of the piezoelectric acceleration sensors are disclosed in Japanese Laid-Open Patent Application Publication No. 2005-342817 (hereinafter called "Patent Document 1"), Japanese Laid-Open Patent Application Publication No. 2009-8512 (hereinafter called "Patent Document 2"), and Japanese Laid-Open Patent Application Publication No. 2002-162408 (hereinafter called "Patent Document 3"). The piezoelectric acceleration sensors disclosed in Patent Document 1 and Patent Document 2 utilize a cantilever transverse vibration d31 mode whereas the piezoelectric acceleration sensor disclosed in Patent Document 3 utilizes a substrate shearing vibration d15 mode.

Further, the sensor elements may increasingly need to be provided in various places for establishing a sensor network (or wireless sensor network). Micro-piezoelectric power generator devices utilizing piezoelectric micro-electro mechanical systems (MEMS) have attracted much attention as a power supply for such sensor elements. The micro-piezoelectric power generator devices are extremely small devices utilized as power converters that convert natural or artificial vibrations into energy. Since the size of the sensor elements are extremely small, the vibration power generator device that is a power source for the sensor elements may need to have high sensitivity in generating power.

[Patent Document 1] Japanese Laid-open Patent Publication No. 2005-342817

[Patent Document 2] Japanese Laid-open Patent Publication No. 2009-8512

[Patent Document 3] Japanese Laid-open Patent Publication No. 2002-162408

The electronic devices such as hard disk drives, notebook PCs and camcorders may be carried outdoors. Hence, the electronic devices may frequently be hit without being damaged. Further, the sensor elements establishing the wireless sensor network may also be carried outdoors or in vehicles, and they may sometimes receive strong vibrations. Accordingly, the acceleration sensors installed in these electronic devices may be expected to have sufficient toughness so as to be durable against such strong impacts. Since the acceleration sensor utilizing the cantilever transverse vibration d31 mode includes a cantilever configuration that has a susceptibility to shock or impact, the acceleration sensor may be broken due to the impact applied to the acceleration sensor. Further, since the acceleration sensor utilizing the substrate shearing vibration d15 mode is formed of a sheet-type piezoelectric material attached to the substrate and has high toughness, the acceleration sensor may have low sensitivity.

In view of the above-described factors, an acceleration sensor having high toughness and high sensitivity and a vibration power generator device for such acceleration sensor may be increasingly desired.

SUMMARY

According to an aspect of the embodiment, there is provided an acceleration sensor that includes a piezoelectric layer formed on a substrate, and sensing electrodes formed in the piezoelectric layer. In the acceleration sensor, the piezoelectric layer interposing between the sensing electrodes is polarized in a film thickness direction of the piezoelectric layer.

The object and advantages of the invention may be realized and attained by means of the elements and combinations particularly pointed out in the appended claims. It is to be understood that both the foregoing general description and the following detailed description are exemplary and explanatory and are not restrictive of the invention as claimed.

BRIEF DESCRIPTION OF THE DRAWINGS

FIG. 8A is a top view illustrating the acceleration sensor according to the first embodiment in a manufacturing process;

FIG. 8B is a cross-sectional view illustrating the acceleration sensor according to the first embodiment in the manufacturing process;

FIG. 10A is a top view illustrating the acceleration sensor according to the first embodiment in the manufacturing process;

FIG. 10B is a cross-sectional view illustrating the acceleration sensor according to the first embodiment in the manufacturing process;

FIG. 11B is a cross-sectional view illustrating the acceleration sensor according to the first embodiment in the manufacturing process;

FIG. 14B is a cross-sectional view illustrating the acceleration sensor according to the first embodiment in the manufacturing process;

FIG. 15A is a top view illustrating the acceleration sensor according to the first embodiment in the manufacturing process;

FIG. 15B is a cross-sectional view illustrating the acceleration sensor according to the first embodiment in the manufacturing process;

FIG. 16B is a cross-sectional view illustrating the acceleration sensor according to the first embodiment in the manufacturing process;

FIG. 17B is a cross-sectional view illustrating the acceleration sensor according to the first embodiment in the manufacturing process;

FIG. 20A is a top view illustrating the acceleration sensor according to the first embodiment in the manufacturing process;

FIG. 23A is a top view illustrating the acceleration sensor according to the first embodiment in the manufacturing process;

FIG. 23B is a cross-sectional view illustrating the acceleration sensor according to the first embodiment in the manufacturing process;

FIG. 27A is a top view illustrating the acceleration sensor according to the first embodiment in the manufacturing process;

FIG. 28A is a top view illustrating the acceleration sensor according to the first embodiment in the manufacturing process;

FIG. 29A is a top view illustrating the acceleration sensor according to the first embodiment in the manufacturing process;

FIG. 31A is a top view illustrating the acceleration sensor according to the first embodiment in the manufacturing process;

FIG. 35B is a cross-sectional view illustrating the acceleration sensor according to the first embodiment in the manufacturing process;

DESCRIPTION OF EMBODIMENTS

In the following, preferred embodiments are described with reference to the accompanying drawings.

[First Embodiment]

First, an acceleration sensor according to the first embodiment and a method for manufacturing the acceleration sensor according to the first embodiment are described.

(Acceleration Sensor)

Figure 1:
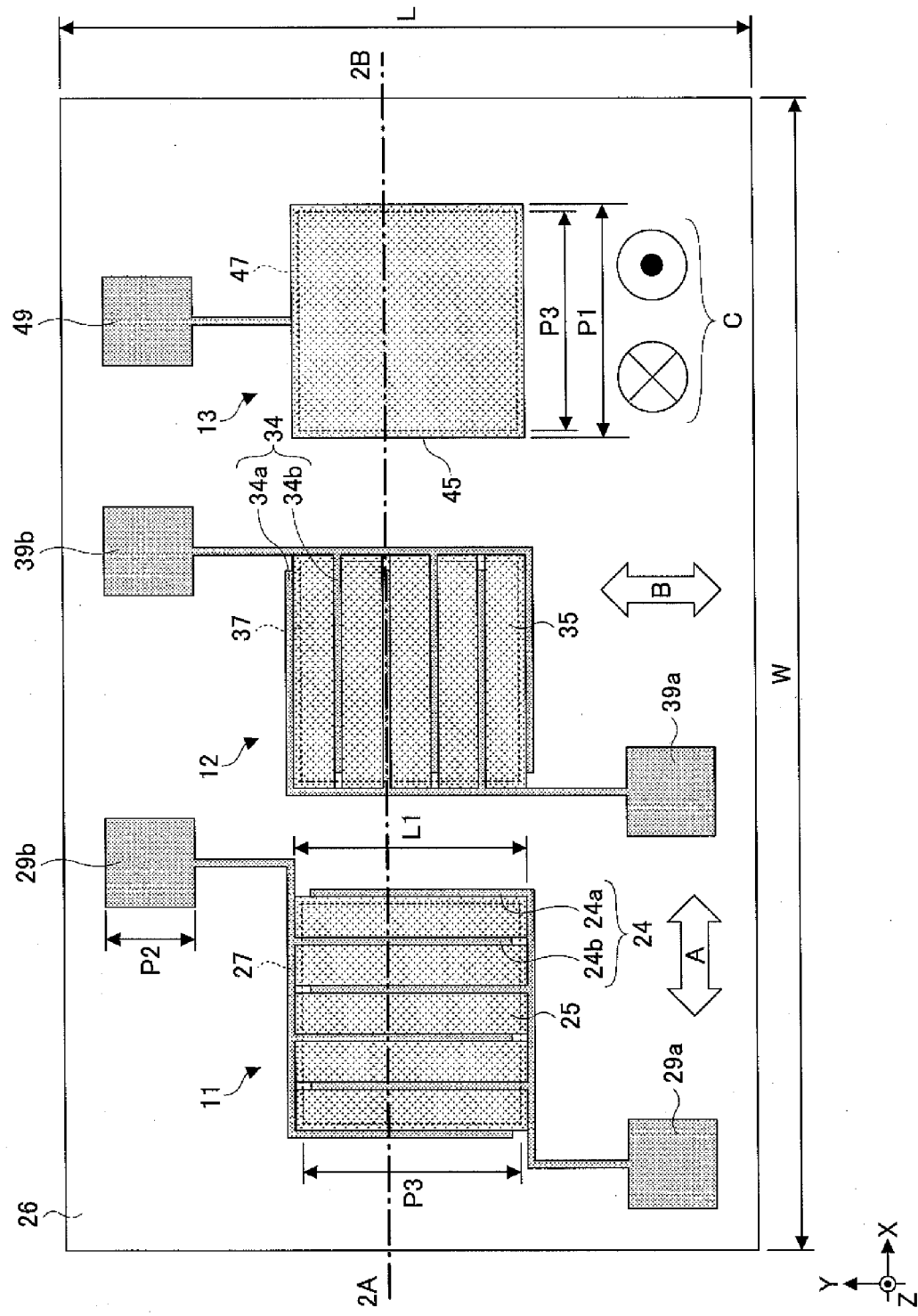
FIG. 1 is a transparent top view illustrating an acceleration sensor according to a first embodiment.
Figure 2:
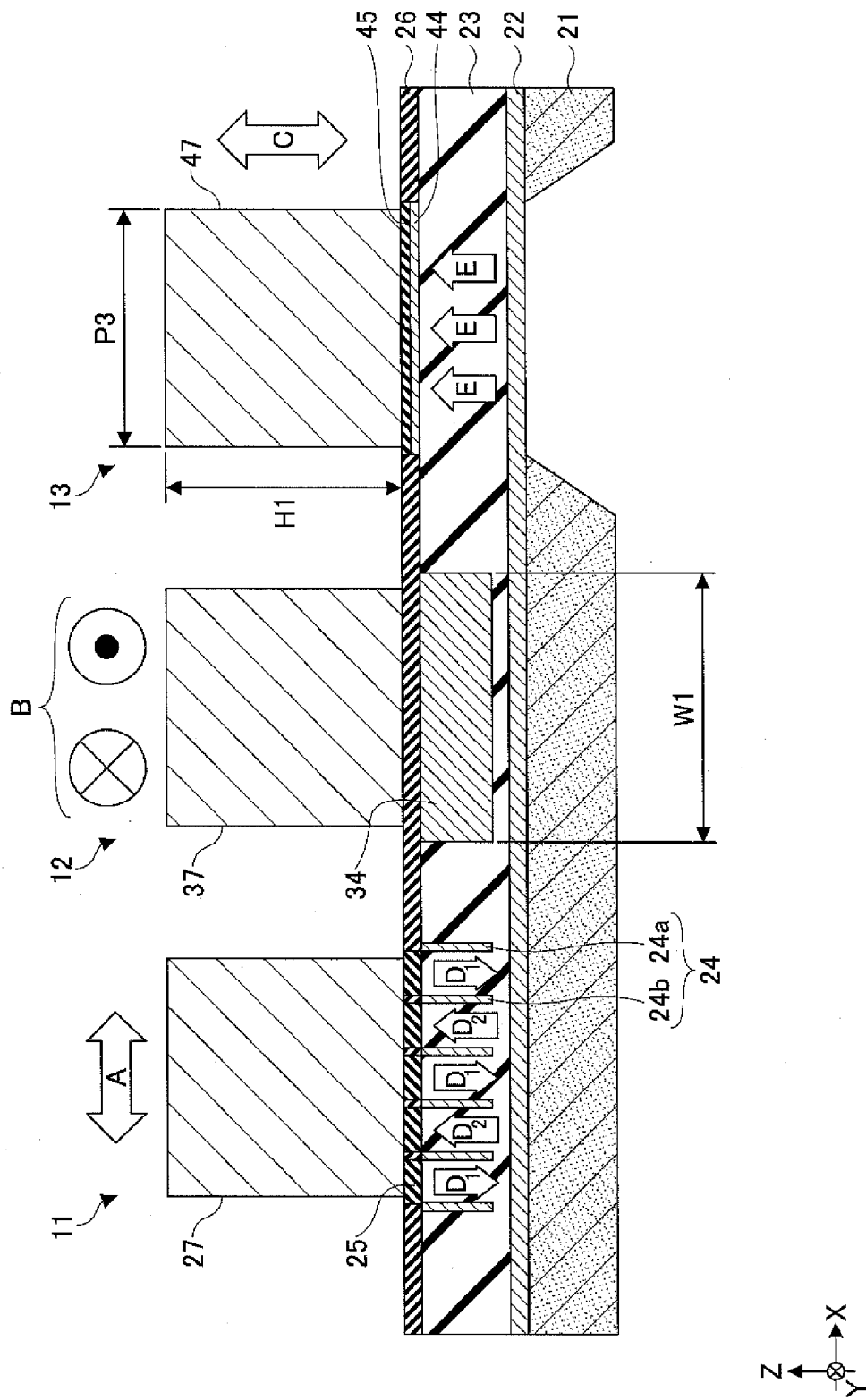
FIG. 2 is a cross-sectional view illustrating the acceleration sensor according to the first embodiment.

The acceleration sensor according to the first embodiment is described with reference to FIGS. 1 and 2. FIG. 2 is a cross-sectional view taken along a dash-dot line 2A-2B in FIG. 1.

The acceleration sensor according to the first embodiment includes an X-axis direction acceleration sensor 11, a Y-axis direction acceleration sensor 12, and a Z-axis direction acceleration sensor 13. The X-axis direction acceleration sensor 11 is configured to detect acceleration in an X-axis direction indicated by a left-right double arrow A (see FIG. 1), the Y-axis direction acceleration sensor 12 is configured to detect acceleration in a Y-axis direction indicated by a top-down double arrow B (see FIG. 1), and the Z-axis direction acceleration sensor 13 is configured to detect acceleration in a Z-axis direction (perpendicular to the surface of substrate) indicated by symbols C. The acceleration sensor according to the first embodiment having the above configuration is capable of detecting the acceleration in three-dimensional directions.

The X-axis direction acceleration sensor 11 and the Y-axis direction acceleration sensor 12 of the acceleration sensor according to the first embodiment are formed on a silicon substrate 21 having a thickness of approximately 100 μm. Each of the X-axis direction acceleration sensor 11 and the Y-axis direction acceleration sensor 12 includes a lower electrode 22 having a thickness of approximately 0.2 μm and a ferroelectric layer 23 serving as a piezoelectric layer and having a thickness of approximately 5 μm, and sensing electrodes 24 and 34 formed in grooves inside the ferroelectric layer 23. Note that the lower electrode 22 further includes a function of polarizing a later-described predetermined area of the ferroelectric layer 23.

The sensing electrodes 24 are formed in an area in which the X-axis direction acceleration sensor 11 is formed. The sensing electrode 24 is formed of two comb-shaped electrodes 24a and 24b. Teeth-shaped electrodes (hereinafter simply called "teeth") of the comb-shaped electrode 24a and teeth-shaped electrodes (hereinafter simply called "teeth") of the comb-shaped electrode 24b are alternately arranged such that the teeth of the comb-shaped electrode 24a interpose between the corresponding adjacent teeth of the comb-shaped electrode 24b. The comb-shaped electrodes 24a and 24b forming the sensing electrode 24 are connected to respective electrode terminals 29a and 29b. More specifically, the comb-shaped electrodes 24a are connected to the electrode terminal 29a via an extracting electrode and the comb-shaped electrodes 24b are connected to the electrode terminal 29b via an extracting electrode. Likewise, the sensing electrodes 34 are formed in an area in which the Y-axis direction acceleration sensor 12 is formed. The sensing electrode 34 is formed of two comb-shaped electrodes 34a and 34b. Teeth of the comb-shaped electrode 34a and teeth of the comb-shaped electrode 34b are alternately arranged such that the teeth of the comb-shaped electrode 34a interpose between the corresponding adjacent teeth of the comb-shaped electrode 34b. The comb-shaped electrodes 34a and 34b forming the sensing electrodes 34 are connected to respective electrode terminals 39a and 39b. More specifically, the comb-shaped electrodes 34a are connected to the electrode terminal 39a via an extracting electrode and the comb-shaped electrodes 34b are connected to the electrode terminal 39b via an extracting electrode.

The comb-shaped electrodes 24a and 24b are formed such that the teeth of the comb-shaped electrodes 24a and 24b extend in the Y-axis direction, which is perpendicular to the X-axis direction. Further, the comb-shaped electrodes 34a and 34b are formed such that the teeth of the comb-shaped electrodes 34a and 34b extend in the X-axis direction that is perpendicular to the Y-axis direction. Thus, the direction in which the teeth of the comb-shaped electrodes 24a and 24b formed in the X-axis direction acceleration sensor 11 extend and the direction in which the teeth of the comb-shaped electrodes 34a and 34b formed in the Y-axis direction acceleration sensor 12 extend may differ from each other by approximately 90 degrees.

Further, the ferroelectric layer 23 interposing between the comb-shaped electrodes 24a and 24b formed in the X-axis direction acceleration sensor 11 is polarized such that electric polarization of the ferroelectric layer 23 in adjacent areas between the comb-shaped electrodes 24a and 24b are mutually reversed from each other as indicated by thick arrows D1 and thick arrows D2 (see FIG. 2). Note that although a detailed configuration of the Y-axis direction acceleration sensor 12 is not illustrated in FIG. 2, the Y-axis direction acceleration sensor 12 has the configuration similar to the above-described configuration of the X-axis direction acceleration sensor 11.

Further, an insulator layer 25 is formed on the ferroelectric layer 23 interposing between the comb-shaped electrodes 24a and 24b in the X-axis direction acceleration sensor 11, and a weight part 27 is formed on the insulator layer 25 on the ferroelectric layer 23. Similarly, an insulator layer 35 is formed on the ferroelectric layer 23 interposing between the comb-shaped electrodes 34a and 34b in the Y-axis direction acceleration sensor 12, and a weight part 37 is formed on the insulator layer 35. Note that a resin material layer 26 is formed on the sensing electrodes 24 and 34, and also in areas of the ferroelectric layer 23 where the insulator layers 25 and 35 are not formed. Note also that the insulator layers 25 and 35 and the resin material layer 26 have a thickness of approximately 0.5 μm.

Meanwhile, the Z-axis direction acceleration sensor 13 in the first embodiment includes the lower electrode 22, the ferroelectric layer 23, a sensing electrode 44 and an insulator layer 45 that are formed on the silicon substrate 21, and a weight part 47 is further formed on the insulator layer 45. The ferroelectric layer 23 formed in an area of the Z-axis direction acceleration sensor 13 is polarized in one direction as indicated by thick arrows E (see FIG. 2). Further, the silicon substrate 21 formed in the area of the Z-axis direction acceleration sensor 13 is removed by etching. The sensing electrode 44 is connected to the electrode terminal 49 via an extracting electrode. Note that the sensing electrode 44 has a thickness of approximately 0.2 μm and the insulator layer 45 has a thickness of approximately 0.3 μm. The insulator layer 45 has an approximately square shape having one side of the length P1 of approximately 500 μm.

The acceleration sensor according to the first embodiment includes an overall size of the length L of approximately 1.5 mm and the width W of approximately 2.0 mm. Note also that the comb-shaped electrodes 24a, 24b, 34a and 34b have a width W1 of approximately 500 μm, and the electrode terminals 29a, 29b, 39a, and 39b have an approximately square shape having one side of the length P2 of approximately 500 μm. Further, the weight parts 27, 37 and 47 have an approximately square shape having one side of the length P3 of approximately 450 μm with the height H1 of approximately 500 μm.

Figure 3:
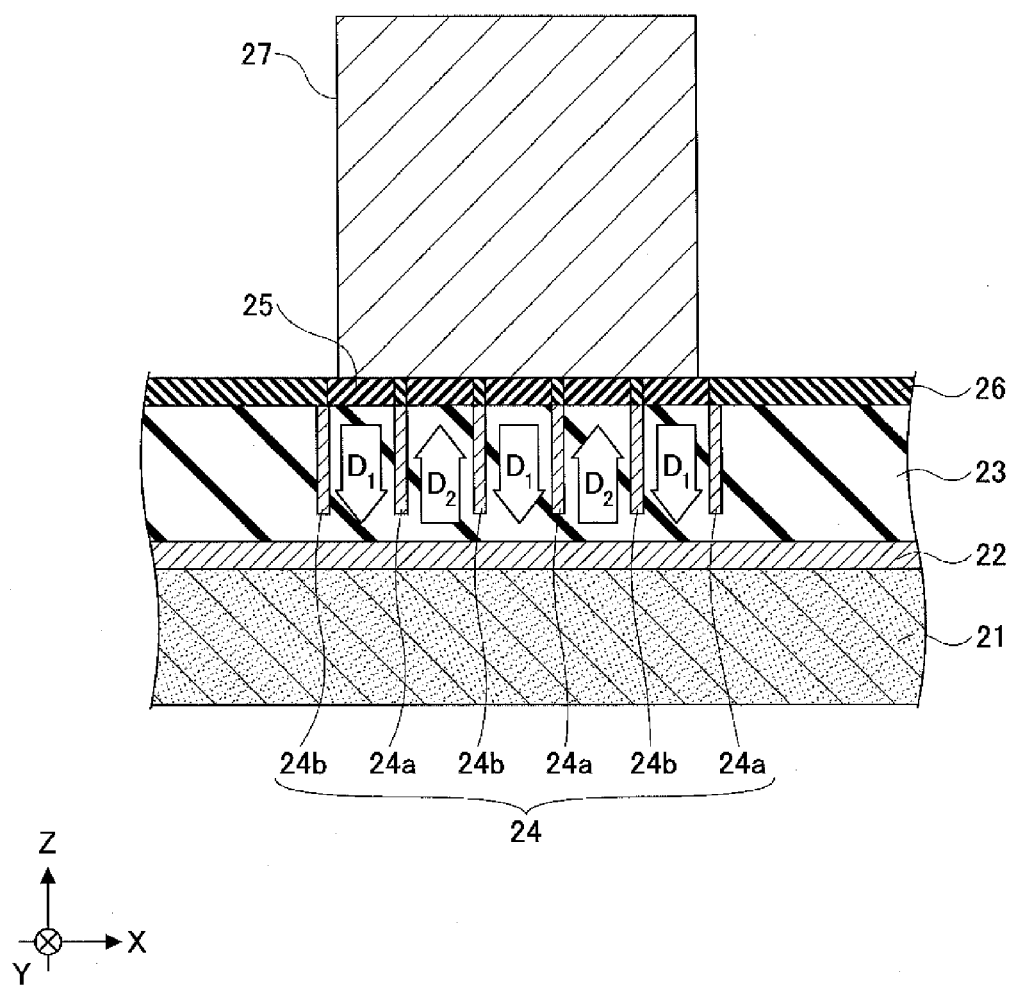
FIG. 3 is an explanatory view illustrating the acceleration sensor according to the first embodiment.
Figure 4:
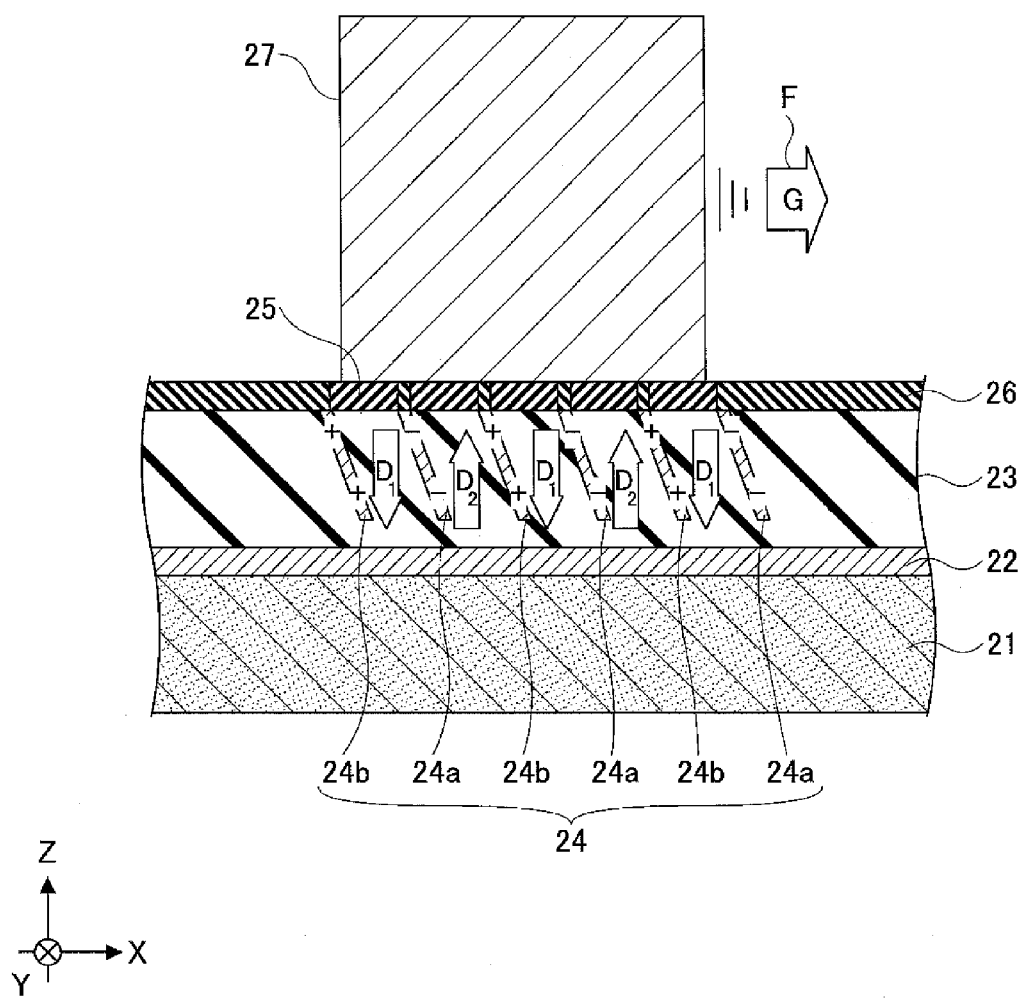
FIG. 4 is an explanatory view illustrating the acceleration sensor according to the first embodiment.

Next, a method for detecting acceleration by the acceleration sensor according to the first embodiment is described with reference to FIGS. 3 and 4. FIG. 3 is a cross-sectional view illustrating the X-axis direction acceleration sensor 11 of the acceleration sensor according to the first embodiment when the acceleration is not applied to the X-axis direction acceleration sensor 11. FIG. 4 is a cross-sectional view illustrating the X-axis direction acceleration sensor 11 of the acceleration sensor according to the first embodiment when the acceleration is applied to the X-axis direction acceleration sensor 11 in the X-axis direction indicated by a thick arrow F. As illustrated in FIG. 4, when the acceleration in the X-axis direction is applied to the X-axis direction acceleration sensor 11, the silicon substrate 21 is moved in a direction in which the acceleration is applied while the weight part 27 remains still, which causes inertial force. The inertial force applies the stress to the ferroelectric layer 23 to induce electromotive force. Since the X-axis direction acceleration sensor 11 of the acceleration sensor according to the first embodiment includes the sensing electrode 24 formed of the comb-shaped electrodes 24a and 24b having the teeth (i.e., extended teeth-shaped electrodes), the sensing electrode 24 acquires a wider area for detecting the electromotive force, which may improve the sensitivity in detecting the acceleration. Further, the ferroelectric layer 23 interposing between the comb-shaped electrodes 24a and 24b formed in the X-axis direction acceleration sensor 11 is polarized such that the adjacent areas of the ferroelectric layer formed via the comb-shaped electrodes 24a and 24b 23 include mutually reversed polarization as indicated by thick arrows D1 and D2 (see FIG. 4). With this configuration, negative electric charges are accumulated in the comb-shaped electrodes 24a and positive electric charges are accumulated in the comb-shaped electrodes 24b due to the electromotive force generated by the acceleration applied to the X-axis direction acceleration sensor 11. As a result, potential differences occur between the teeth of the comb-shaped electrode 24a and the teeth of the comb-shaped electrode 24b. The acceleration is detected by detecting such potential differences between the teeth of the comb-shaped electrode 24a and the teeth of the comb-shaped electrode 24b via the electrode terminal 29a and the electrode terminal 29b. The signals of the detected potential differences that carry information on the detected acceleration are amplified by a not-illustrated charge-sensitive amplifier and booster circuit, and the amplified signals are then transmitted to the electronic device incorporating the acceleration sensor according to the first embodiment, thereby transmitting the information on the detected acceleration to the electronic device.

In the acceleration sensor according to the first embodiment, the X-axis direction acceleration sensor 11 and the Y-axis direction acceleration sensor 12 may be capable of generating the electromotive force approximately 1.5 to 6 times higher than that of the related art acceleration sensor configuration when the acceleration in the X-axis direction and the acceleration in the Y-axis direction are respectively applied to the X-axis direction acceleration sensor 11 and the Y-axis direction acceleration sensor 12. Accordingly, the acceleration sensor according to the first embodiment may exhibit improved sensitivity in detecting the acceleration.

Figure 5:
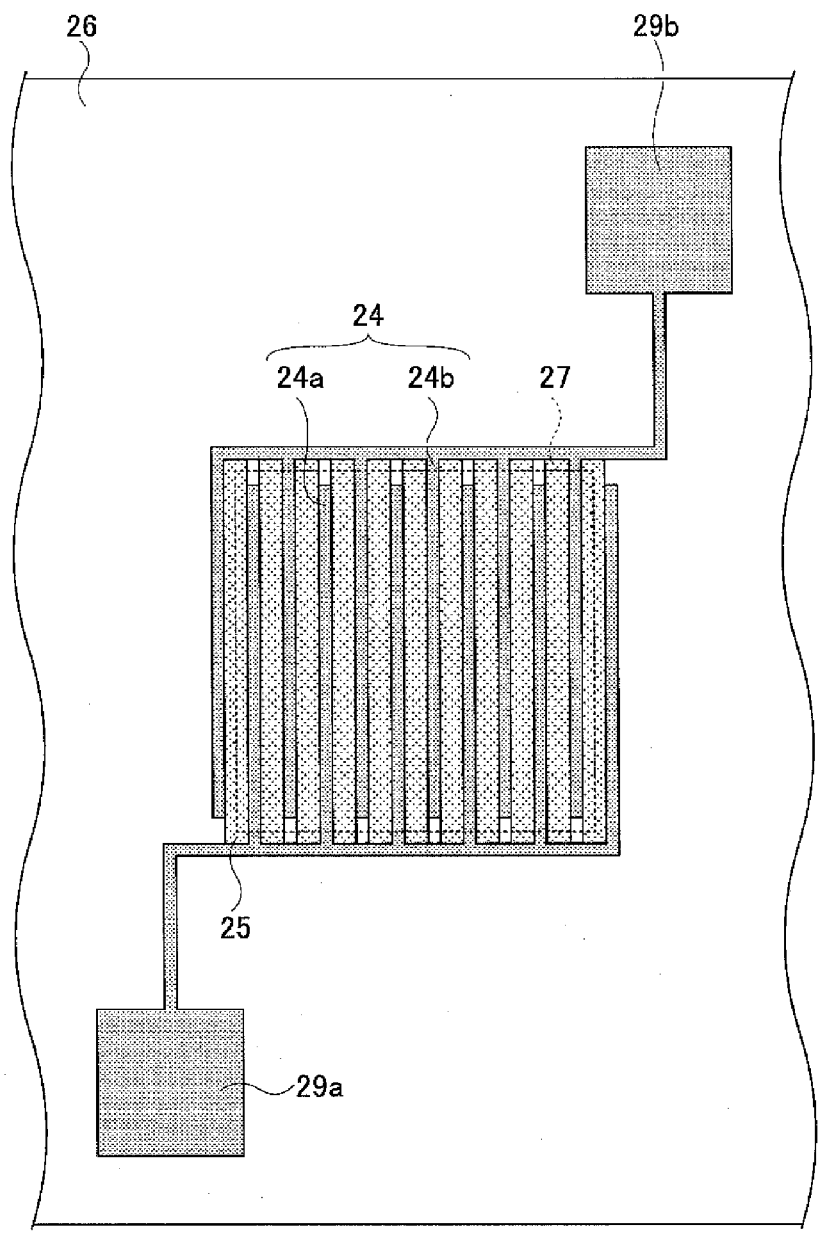
FIG. 5 is a transparent top view illustrating another acceleration sensor according to the first embodiment.
Figure 6:
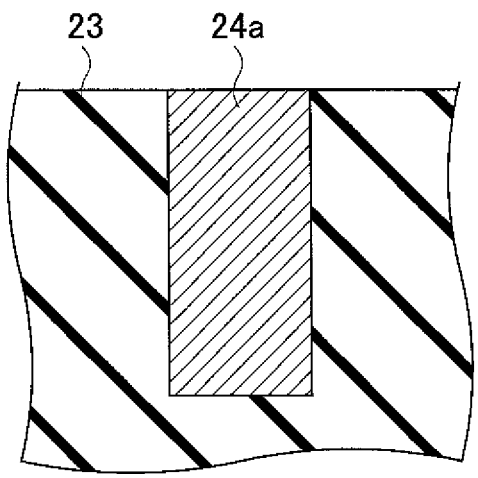
FIG. 6 is a cross-sectional view illustrating a sensing electrode utilized for the acceleration sensor according to the first embodiment.
Figure 7:
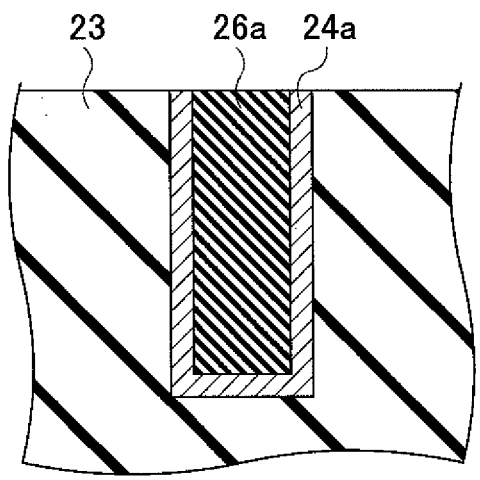
FIG. 7 is a cross-sectional view illustrating another sensing electrode utilized for the acceleration sensor according to the first embodiment.

Note that the number of the teeth-shaped electrodes of the comb-shaped electrode 24a and the comb-shaped electrode 24b may be increased by narrowing the intervals between the teeth of the comb-shaped electrode 24a and the comb-shaped electrode 24b, which may further improve the sensitivity in detecting the acceleration. FIG. 5 is a view illustrating an example of the comb-shaped electrode 24a and the comb-shaped electrode 24b forming the sensing electrode 24, in which the number of teeth (i.e., teeth-shaped electrodes) of the comb-shaped electrode 24a and the number of teeth of the comb-shaped electrode 24b are increased. With this configuration, the sensitivity in detecting the acceleration may be improved by increasing the number of the teeth of the comb-shaped electrode 24a and the number of the teeth of the comb-shaped electrode 24b. Further, as illustrated in FIG. 6, the comb-shaped electrode 24a may be formed by supplying a metallic material in an overall internal groove formed inside the ferroelectric layer 23. Alternatively, as illustrated in FIG. 7, a metallic film forming the comb-shaped electrode 24a may be formed on an internal surface of the groove of the ferroelectric layer 23, and the comb-shaped electrode 24a may be embedded by injecting a resin material 26a inside the groove of the ferroelectric layer 23. Note that the comb-shaped electrode 24b and the comb-shaped electrodes 34a and 34b may be formed in the same manner as that of the comb-shaped electrode 24a.

Further, the ferroelectric layer 23 formed in the acceleration sensor according to the first embodiment may be formed of a material having a perovskite structure, such as $BaTiO_3$, $BaCaTiO_3$, $(K,Na)NbO_3$, $Pb(Zr,Ti)O_3$, $(Pb,La)(Zr,Ti)O_3$, $Pb(Zr,Ti,Nb)O_3$, $(Pb,Sr)(Zr,Ti)O_3$ and $(Pb,Sr)(Zr,Ti,Li,W)O_3$, or a material having an ilmenite structure such as $LiNbO_3$, $LiTaO_3$, and the like.

(Method for Manufacturing Acceleration Sensor)

Next, a method for manufacturing the acceleration sensor according to the first embodiment is described.

Initially, the silicon substrate 21 having opposite sides polished is prepared as illustrated in FIGS. 8A and 8B. FIG. 8A is a top view illustrating a process of preparing the silicon substrate 21, and FIG. 8B is a cross-sectional view taken along a dash-dot line 8C-8D in FIG. 8A. In the description of the manufacturing method of the acceleration sensor according to the first embodiment, the silicon substrate 21 is utilized as an example of the substrate. However, the substrate utilized in the acceleration sensor according to the first embodiment may not be limited to the silicon substrate 21. The substrate utilized in the acceleration sensor according to the first embodiment may be a semiconductor substrate such as GaAs, or an oxide substrate such as $SrTiO_3$, MgO, $Al_2O_3$, or the like.

Figure 9A:
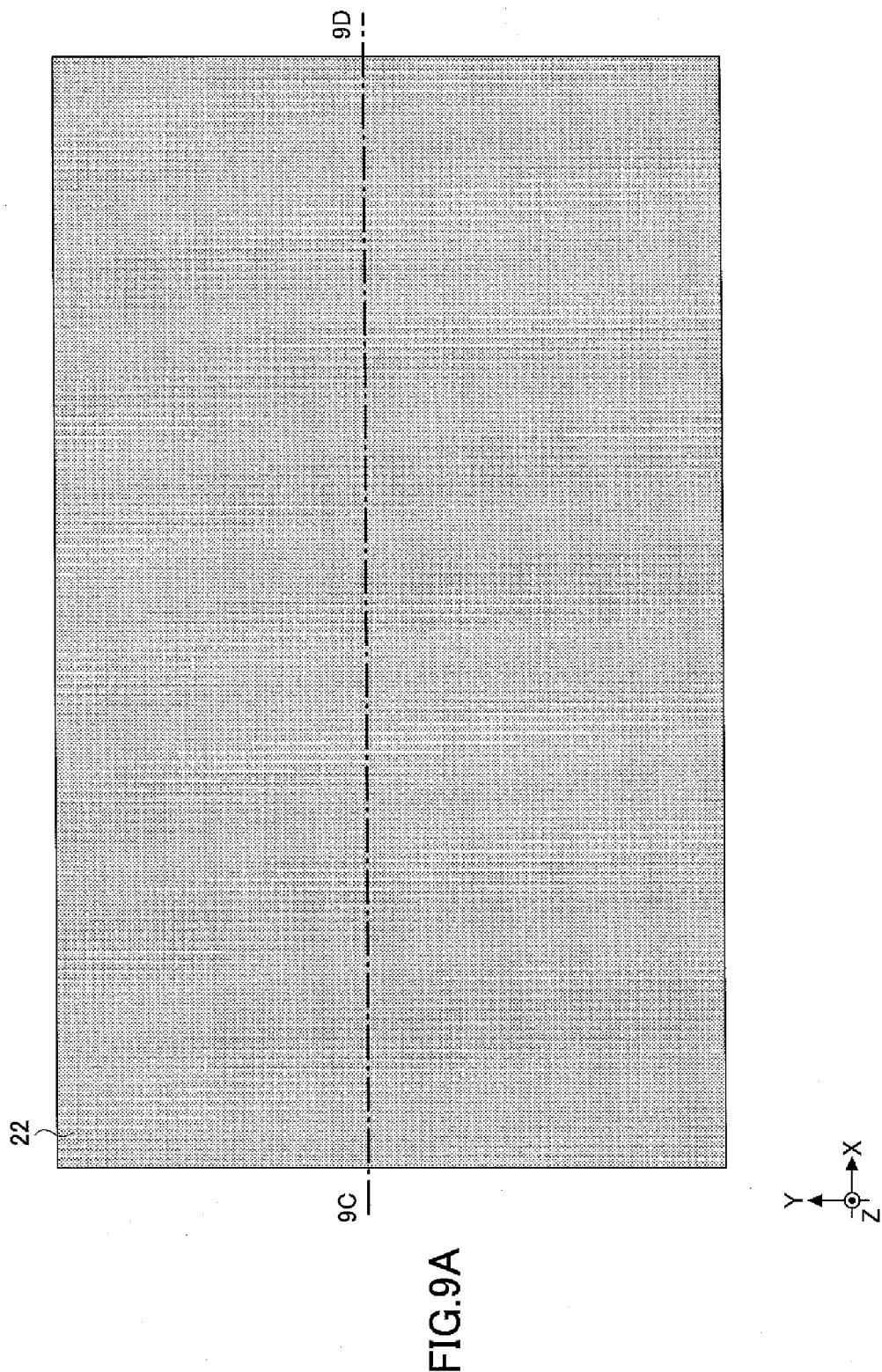
FIG. 9A is a top view illustrating the acceleration sensor according to the first embodiment in the manufacturing process.
Figure 9B:
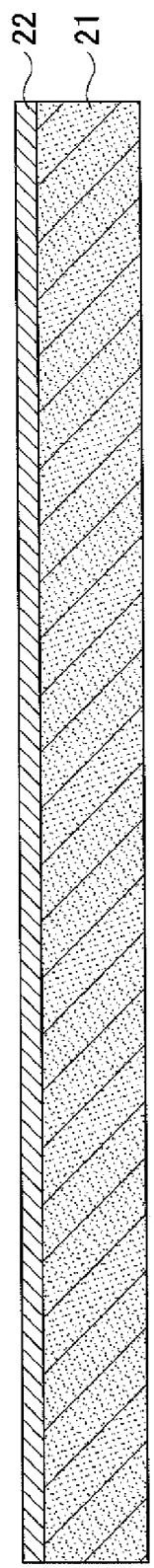
FIG. 9B is a cross-sectional view illustrating the acceleration sensor according to the first embodiment in the manufacturing process.

Next, the lower electrode 22 is formed on one surface of the silicon substrate 21 as illustrated in FIGS. 9A and 9B. The lower electrode 22 may preferably be formed of a refractory metallic material such as Pt, an oxide conductive material such as ITO, or a nitride conductive material such as TiN. In the method for manufacturing the acceleration sensor according to the first embodiment, Pt is deposited by sputtering as an example of the lower electrode 22 such that the lower electrode 22 of approximately 200 nm is formed on the surface of the silicon substrate 21. Alternatively, the lower electrode 22 may be formed by vacuum deposition. Note that FIG. 9A is a top view illustrating a process of forming the lower electrode 22, and FIG. 9B is a cross-sectional view taken along a dash-dot line 9C-9D in FIG. 9A.

Next, the ferroelectric layer 23 serving as a piezoelectric layer is formed on the lower electrode 22 as illustrated in FIGS. 10A and 10B. The ferroelectric layer 23 has a film thickness of approximately 5 μm and may be formed by various methods such as sputtering, sol-gel coating, pulsed-laser deposition, and metal organic chemical vapor deposition (MOCVD). Note that FIG. 10A is a top view illustrating a process of forming the ferroelectric layer 23, and FIG. 10B is a cross-sectional view taken along a dash-dot line 10C-10D in FIG. 10A.

Figure 11A:
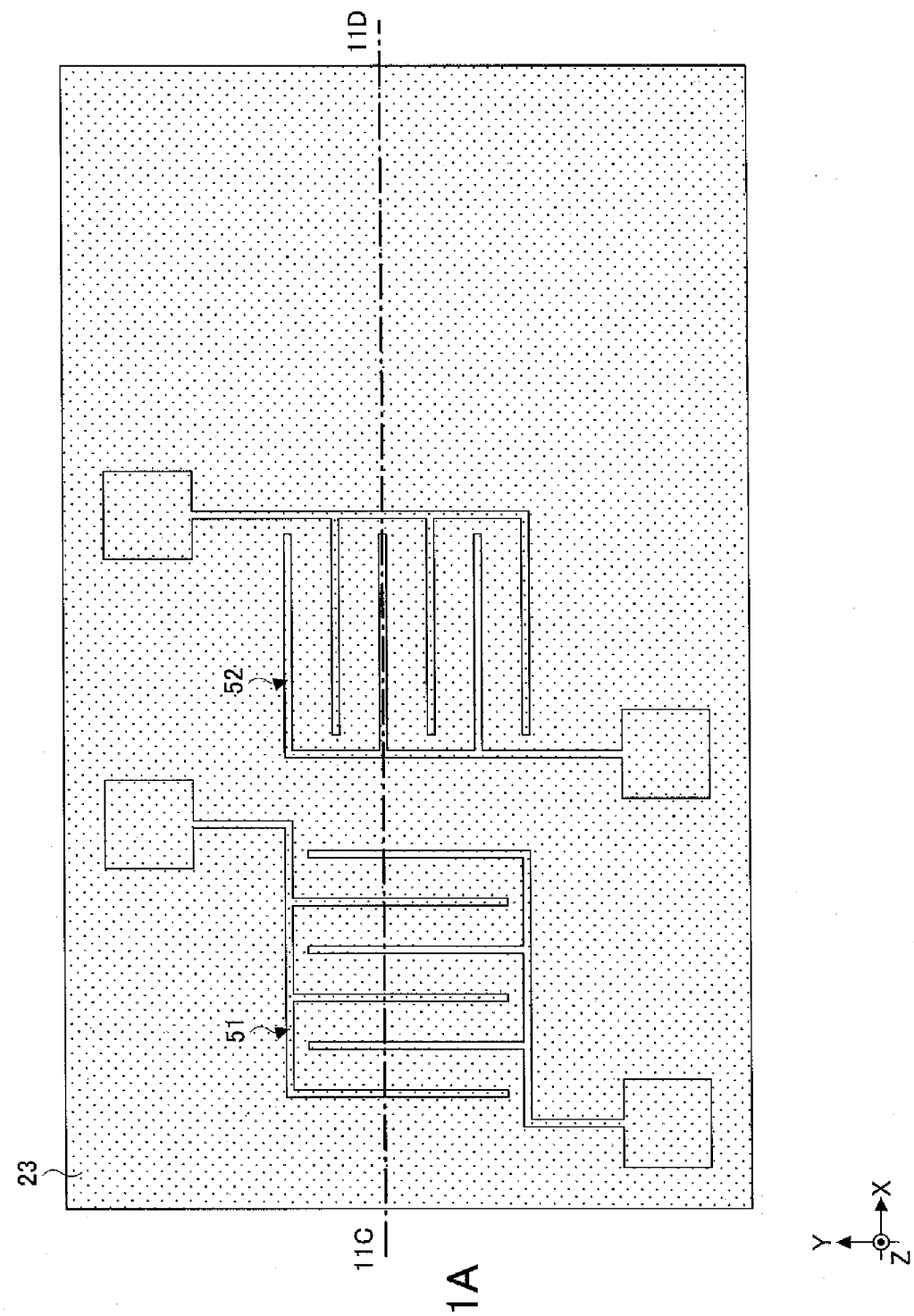
FIG. 11A is a top view illustrating the acceleration sensor according to the first embodiment in the manufacturing process.

Next, grooves 51 and 52 are formed in the ferroelectric layer 23 as illustrated in FIGS. 11A and 11B, which will result in the later-described sensing electrodes. More specifically, after photoresist is applied to the ferroelectric layer 23, the applied photoresist is prebaked and then exposed to light for performing the development utilizing an exposure device having an ultraviolet (i-line) light source, thereby forming a resist pattern having openings in areas of the ferroelectric layer 23 where the grooves 51 and 52 are to be formed. Thereafter, the resist pattern formed on the ferroelectric layer 23 is removed by reactive ion etching (RIE) utilizing a chlorine ($Cl_2$) gas or a fluorine ($F_2$) gas, thereby forming the grooves 51 and 52. In this process, inductive coupled plasma (ICP) or electron cyclotron resonance (ECR) may be utilized as a plasma source. The thus formed grooves 51 and 52 have a length of 500 μm, a width of 2 μm, and a groove interval of 3 μm (a groove pitch of 5 μm). Note that FIG. 11A is a top view illustrating a process of forming the grooves 51 and 52, and FIG. 11B is a cross-sectional view taken along a dash-dot line 11C-11D in FIG. 11A.

Figure 12A:
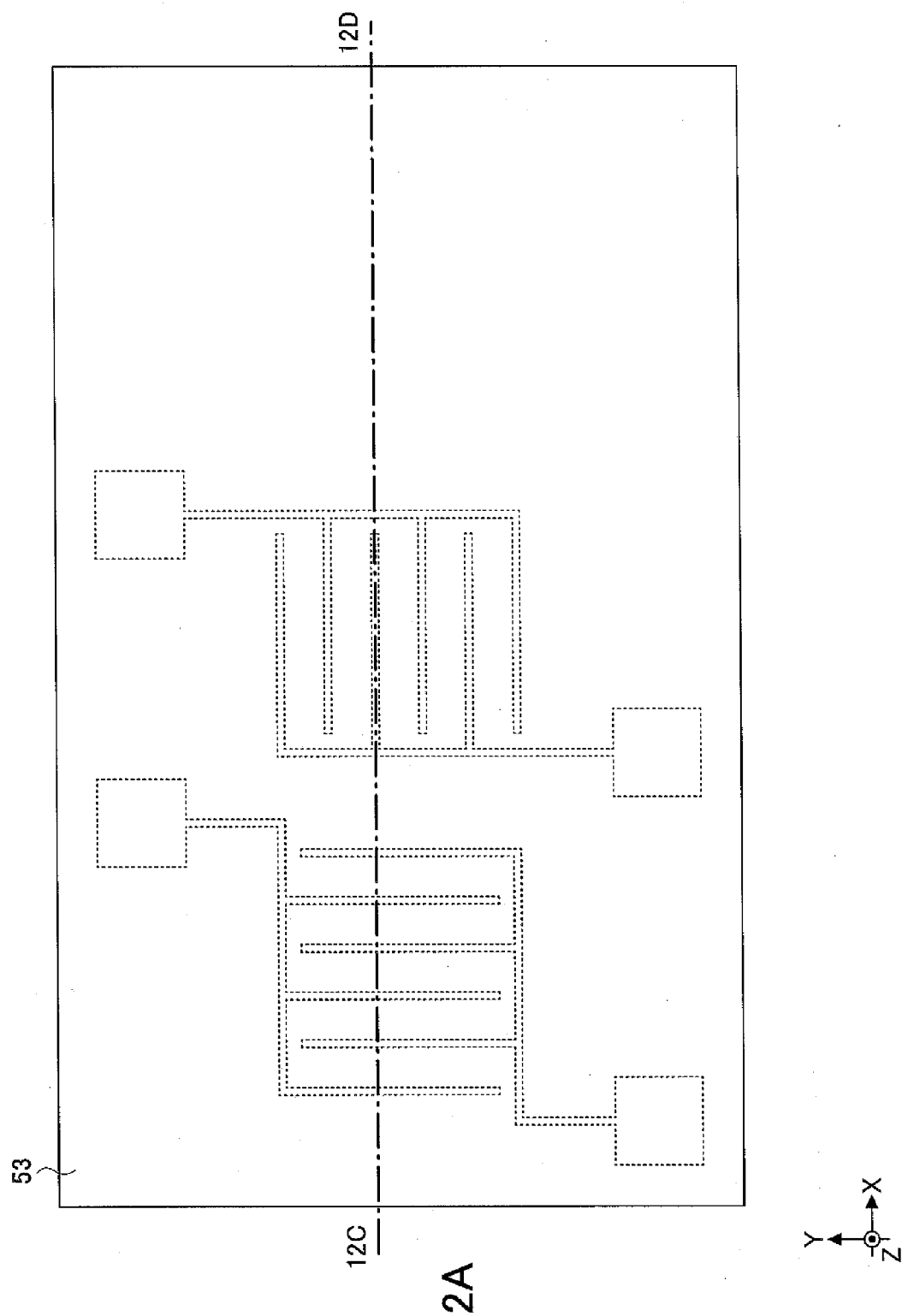
FIG. 12A is a top view illustrating the acceleration sensor according to the first embodiment in the manufacturing process.
Figure 12B:
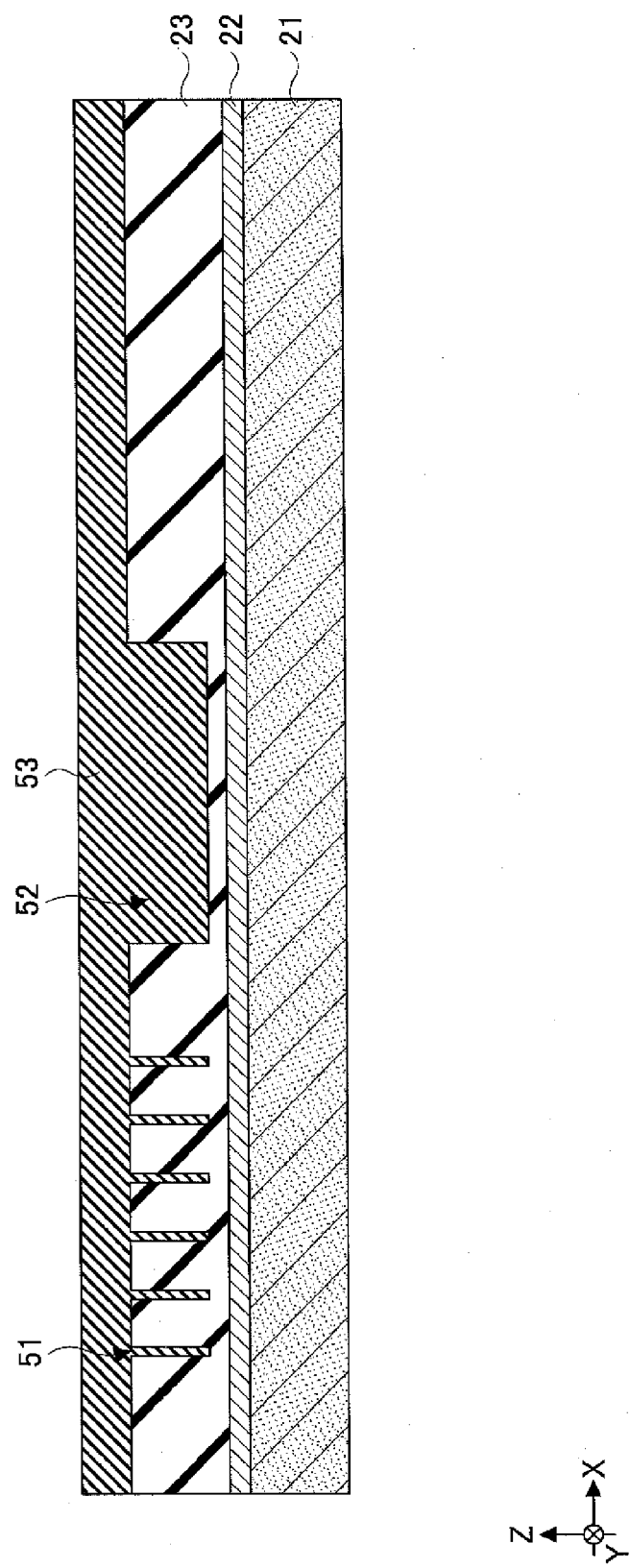
FIG. 12B is a cross-sectional view illustrating the acceleration sensor according to the first embodiment in the manufacturing process.

Next, a resin material layer 53 is formed on the ferroelectric layer 23 having the grooves 51 and 52 as illustrated in FIGS. 12A and 12B. The resin material layer 53 is formed on the ferroelectric layer 23 by spin-coating. In this process, the resin material layer 53 is formed inside the grooves 51 and 52 of the ferroelectric layer 23 and is also formed on the surface of the ferroelectric layer 23. Note that FIG. 12A is a top view illustrating a process of forming the resin material layer 53, and FIG. 12B is a cross-sectional view taken along a dash-dot line 12C-12D in FIG. 12A.

Figure 13A:
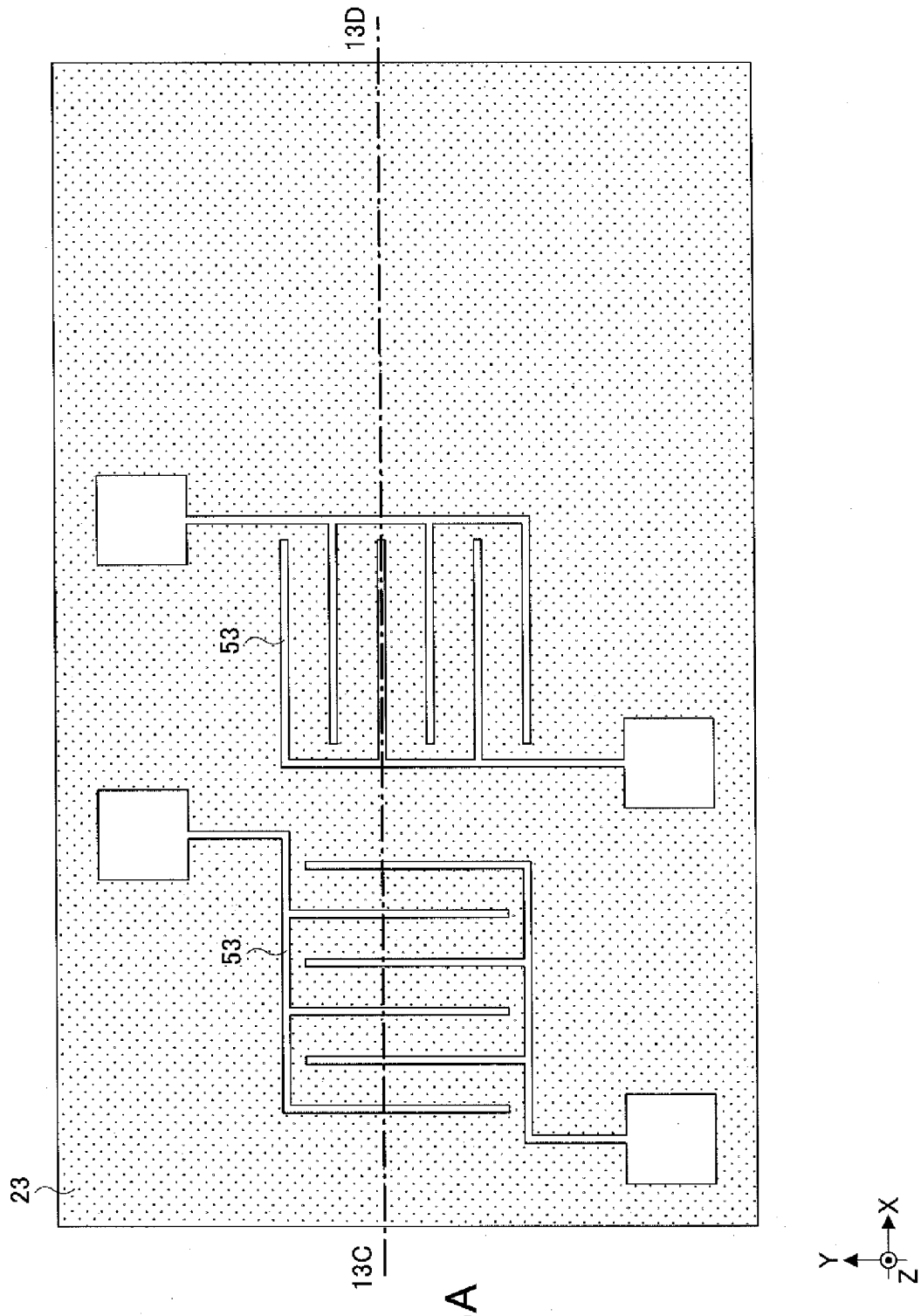
FIG. 13A is a top view illustrating the acceleration sensor according to the first embodiment in the manufacturing process.
Figure 13B:
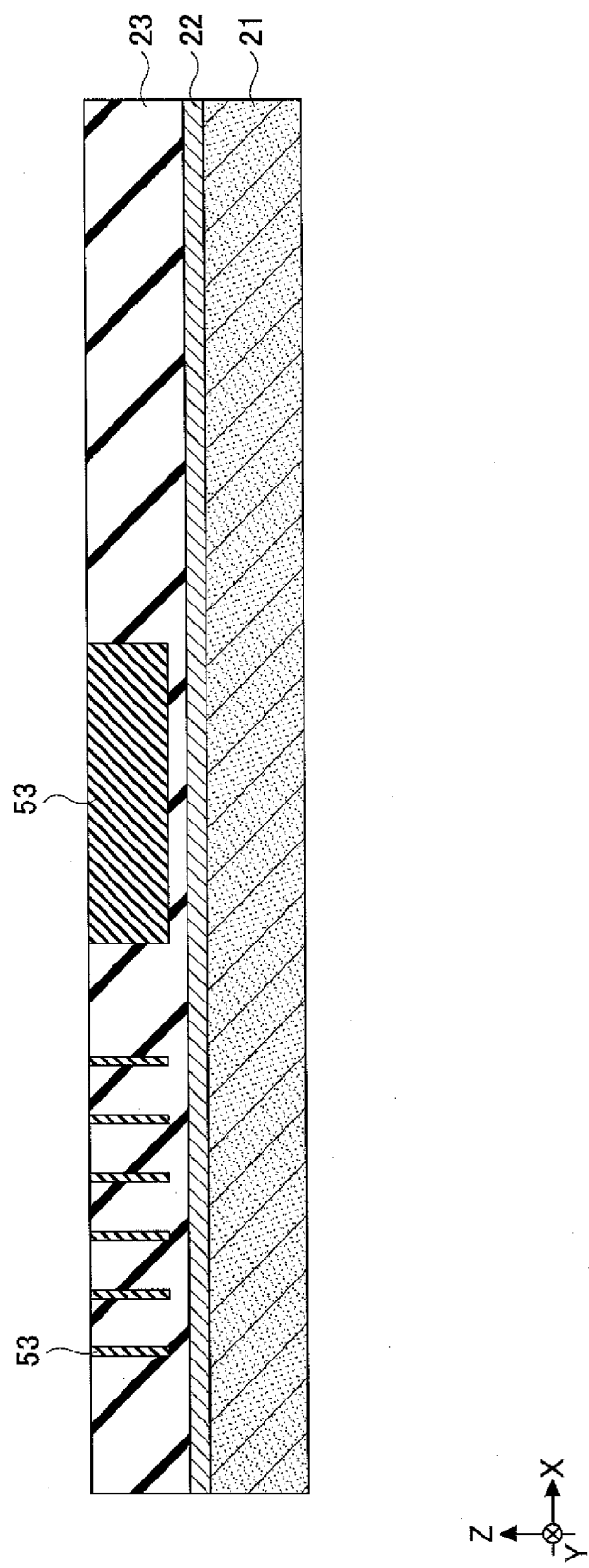
FIG. 13B is a cross-sectional view illustrating the acceleration sensor according to the first embodiment in the manufacturing process.

Next, the resin material layer 53 is removed from the ferroelectric layer 23 by oxygen plasma ashing so as to expose areas of the surface of the ferroelectric layer 23 where the grooves 51 and 52 are not formed as illustrated in FIGS. 13A and 13B. In this process, the resin material layer 53 is supplied inside the grooves 51 and 52 of the ferroelectric layer 23 such that the surface of the ferroelectric layer 23 becomes flat and smooth without recesses. Note that FIG. 13A is a top view illustrating a process of removing the resin material layer 53 until the surface of the ferroelectric layer 23 is exposed (excluding the groove-formed areas of the ferroelectric layer 23), and FIG. 13B is a cross-sectional view taken along a dash-dot line 13C-13D in FIG. 13A.

Figure 14A:
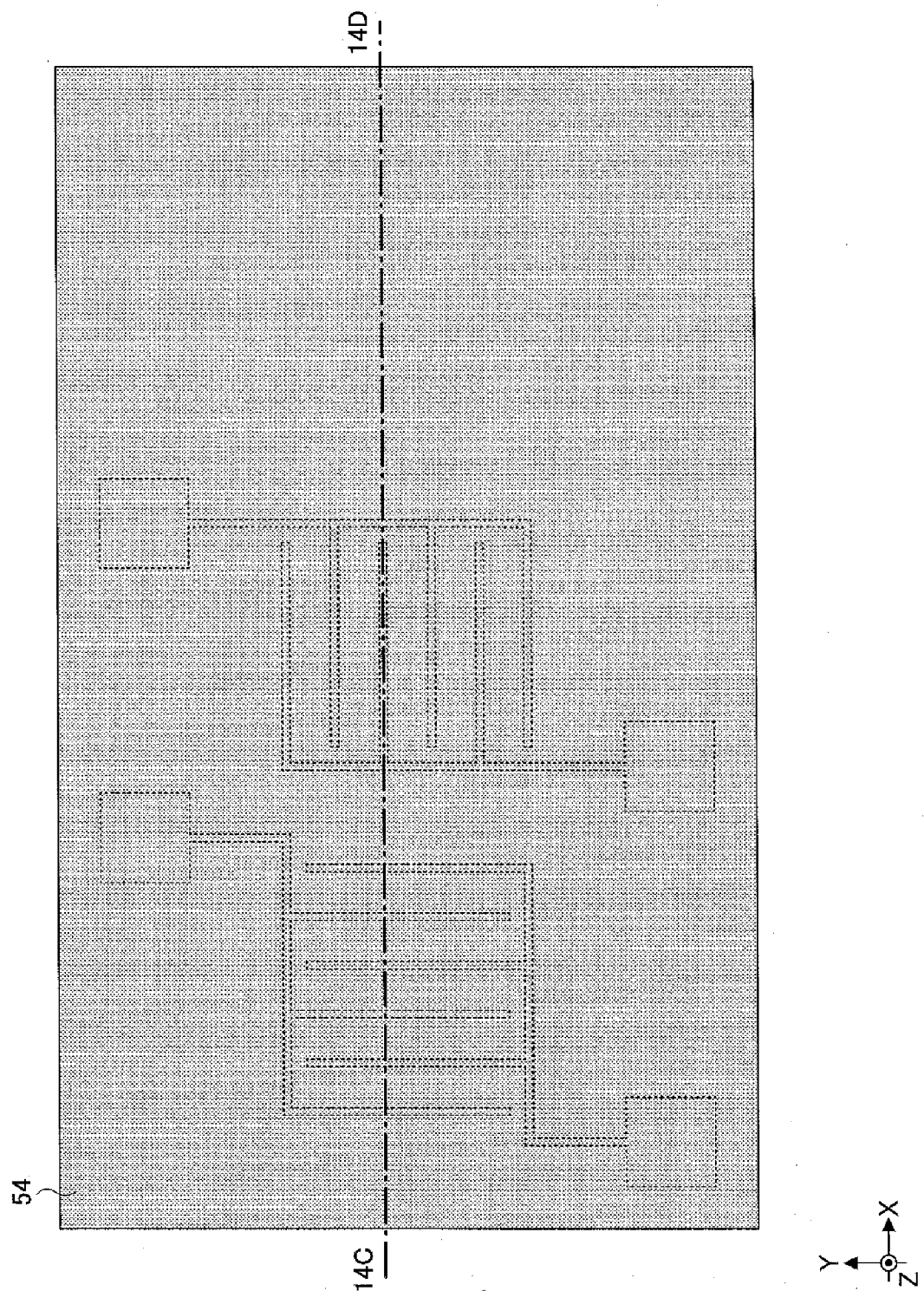
FIG. 14A is a top view illustrating the acceleration sensor according to the first embodiment in the manufacturing process.

Next, an upper polarization electrode film 54 is formed on the ferroelectric layer 23 and the resin material layer 53 supplied into the grooves 51 and 52 of the ferroelectric layer 23 as illustrated in FIGS. 14A and 14B. The upper polarization electrode film 54 utilized in the acceleration sensor according to the first embodiment is formed by sputtering or vacuum depositing aluminum (Al). Note that FIG. 14A is a top view illustrating a process of forming the upper polarization electrode film 54, and FIG. 14B is a cross-sectional view taken along a dash-dot line 14C-14D in FIG. 14A.

Next, upper polarization electrodes 54a and 54b are formed on the ferroelectric layer 23 as illustrated in FIGS. 15A and 15B. Specifically, a photoresist is applied to a surface of the upper polarization electrode film 54, and the applied photoresist is prebaked and then exposed to light for performing the development utilizing an exposure device, thereby forming a resist pattern in the areas where the upper polarization electrodes 54a and 54b are to be formed. Thereafter, the upper polarization electrode film 54 is removed from the areas where the resist pattern is not formed by wet etching utilizing etchant containing phosphoric acid as a major component. Thereafter, the resist pattern is further removed, thereby forming the upper polarization electrodes 54a and 54b. Note that FIG. 15A is a top view illustrating a process of forming the upper polarization electrodes 54a and 54b, and FIG. 15B is a cross-sectional view taken along a dash-dot line 15C-15D in FIG. 15A.

Figure 16A:
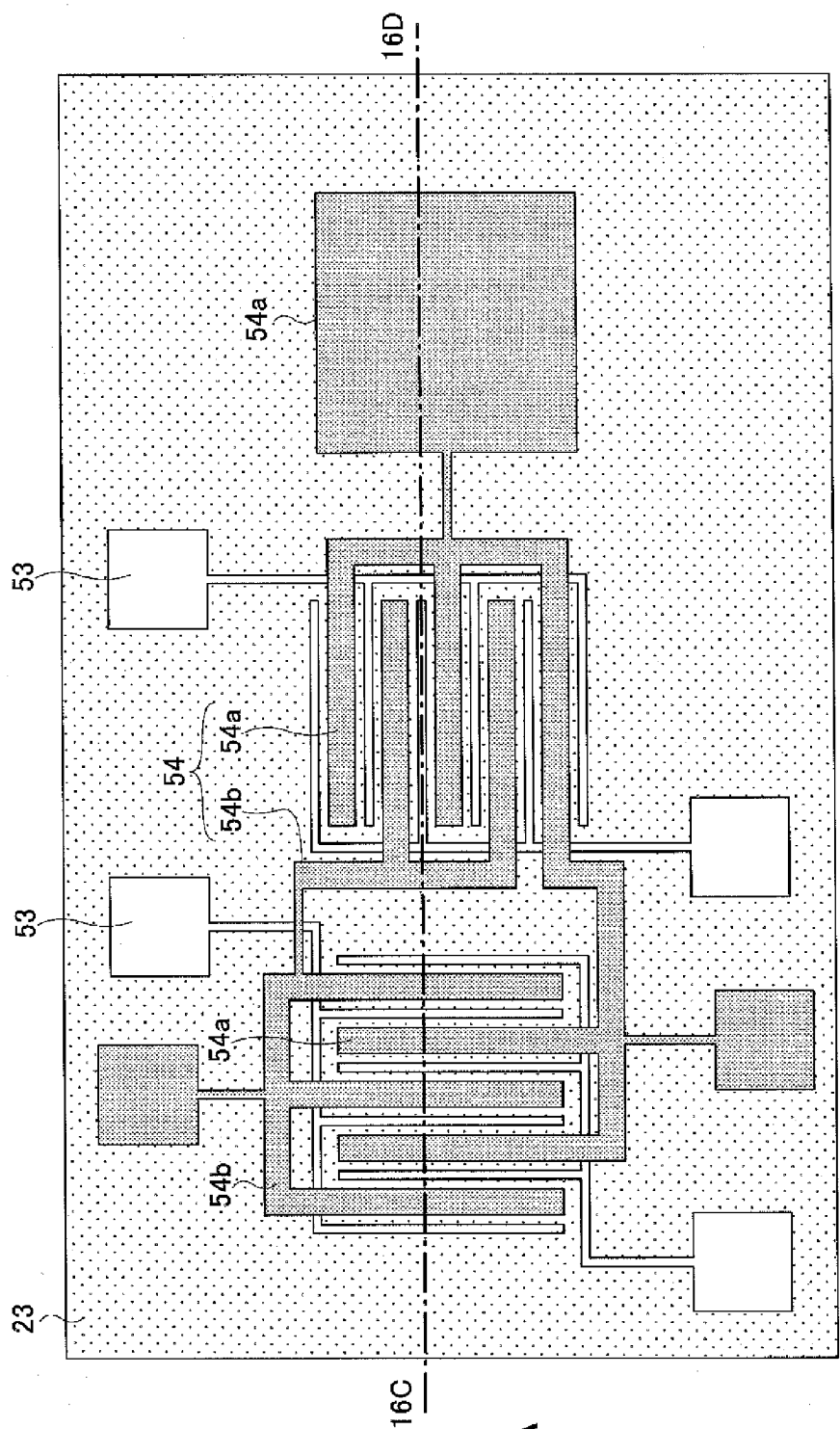
FIG. 16A is a top view illustrating the acceleration sensor according to the first embodiment in the manufacturing process.

Next, the respective areas of the ferroelectric layer 23 where the X-axis direction acceleration sensor 11, the Y-axis direction acceleration sensor 12 and the Z-axis direction acceleration sensor 13 are formed are polarized as illustrated in FIGS. 16A and 16B. Specifically, when a voltage is applied between the lower electrode 22 and upper polarization electrodes 54a and 54b, the ferroelectric layer 23 interposing between the upper polarization electrodes 54a and 54b is polarized in polarization directions indicated by thick arrows D1 and D2. More specifically, when a voltage of 100 V is applied between the lower electrode 22 and upper polarization electrodes 54a and 54b, the ferroelectric layer 23 interposing between the upper polarization electrodes 54a and 54b is polarized in the polarization directions indicated by the thick arrows D1 and D2. In this process, in the respective areas of the ferroelectric layer 23 where the X-axis direction acceleration sensor 11 and the Y-axis direction acceleration sensor 12 are formed, the resin material layer 53 is formed in the grooves 51 and 52 of the ferroelectric layer 23 so that adjacent areas of the ferroelectric layer 23 are areas formed via the resin material layer 53 are polarized in mutually opposite directions as indicated by the thick arrows D1 and D2. Accordingly, an electric potential opposite from the electric potential applied to the upper polarization electrode 54a is applied to the upper polarization electrode 54b; that is, a voltage of −100 V is applied to the upper polarization electrode 54b. Note that the polarization in the area of the ferroelectric layer 23 where the Y-axis direction acceleration sensor 12 is formed is not depicted in FIGS. 16A and 16B. However, the area of the ferroelectric layer 23 where the Y-axis direction acceleration sensor 12 is formed is polarized in the same manner as the polarized area of the ferroelectric layer 23 formed in the X-axis direction acceleration sensor 11. Further, the area of the ferroelectric layer 23 where the Z-axis direction acceleration sensor 11 is formed is polarized in an upward direction indicated by thick arrows E by applying a voltage to the upper polarization electrode 54a as illustrated in FIG. 16B. Note that FIG. 16A is a top view illustrating a process of polarizing the respective areas of the ferroelectric layer 23, and FIG. 16B is a cross-sectional view taken along a dash-dot line 16C-16D in FIG. 16A.

Figure 17A:
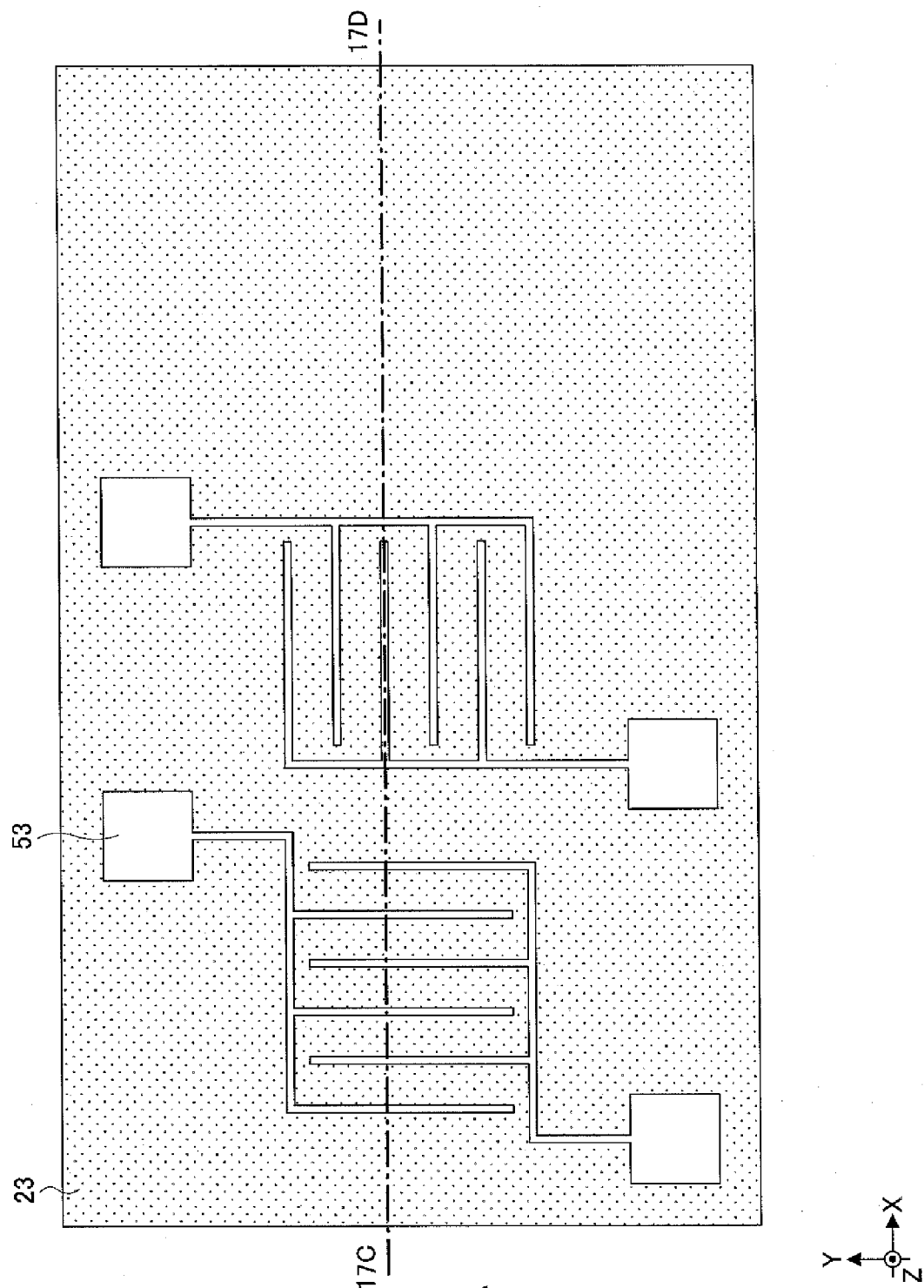
FIG. 17A is a top view illustrating the acceleration sensor according to the first embodiment in the manufacturing process.

Next, the upper polarization electrodes 54a and 54b formed on the ferroelectric layer 23 are removed by wet etching as illustrated in FIGS. 17A and 17B. Note that FIG. 17A is a top view illustrating a process of removing the upper polarization electrodes 54a and 54b, and FIG. 17B is a cross-sectional view taken along a dash-dot line 17C-17D in FIG. 17A.

Figure 18A:
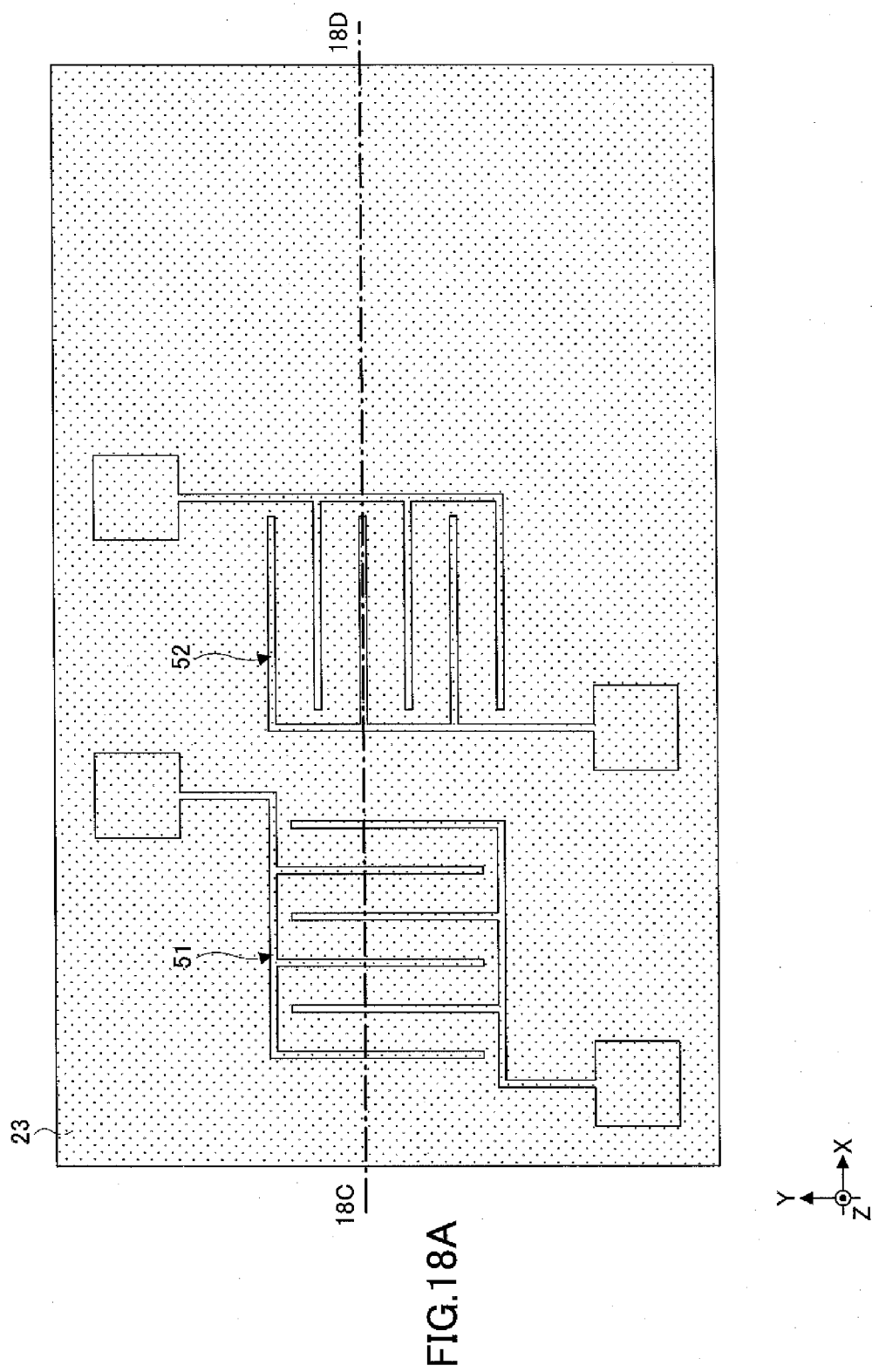
FIG. 18A is a top view illustrating the acceleration sensor according to the first embodiment in the manufacturing process.
Figure 18B:
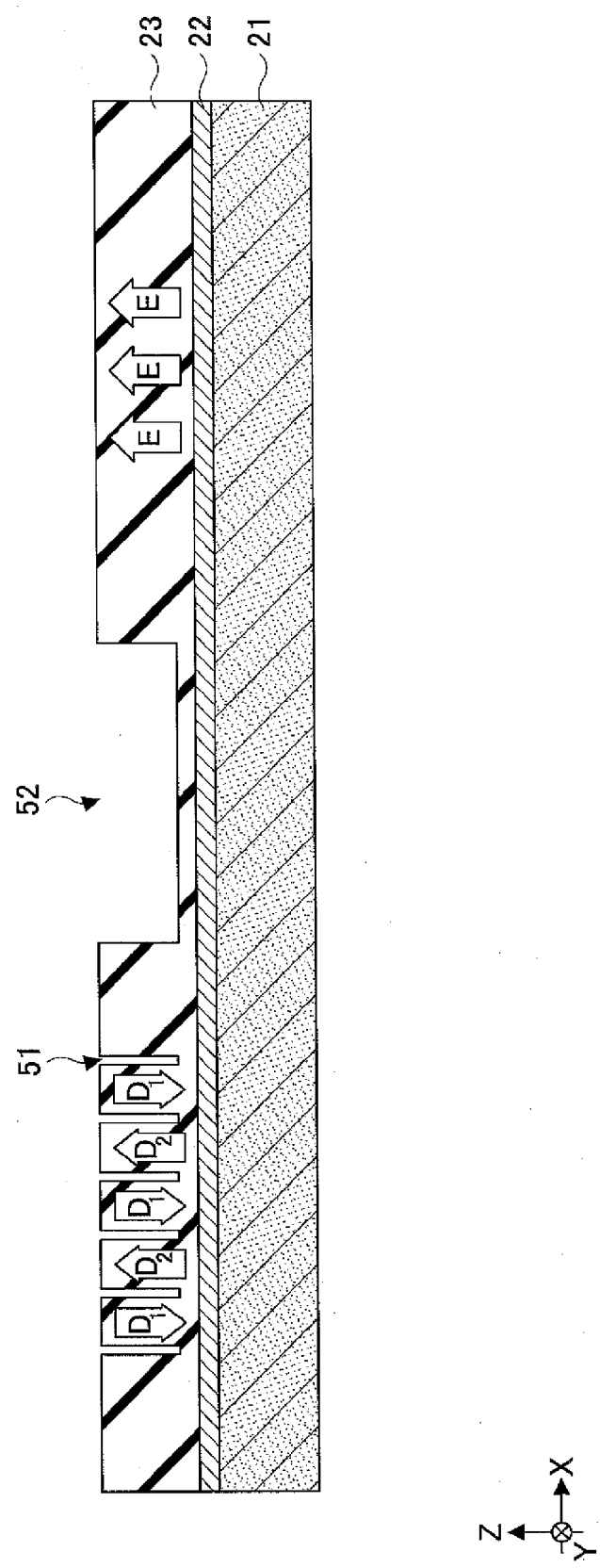
FIG. 18B is a cross-sectional view illustrating the acceleration sensor according to the first embodiment in the manufacturing process.

Next, the resin material layer 53 formed in the grooves 51 and 52 of the ferroelectric layer 23 is removed by oxygen plasma ashing as illustrated in FIGS. 18A and 18B. Note that FIG. 18A is a top view illustrating a process of removing the resin material layer 53, and FIG. 18B is a cross-sectional view taken along a dash-dot line 18C-18D in FIG. 18A.

Figure 19A:
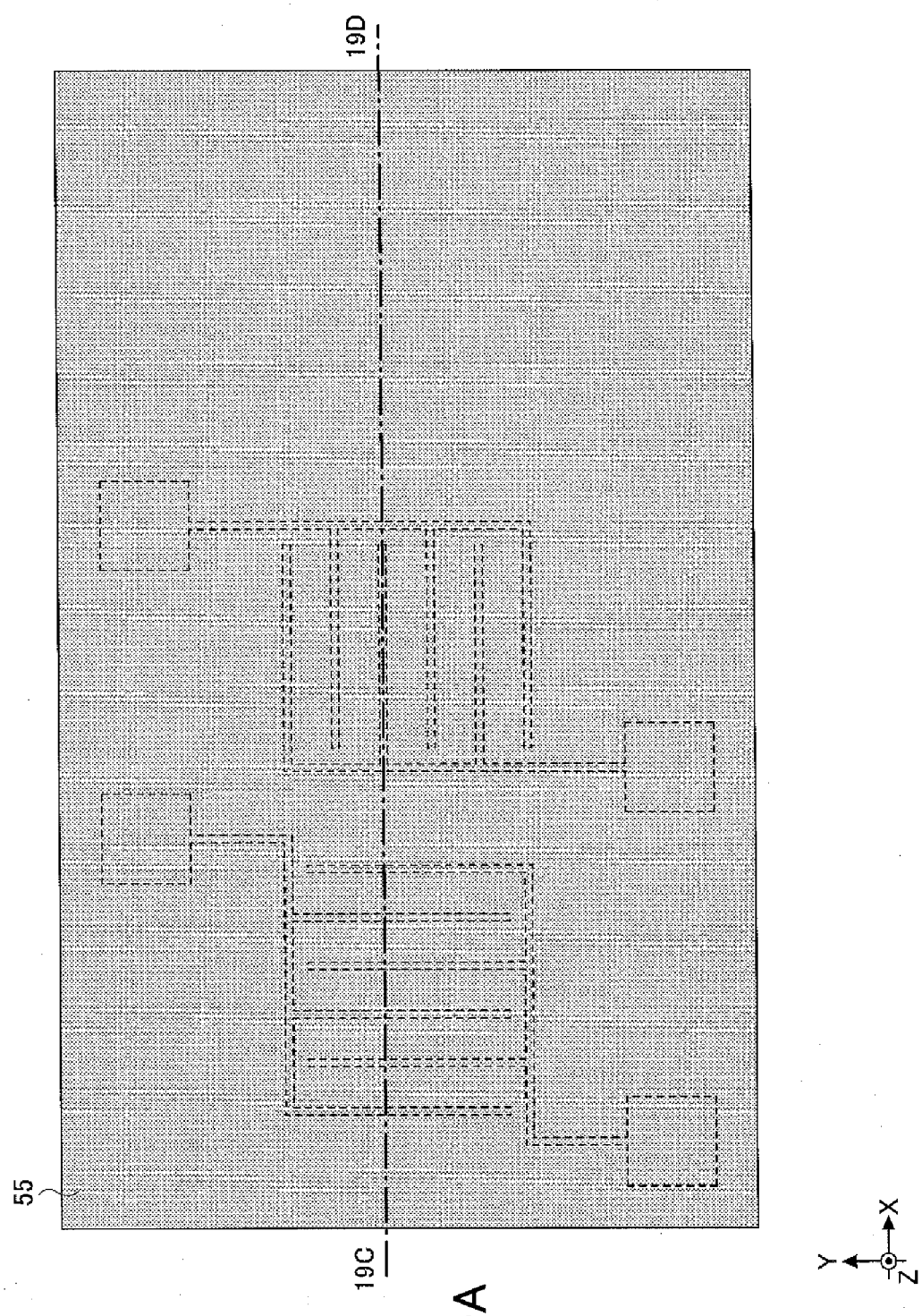
FIG. 19A is a top view illustrating the acceleration sensor according to the first embodiment in the manufacturing process.
Figure 19B:
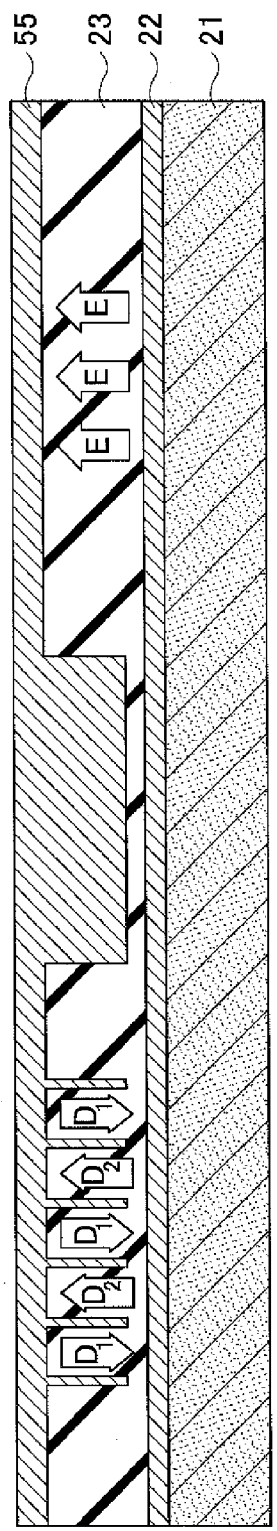
FIG. 19B is a cross-sectional view illustrating the acceleration sensor according to the first embodiment in the manufacturing process.

Next, a metallic film 55 is formed on a surface of the ferroelectric layer 23 in which the grooves 51 and 52 are formed as illustrated in FIGS. 19A and 19B. The metallic film 55 formed on the surface of the ferroelectric layer 23 is made of a metallic material such as platinum (Pt) or copper (Cu). In the method for manufacturing the acceleration sensor according to the first embodiment, Pt is plated on the surface of the ferroelectric layer 23 as an example of the metallic layer 55. In this process, the metallic film 55 is formed inside the grooves 51 and 52 of the ferroelectric layer 23 and is also formed over the surface of the ferroelectric layer 23. Note that FIG. 19A is a top view illustrating a process of forming the metallic film 55, and FIG. 19B is a cross-sectional view taken along a dash-dot line 19C-19D in FIG. 19A. Note that the sensing electrodes having the comb-shaped electrode 24a illustrated in FIG. 7 may be formed by sputtering the metallic film 55 on the internal surface of the grooves of the ferroelectric layer 23 and injecting the resin material in the grooves via the metallic film 55.

Figure 20B:
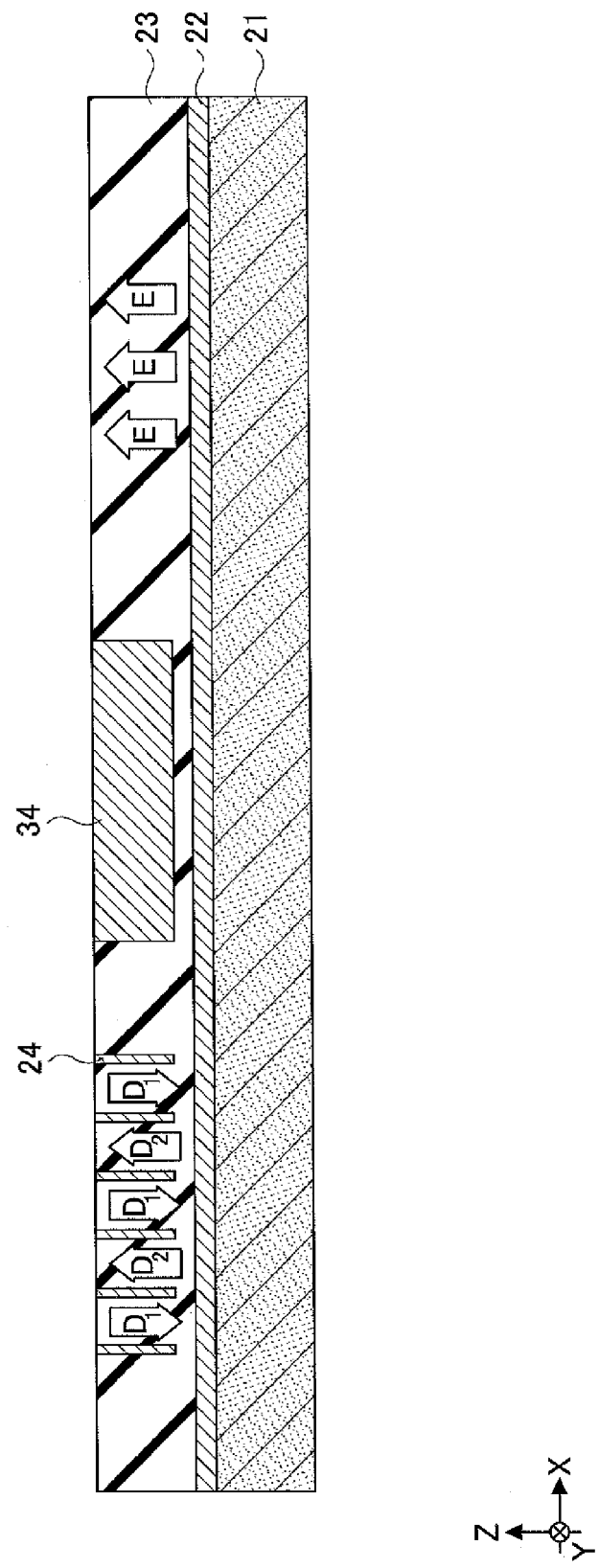
FIG. 20B is a cross-sectional view illustrating the acceleration sensor according to the first embodiment in the manufacturing process.

Next, the resin material layer 55 formed over the surface of the ferroelectric layer 23 is removed by polishing while allowing the metallic film 55 formed inside the grooves 51 and 52 to remain as illustrated in FIGS. 20A and 20B. Accordingly, the sensing electrode 24 of the X-axis direction acceleration sensor 11 is formed by utilizing the metallic film 55 remaining inside the grooves 51, whereas the sensing electrode 34 of the Y-axis direction acceleration sensor 12 is formed by utilizing the metallic film 55 remaining inside the groove 52. In this process, the electrode terminals 29a, 29b, 39a and 39b may simultaneously be formed by utilizing the metallic film 55 remaining inside the grooves 51 and 52. Note that FIG. 20A is a top view illustrating a process of forming the sensing electrodes 24 and 34 and the electrode terminals 29a, 29b, 39a and 39b, and FIG. 20B is a cross-sectional view taken along a dash-dot line 20C-20D in FIG. 20A.

Figure 21A:
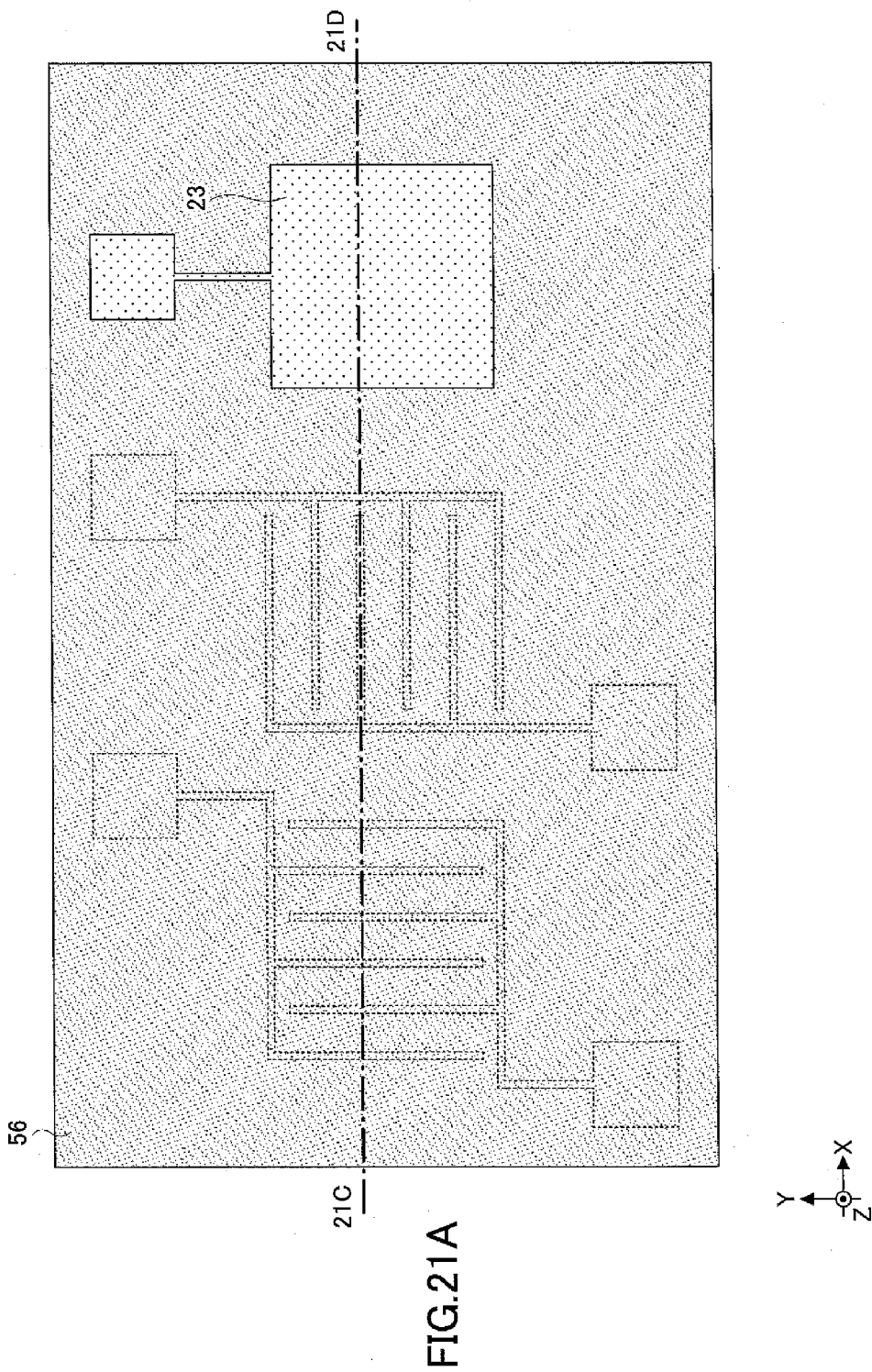
FIG. 21A is a top view illustrating the acceleration sensor according to the first embodiment in the manufacturing process.
Figure 21B:
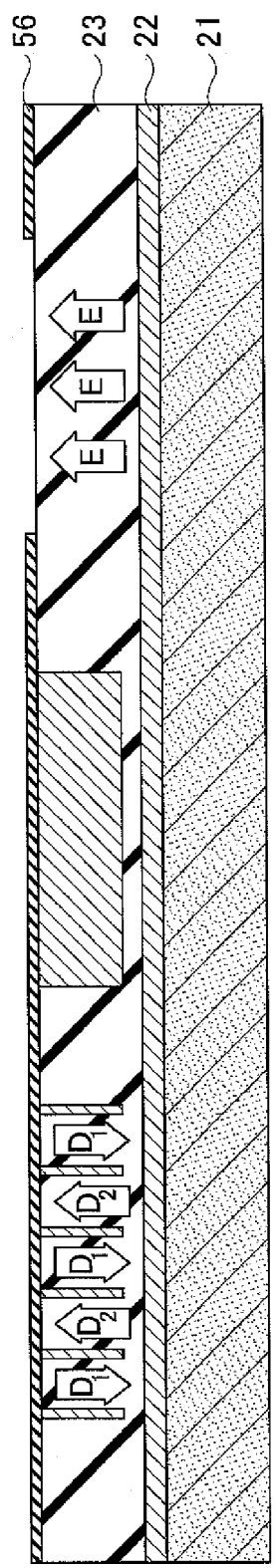
FIG. 21B is a cross-sectional view illustrating the acceleration sensor according to the first embodiment in the manufacturing process.

Next, a resist pattern 56 having an opening is formed in an area where the sensing electrode and the like of the Z-axis direction acceleration sensor 13 are formed as illustrated in FIGS. 21A and 21B. Specifically, a photoresist is applied to the surface having the sensing electrodes 24 and 34 of the ferroelectric layer 23, and the applied photoresist is prebaked and then exposed to light for performing the development utilizing an exposure device, thereby forming the resist pattern 56 having the opening in the area where the sensing electrode and the like of the Z-axis direction acceleration sensor 13 are formed. Note that FIG. 21A is a top view illustrating a process of forming the resist pattern 56, and FIG. 21B is a cross-sectional view taken along a dash-dot line 21C-21D in FIG. 21A.

Figure 22A:
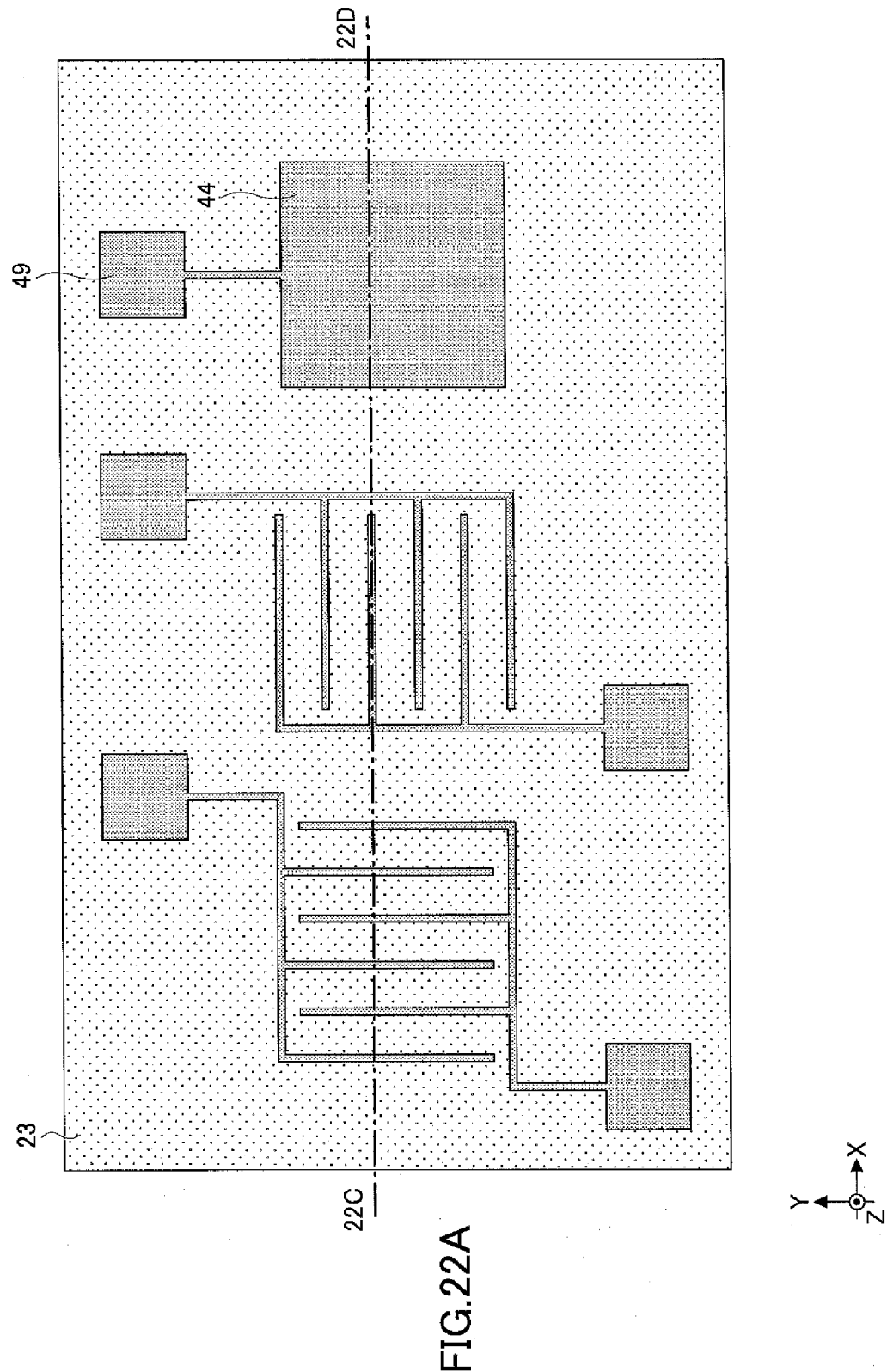
FIG. 22A is a top view illustrating the acceleration sensor according to the first embodiment in the manufacturing process.
Figure 22B:
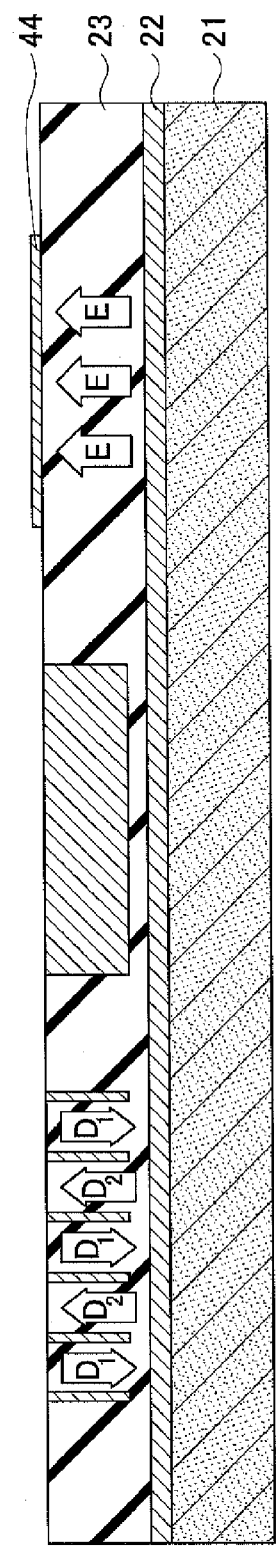
FIG. 22B is a cross-sectional view illustrating the acceleration sensor according to the first embodiment in the manufacturing process.

Next, a sensing electrode 44 and an electrode terminal 49 of the Z-axis direction acceleration sensor 13 are formed as illustrated in FIGS. 22A and 22B. Specifically, a metallic film such as a Pt film may be sputtered on the surface of the ferroelectric layer 23 where the resist pattern 56 is formed, and subsequently immersed into an organic solvent or the like to lift off the metallic layer. As a result, the metallic film formed in the area of the ferroelectric layer 23 where resist pattern 56 is formed is removed together with the resist pattern 56. Accordingly, the metallic film remains in an area of the ferroelectric layer 23 where the resist pattern 56 is not formed, and the sensing electrode 44 and the electrode terminal 49 of the Z-axis direction acceleration sensor 13 are formed by utilizing the remaining metallic film. Note that FIG. 22A is a top view illustrating a process of forming the sensing electrode 44 and the electrode terminal 49 of the Z-axis direction acceleration sensor 13, and FIG. 22B is a cross-sectional view taken along a dash-dot line 22C-22D in FIG. 22A.

Next, an insulator film 57 is formed on the ferroelectric layer 23 including the sensing electrode 44 and the electrode terminal 49 as illustrated in FIGS. 23A and 23B. The insulator film 57 is formed of a material such as $Al_2O_3$ which is formed by sputtering or vacuum deposition. The insulator film 57 has a film thickness of 500 nm. Note that FIG. 23A is a top view illustrating a process of forming the insulator film 57, and FIG. 23B is a cross-sectional view taken along a dash-dot line 23C-23D in FIG. 23A.

Figure 24A:
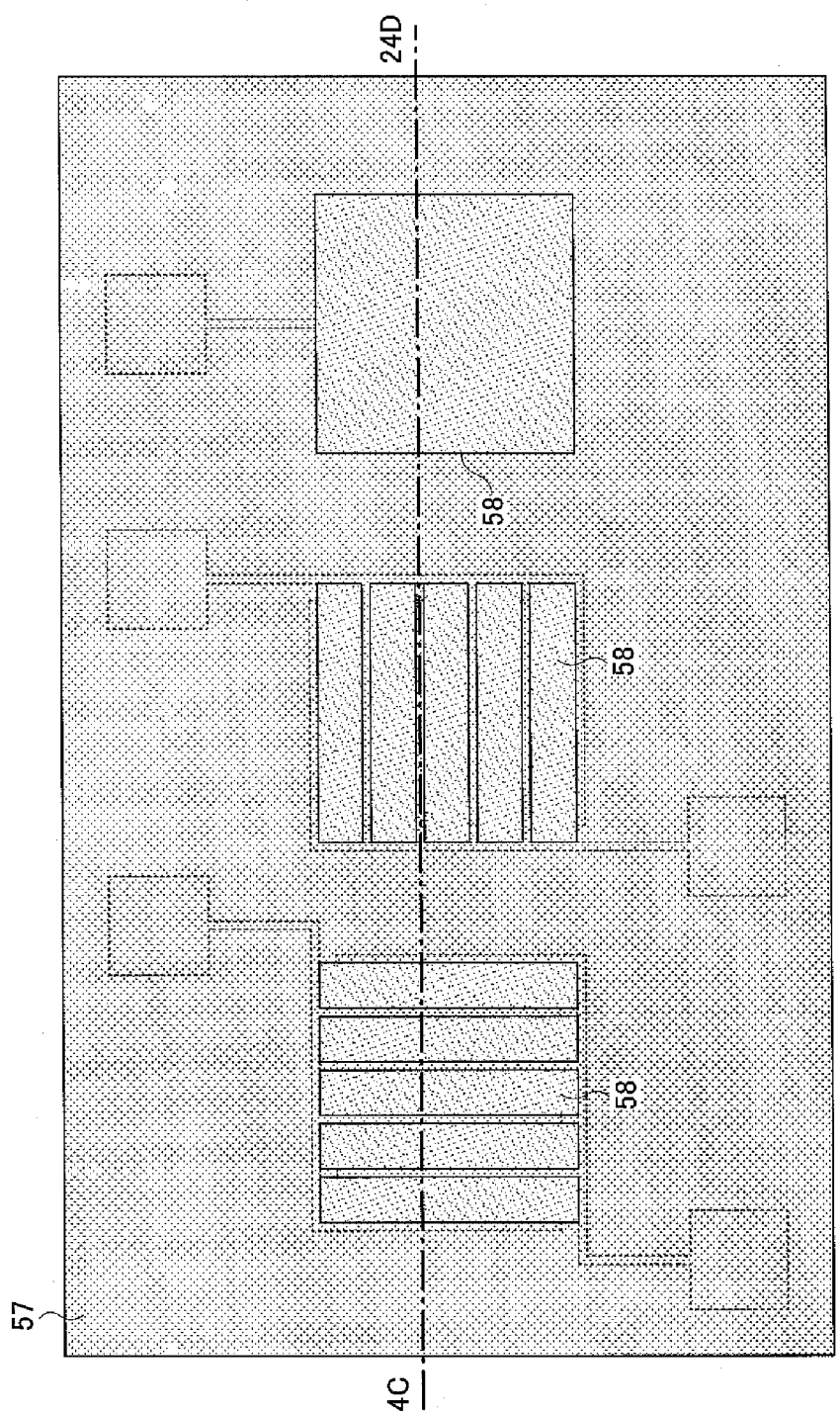
FIG. 24A is a top view illustrating the acceleration sensor according to the first embodiment in the manufacturing process.
Figure 24B:
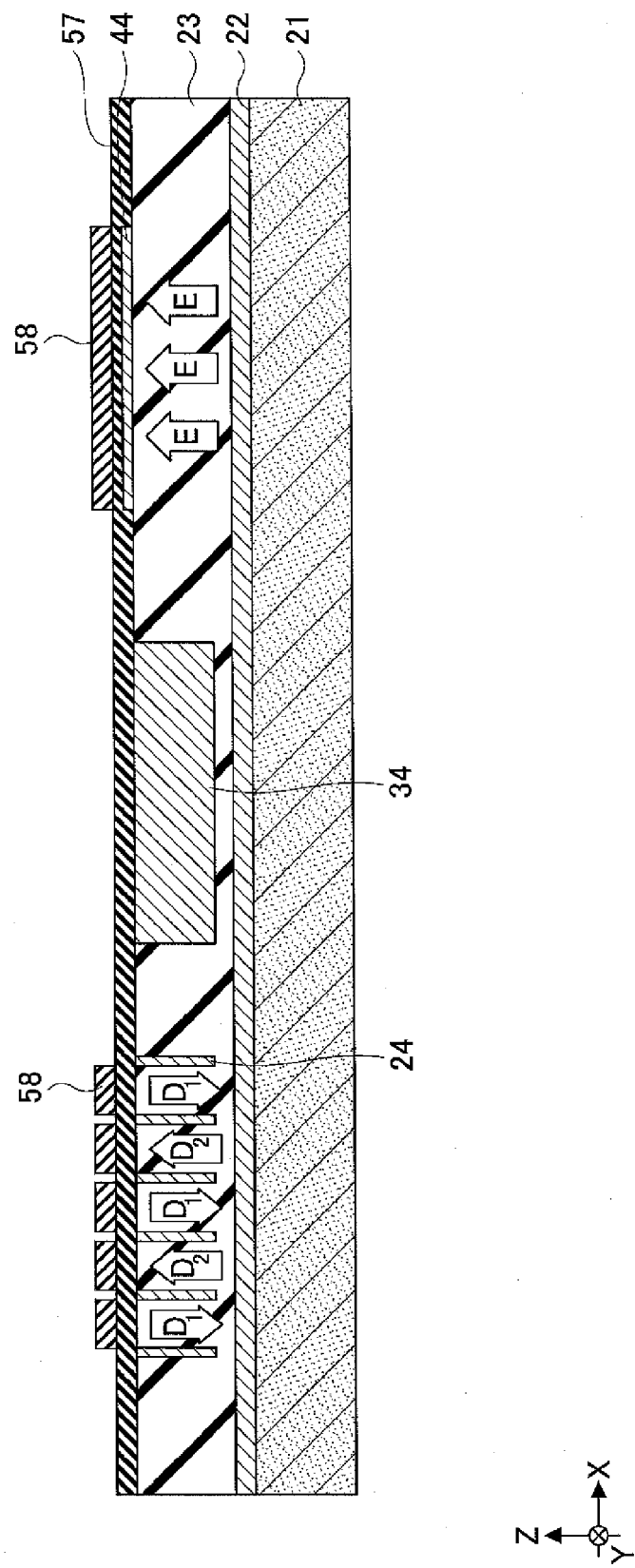
FIG. 24B is a cross-sectional view illustrating the acceleration sensor according to the first embodiment in the manufacturing process.

Next, a resist pattern 58 is formed on the insulator film 57 as illustrated in FIGS. 24A and 24B. Specifically, the resist pattern 58 is formed such that the resist remains on the later-described insulator layer 25 of the X-axis direction acceleration sensor 11, the insulator layer 35 of the Y-axis direction acceleration sensor 12, and the insulator layer 45 of the Z-axis direction acceleration sensor 13. Specifically, a photoresist is applied to the surface of the insulator film 57, and the applied photoresist is prebaked, and then exposed to light for performing the development utilizing the exposure device, thereby forming the resist pattern 58. Note that FIG. 24A is a top view illustrating a process of forming the resist pattern 58, and FIG. 24B is a cross-sectional view taken along a dash-dot line 24C-24D in FIG. 24A.

Figure 25A:
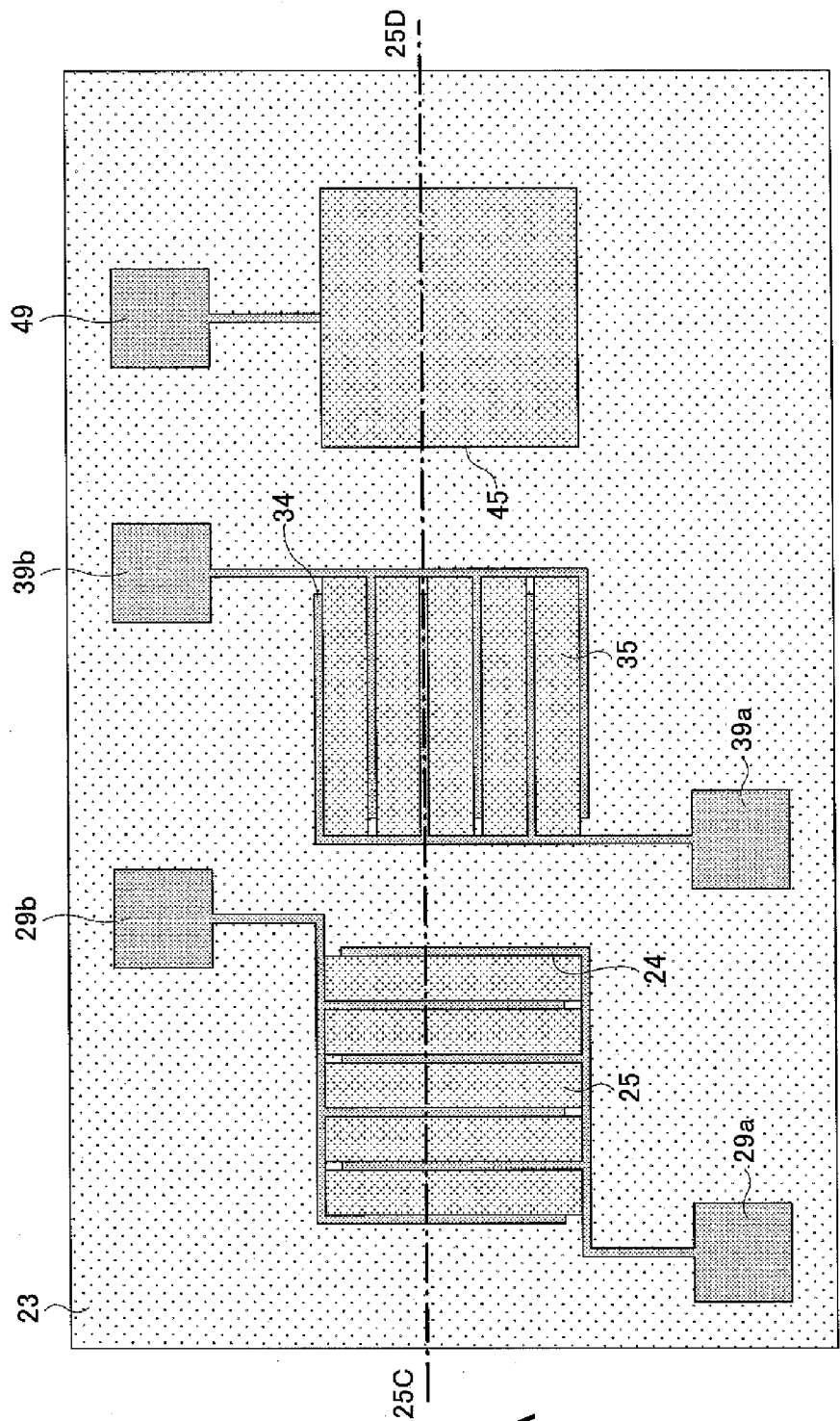
FIG. 25A is a top view illustrating the acceleration sensor according to the first embodiment in the manufacturing process.
Figure 25B:
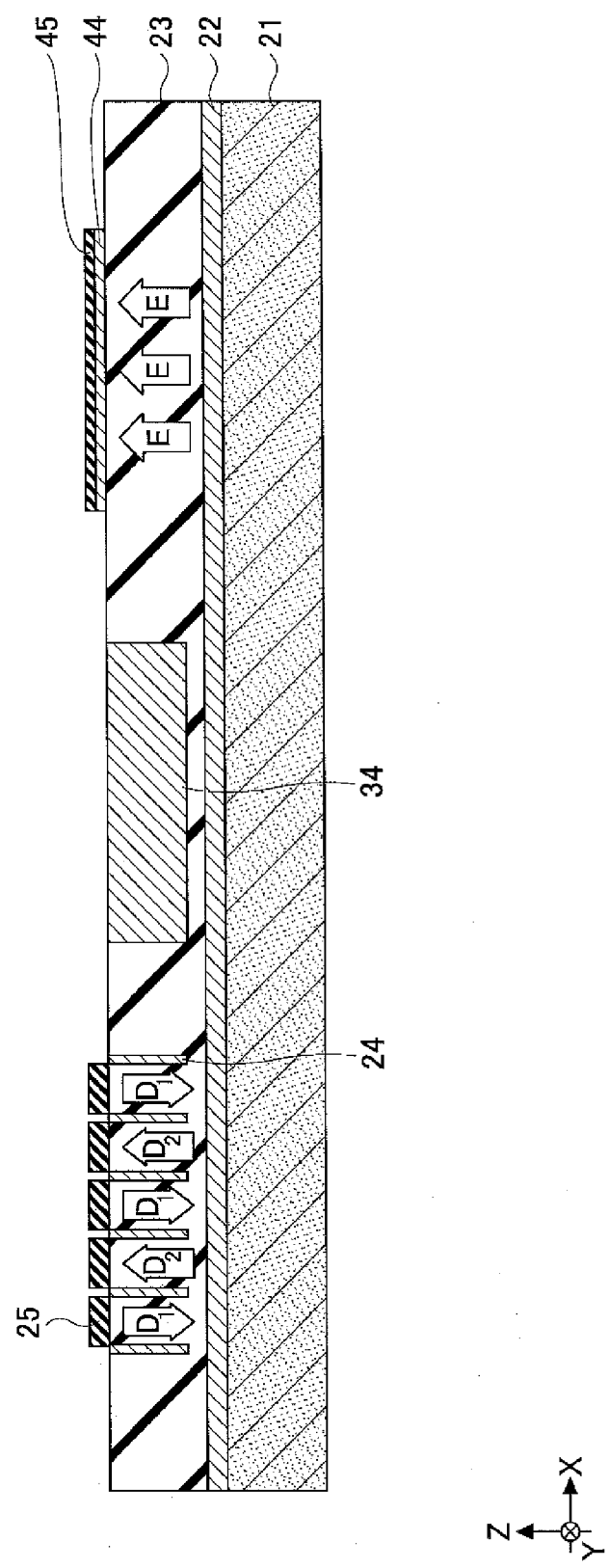
FIG. 25B is a cross-sectional view illustrating the acceleration sensor according to the first embodiment in the manufacturing process.

Next, the insulator layer 25 of the X-axis direction acceleration sensor 11, the insulator layer 35 of the Y-axis direction acceleration sensor 12 and the insulator layer 45 of the Z-axis direction acceleration sensor 13 are formed by dry etching such as RIE (reactive ion etching) as illustrated in FIGS. 25A and 25B. Specifically, the insulator layer 25 of the X-axis direction acceleration sensor 11, the insulator layer 35 of the Y-axis direction acceleration sensor 12 and the insulator layer 45 of the Z-axis direction acceleration sensor 13 are formed by dry etching such as RIE (reactive ion etching) by removing the insulator film 57 in areas of the ferroelectric layer 23 where the resist pattern 58 is not formed, and subsequently removing the resist pattern 58 utilizing the organic solvent or the like. Note that FIG. 25A is a top view illustrating a process of forming the insulator layer 25 of the X-axis direction acceleration sensor 11, the insulator layer 35 of the Y-axis direction acceleration sensor 12 and the insulator layer 45 of the Z-axis direction acceleration sensor 13, and FIG. 25B is a cross-sectional view taken along a dash-dot line 25C-25D in FIG. 25A.

Figure 26A:
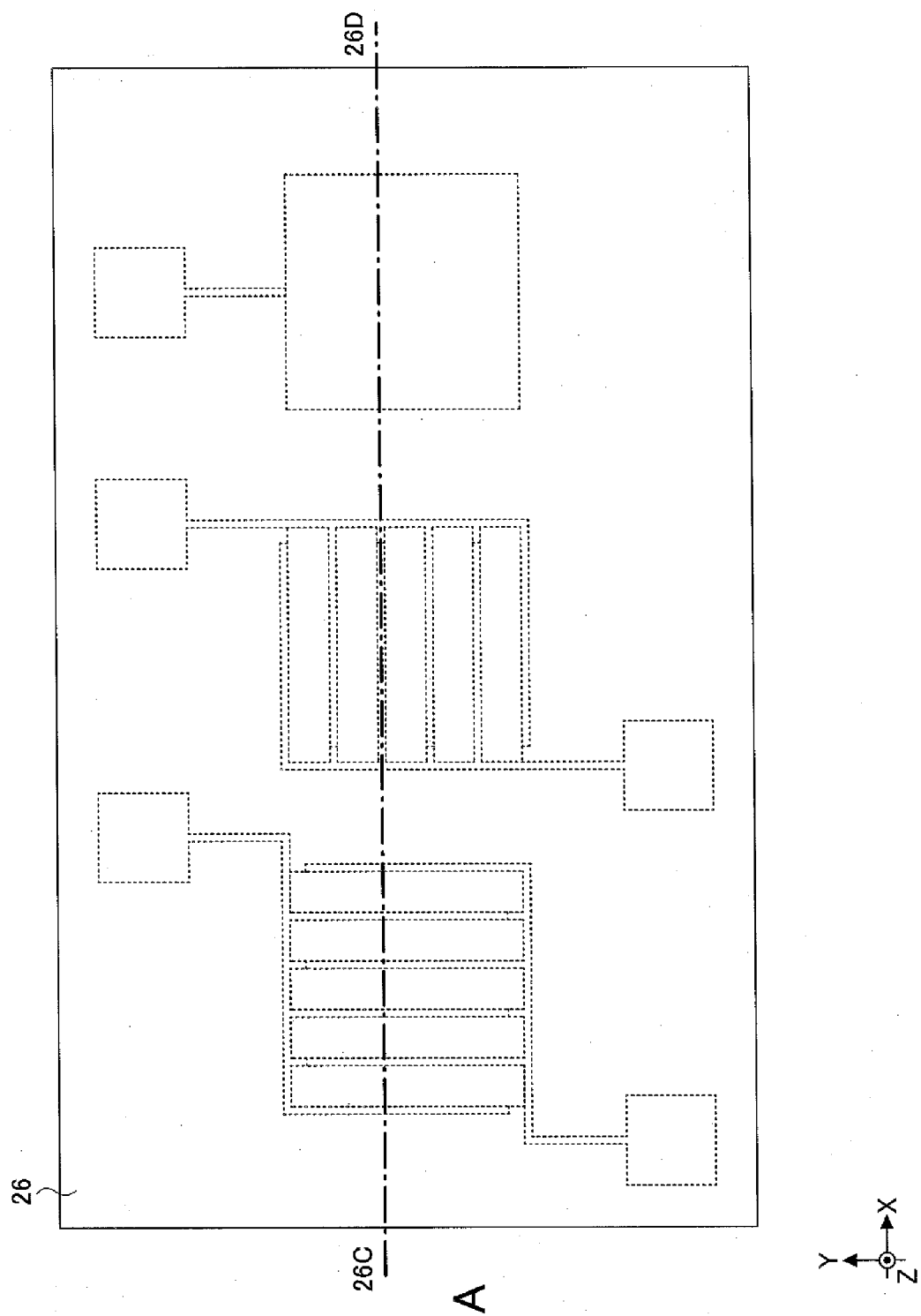
FIG. 26A is a top view illustrating the acceleration sensor according to the first embodiment in the manufacturing process.
Figure 26B:
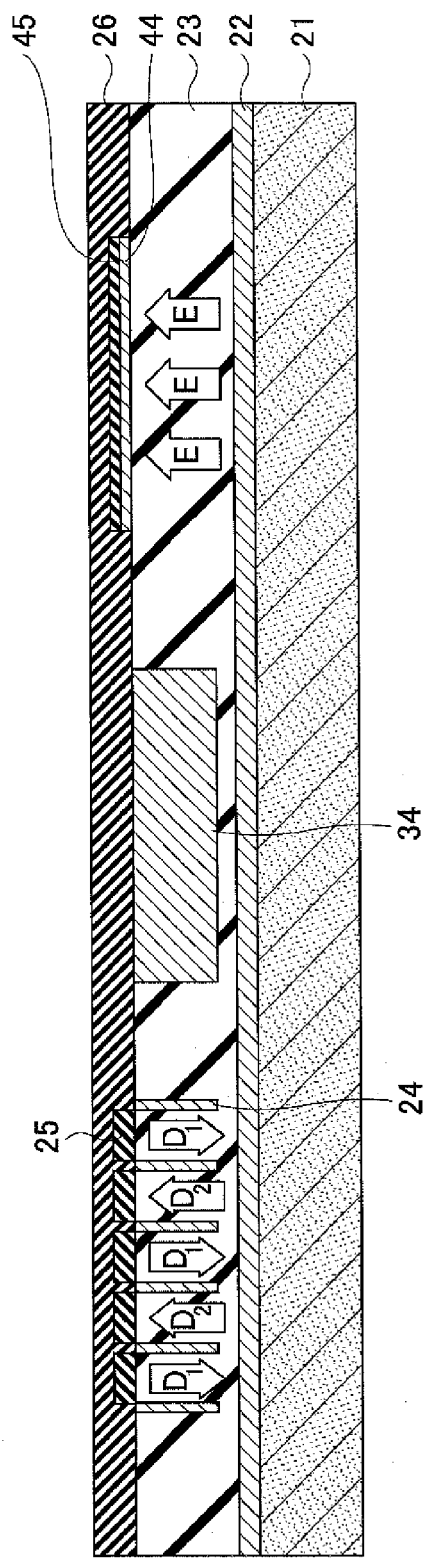
FIG. 26B is a cross-sectional view illustrating the acceleration sensor according to the first embodiment in the manufacturing process.

Next, a resin material layer 26 is formed on a surface of the ferroelectric layer 23, in the areas of which the insulator layers 25, 35 and 45 are formed as illustrated in FIGS. 26A and 26B. The resin material layer 26 may be formed of a material such as polyimide or polymethyl methacrylate. Note that FIG. 26A is a top view illustrating a process of forming the resin material layer 26, and FIG. 26B is a cross-sectional view taken along a dash-dot line 26C-26D in FIG. 26A.

Figure 27B:
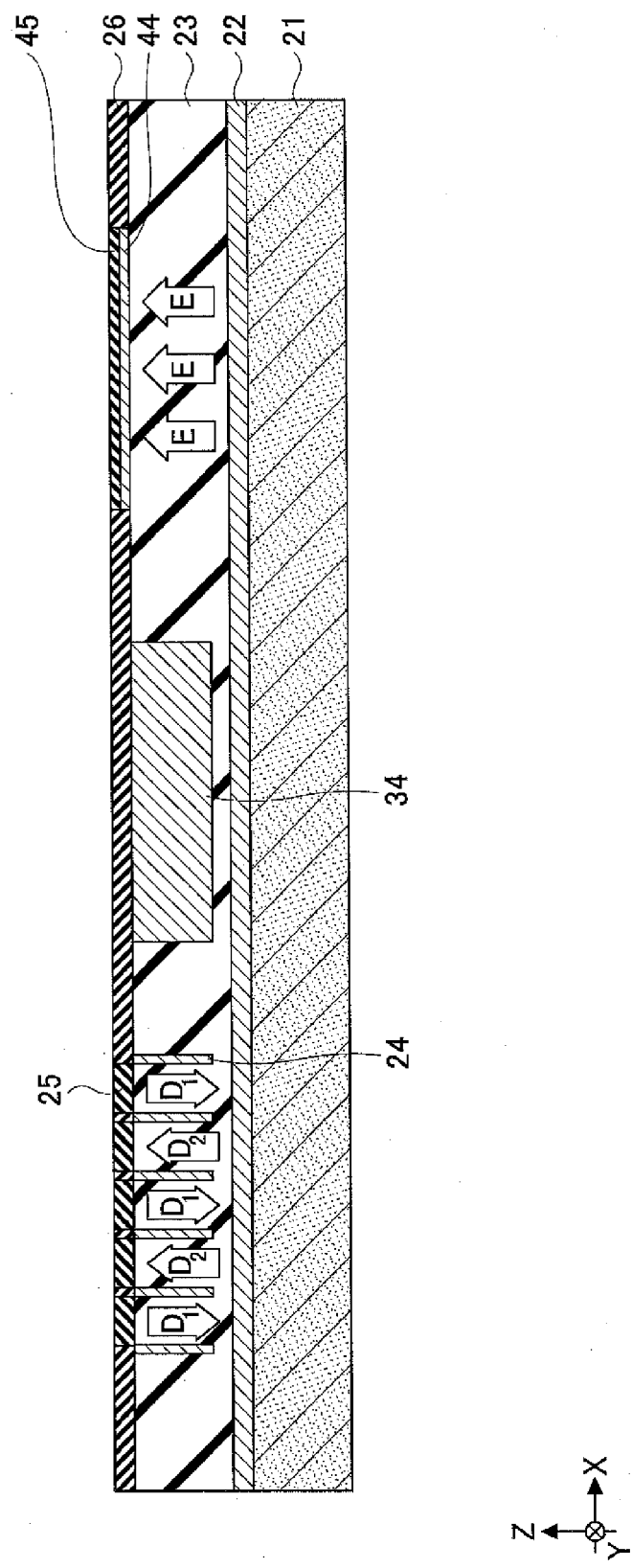
FIG. 27B is a cross-sectional view illustrating the acceleration sensor according to the first embodiment in the manufacturing process.

Next, the resin material layer 26 is removed until the surface of the insulator layer 25 of the X-axis direction acceleration sensor 11 and the surface of the insulator layer 35 of the Y-axis direction acceleration sensor 12 are exposed by polishing as illustrated in FIGS. 27A and 27B. The resin material layer 26 may be polished by chemical mechanical polishing (CMP) or the like. In this process, the surface of the insulator layer 45 of the Z-axis direction acceleration sensor 13 is also polished so that the surface of the insulator layer 45 is aligned with the surface of the insulator layer 25 of the X-axis direction acceleration sensor 11 and the surface of the insulator layer 35 of the Y-axis direction acceleration sensor 12. Note that FIG. 27A is a top view illustrating a process of polishing the resin material layer 26, and FIG. 27B is a cross-sectional view taken along a dash-dot line 27C-27D in FIG. 27A.

Figure 28B:
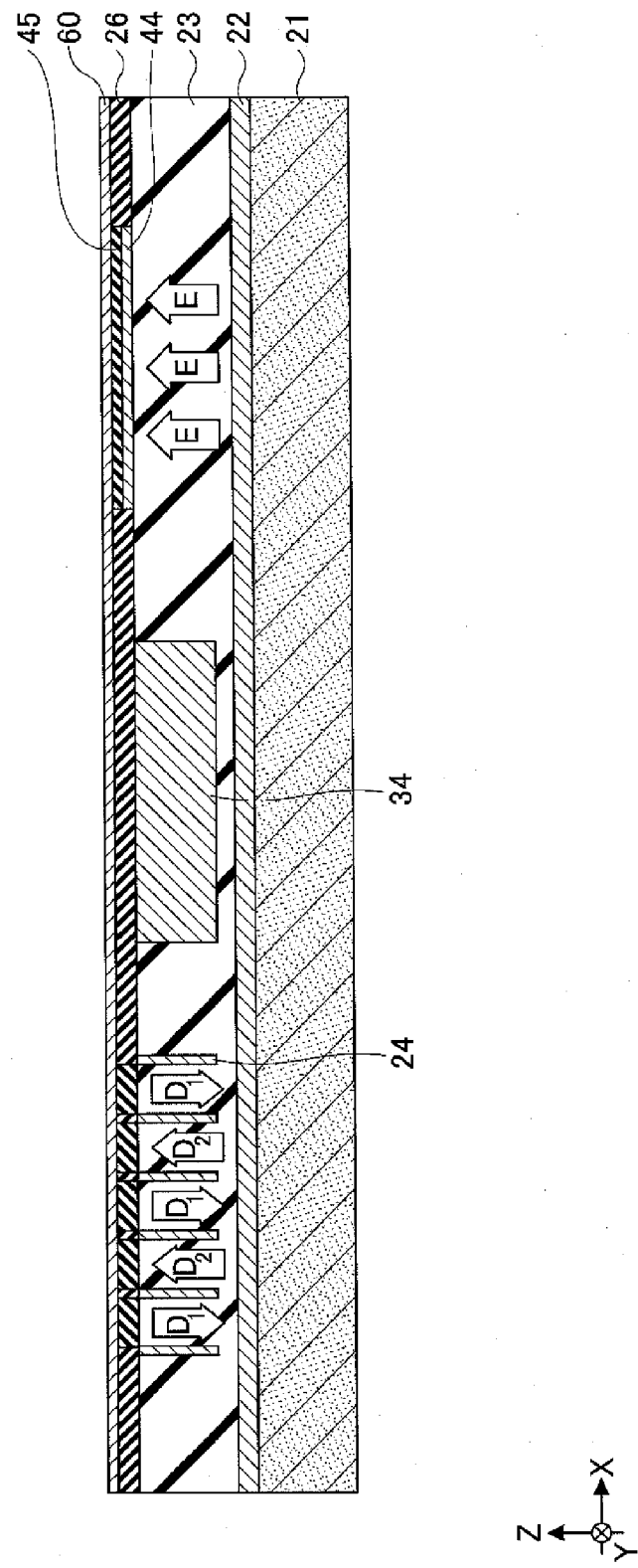
FIG. 28B is a cross-sectional view illustrating the acceleration sensor according to the first embodiment in the manufacturing process.

Next, a Ni film 60 is formed on the insulator layers 25, 35 and 45 and on the resin material layer 26 as illustrated in FIGS. 28A and 28B. The Ni film 60 is formed by sputtering. Note that FIG. 28A is a top view illustrating a process of forming the Ni film 60, and FIG. 28B is a cross-sectional view taken along a dash-dot line 28C-28D in FIG. 28A.

Figure 29B:
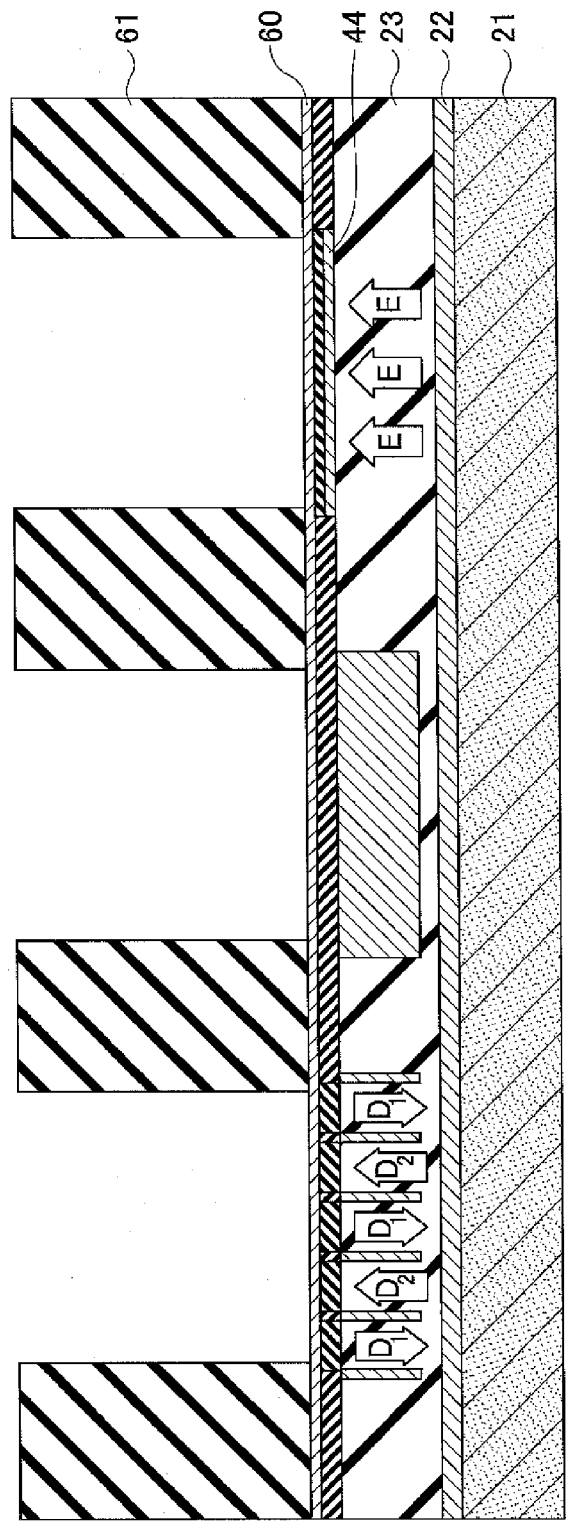
FIG. 29B is a cross-sectional view illustrating the acceleration sensor according to the first embodiment in the manufacturing process.

Next, a resist pattern 61 is formed on the Ni film 60 as illustrated in FIGS. 29A and 29B. Specifically, a photoresist is applied to the Ni film 60, and the applied photoresist is prebaked, and then exposed to light for performing the development utilizing the exposure device, thereby forming the resist pattern 61. Note that FIG. 29A is a top view illustrating a process of forming the resist pattern 61, and FIG. 29B is a cross-sectional view taken along a dash-dot line 29C-29D in FIG. 29A.

Figure 30A:
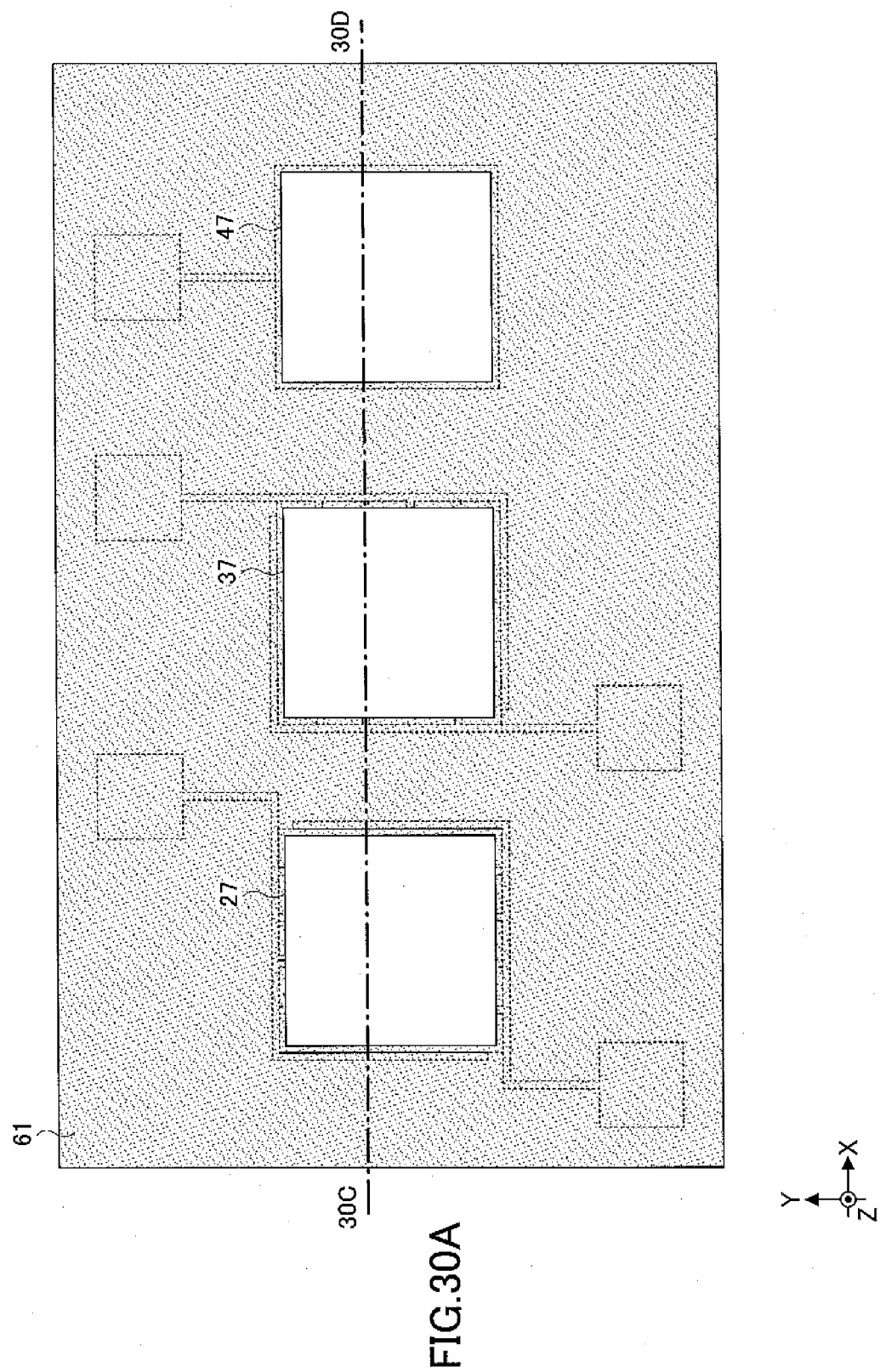
FIG. 30A is a top view illustrating the acceleration sensor according to the first embodiment in the manufacturing process.
Figure 30B:
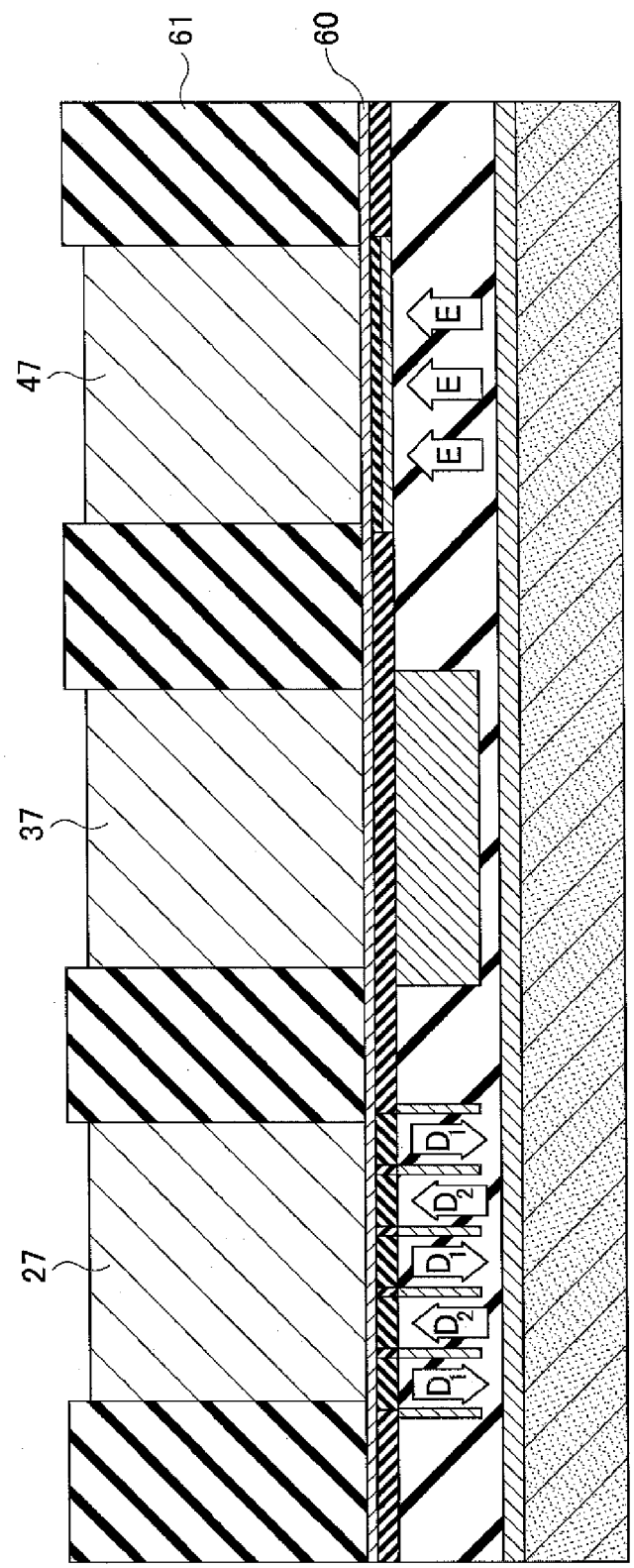
FIG. 30B is a cross-sectional view illustrating the acceleration sensor according to the first embodiment in the manufacturing process.

Next, weight parts 27, 37 and 47 are formed by Ni plating as illustrated in FIGS. 30A and 30B. The weight parts 27, 37 and 47 corresponding to the X-axis direction acceleration sensor 11, the Y-axis direction acceleration sensor 12 and the Z-axis direction acceleration sensor 13 are formed by Ni plating. Specifically, the weight parts 27, 37 and 47 are formed by electrolytic plating Ni in exposed areas of the Ni film 60, namely the areas of the Ni film 60 where the resist pattern 61 is not formed. Note that FIG. 30A is a top view illustrating a process of forming the weight parts 27, 37 and 47, and FIG. 30B is a cross-sectional view taken along a dash-dot line 30C-30D in FIG. 30A.

Figure 31B:
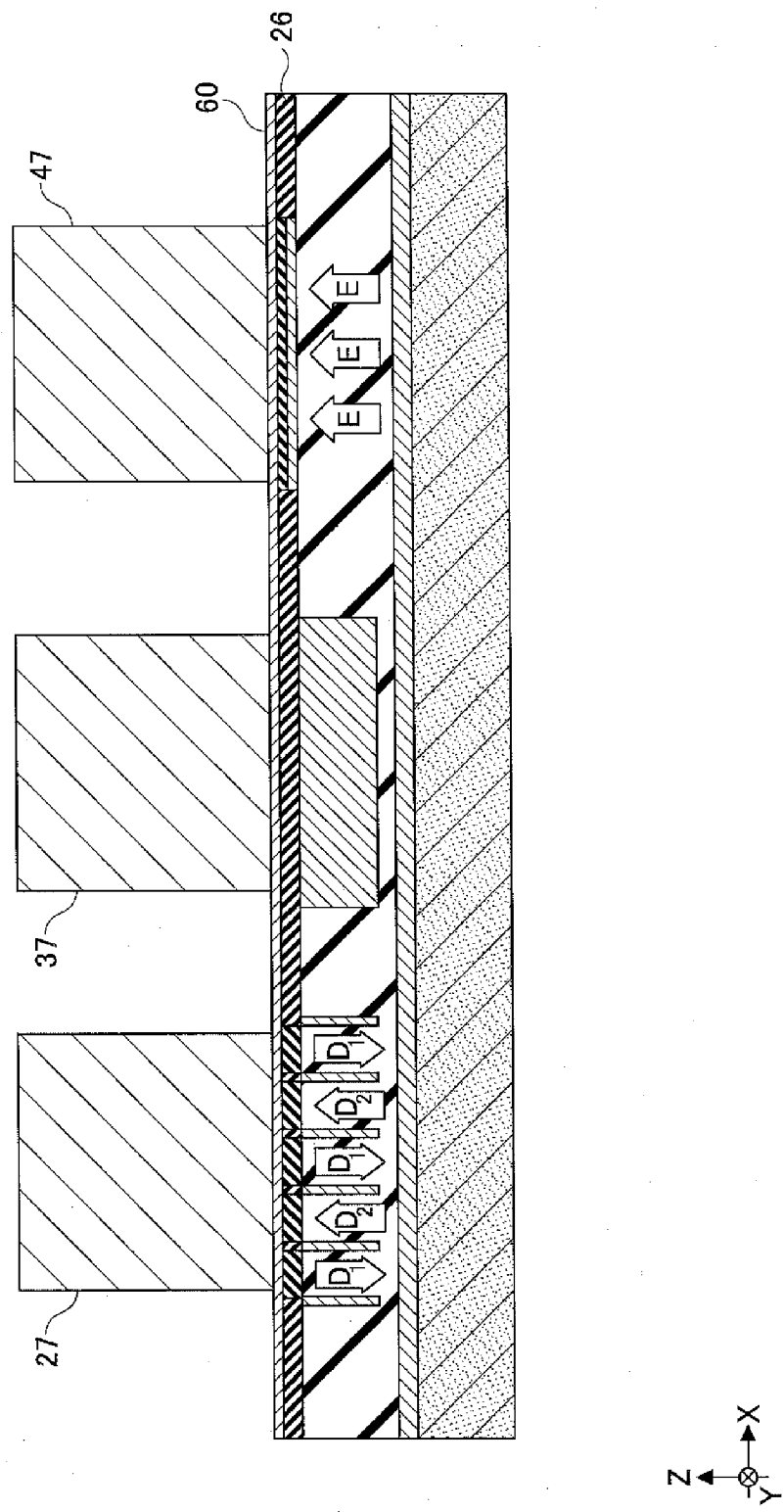
FIG. 31B is a cross-sectional view illustrating the acceleration sensor according to the first embodiment in the manufacturing process.

Next, the resist pattern 61 is removed as illustrated in FIGS. 31A and 31B. Note that FIG. 31A is a top view illustrating a process of removing the resist pattern 61, and FIG. 31B is a cross-sectional view taken along a dash-dot line 31C-31D in FIG. 31A.

Figure 32A:
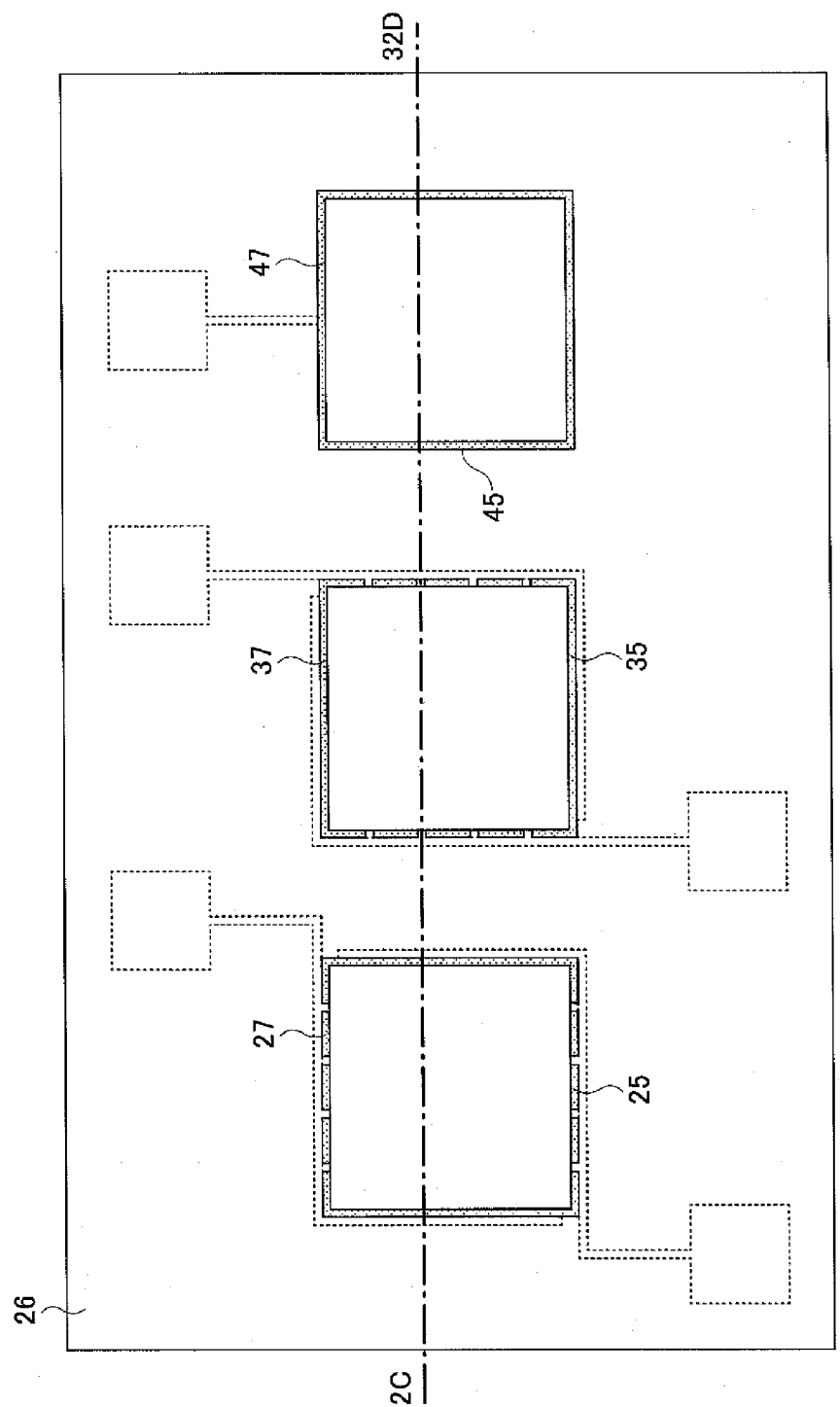
FIG. 32A is a top view illustrating the acceleration sensor according to the first embodiment in the manufacturing process.
Figure 32B:
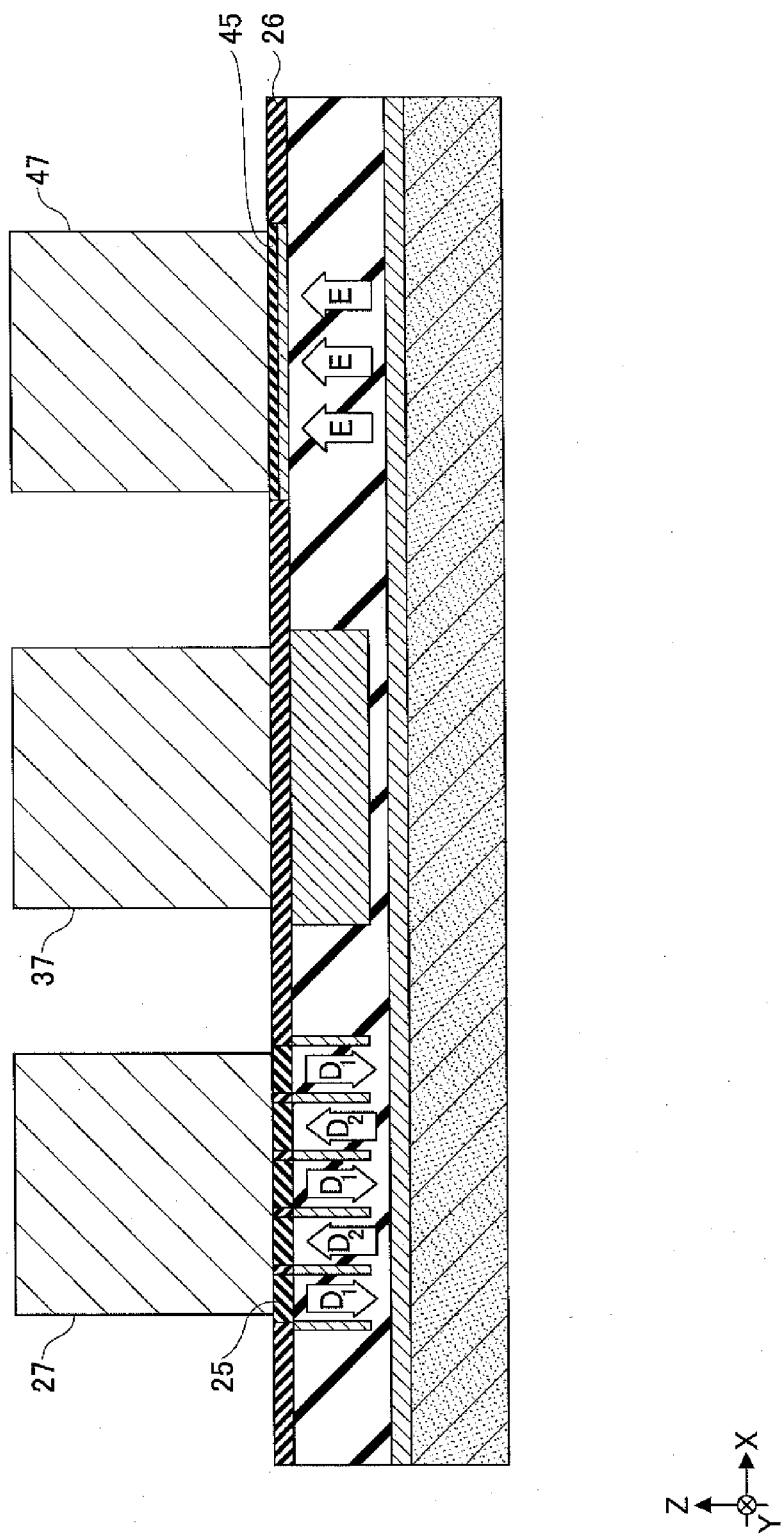
FIG. 32B is a cross-sectional view illustrating the acceleration sensor according to the first embodiment in the manufacturing process.

Next, the Ni film 60 is removed by dry etching such as RIE (reactive ion etching) from the area where the weight parts 27, 37 and 47 are not formed as illustrated in FIGS. 32A and 32B. In this process, the surfaces of the insulator layers 25, 35 and 45 and the surface of the resin material layer 26 are exposed. Note that FIG. 32A is a top view illustrating a process of removing the Ni film 60 by a wet etching, and FIG. 32B is a cross-sectional view taken along a dash-dot line 32C-32D in FIG. 32A.

Figure 33A:
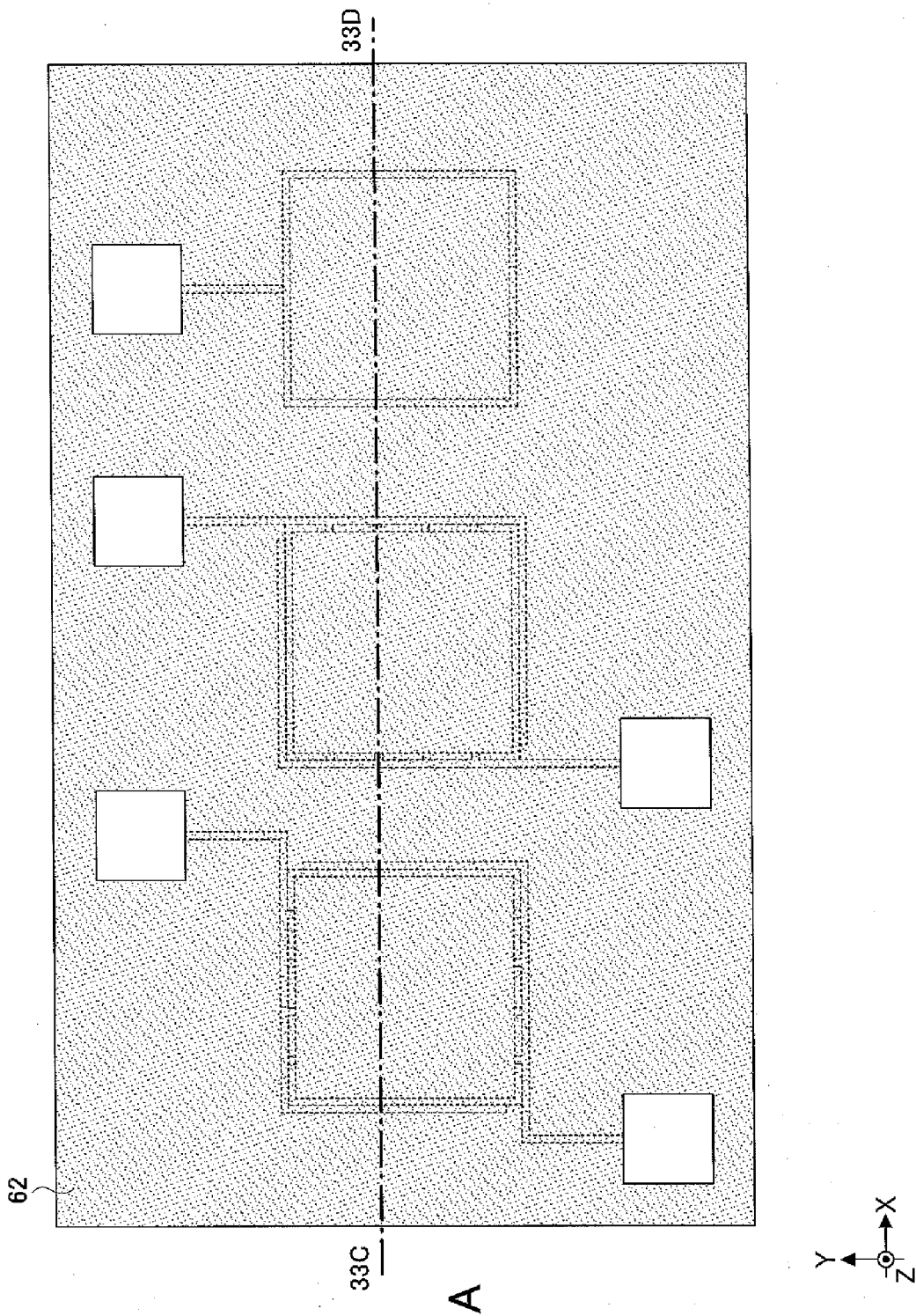
FIG. 33A is a top view illustrating the acceleration sensor according to the first embodiment in the manufacturing process.
Figure 33B:
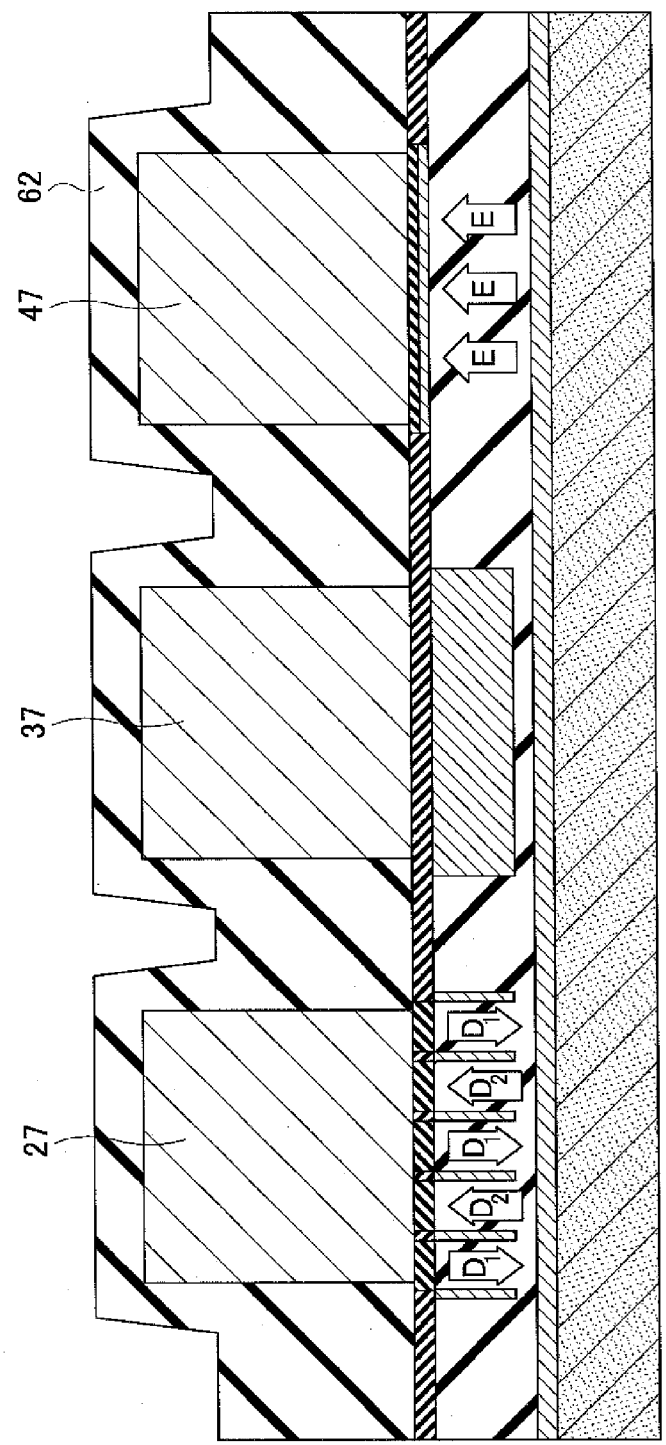
FIG. 33B is a cross-sectional view illustrating the acceleration sensor according to the first embodiment in the manufacturing process.

Next, a resist pattern 62 having openings above the electrode terminals 29a, 29b, 39a, 39b and 49 formed via the resin material layer 26 is formed as illustrated in FIGS. 33A and 33B. Specifically, a photoresist is applied, the applied phtoresist is prebaked and exposed to light for performing the development utilizing an exposure device, thereby forming the resist pattern 62 having the openings above the electrode terminals 29a, 29b, 39a, 39b and 49 formed via the resin material layer 26. Note that FIG. 33A is a top view illustrating a process of forming the resist pattern 62, and FIG. 33B is a cross-sectional view taken along a dash-dot line 33C-33D in FIG. 33A.

Figure 34A:
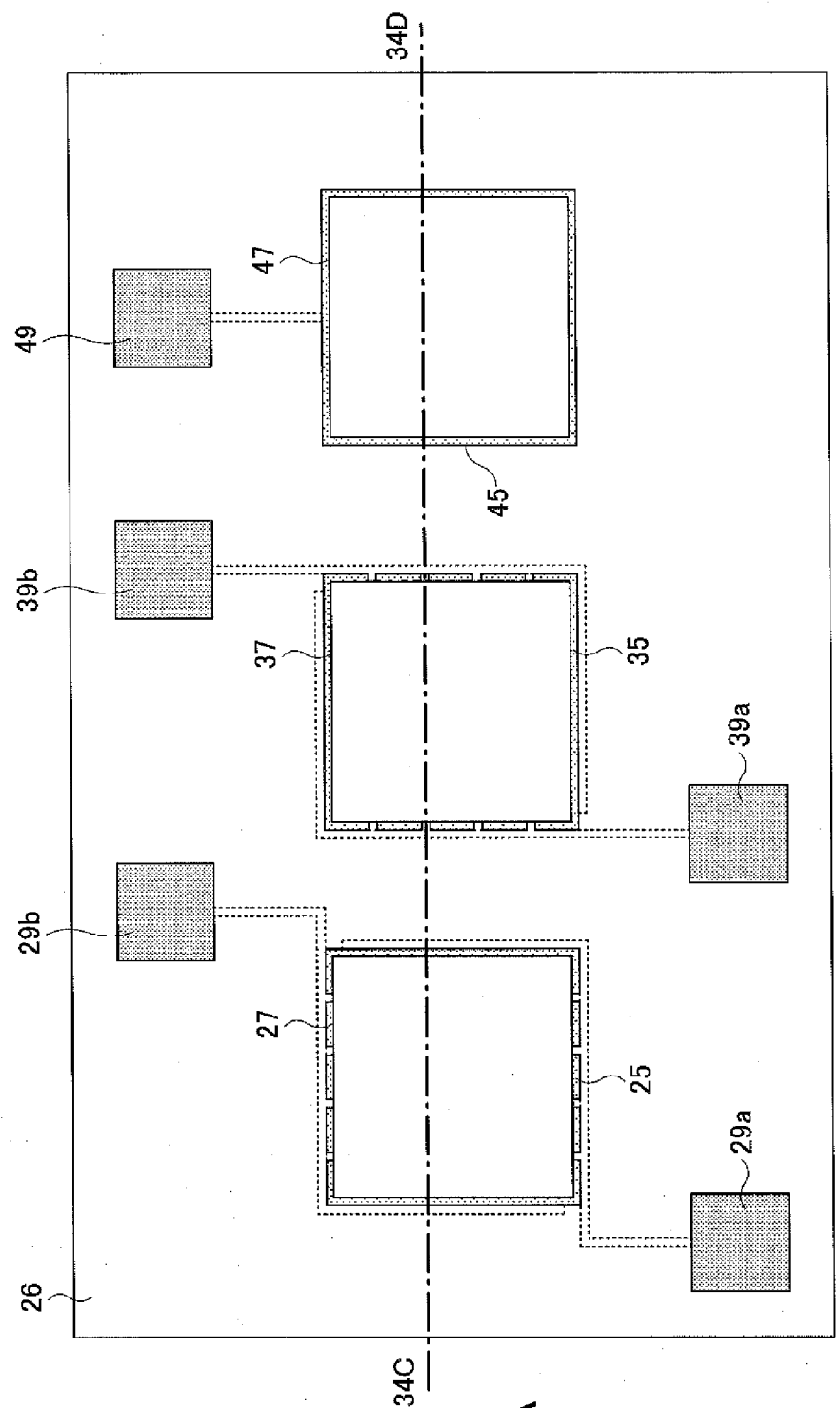
FIG. 34A is a top view illustrating the acceleration sensor according to the first embodiment in the manufacturing process.
Figure 34B:
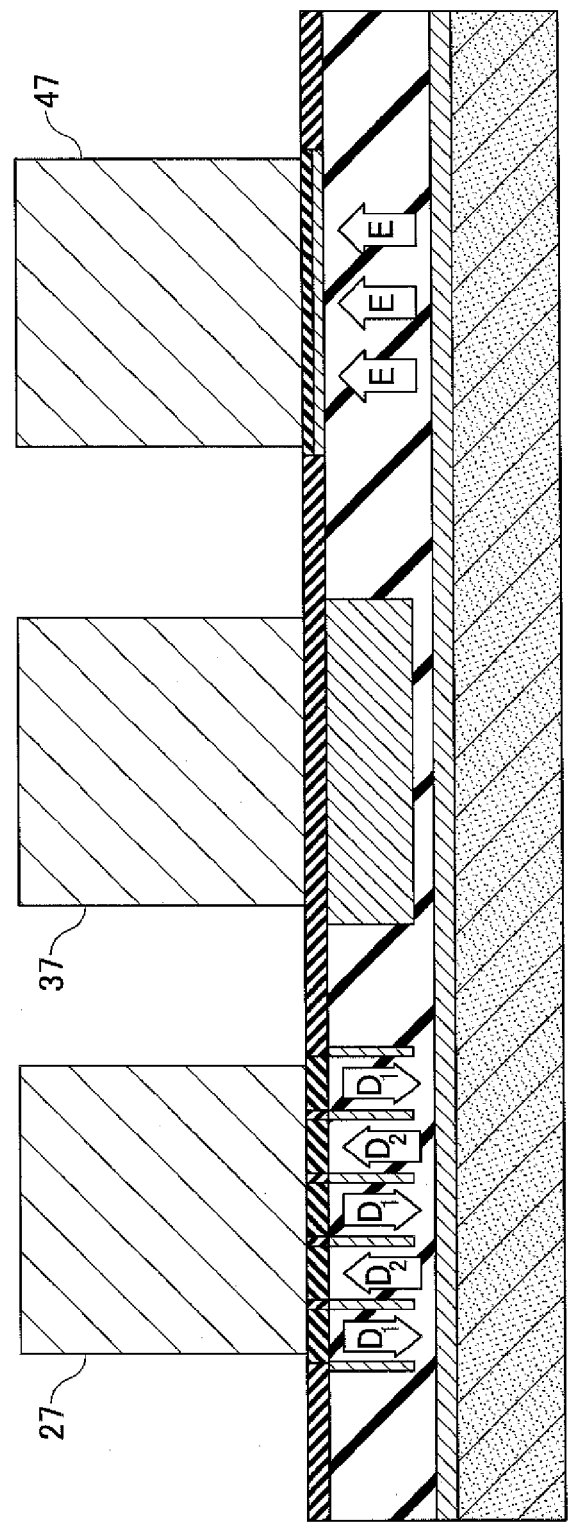
FIG. 34B is a cross-sectional view illustrating the acceleration sensor according to the first embodiment in the manufacturing process.

Next, surfaces of the electrode terminals 29a, 29b, 39a, 39b and 49 are exposed by removing the resin material layer 26 in areas corresponding to the openings of the resist pattern 62 as illustrated in FIGS. 34A and 34B. Thereafter, the resist pattern 62 is removed with an organic solvent, or the like. Note that FIG. 34A is a top view illustrating a process of exposing the surfaces of the electrode terminals 29a, 29b, 39a, 39b and 49, and FIG. 34B is a cross-sectional view taken along a dash-dot line 34C-34D in FIG. 34A.

Figure 35A:
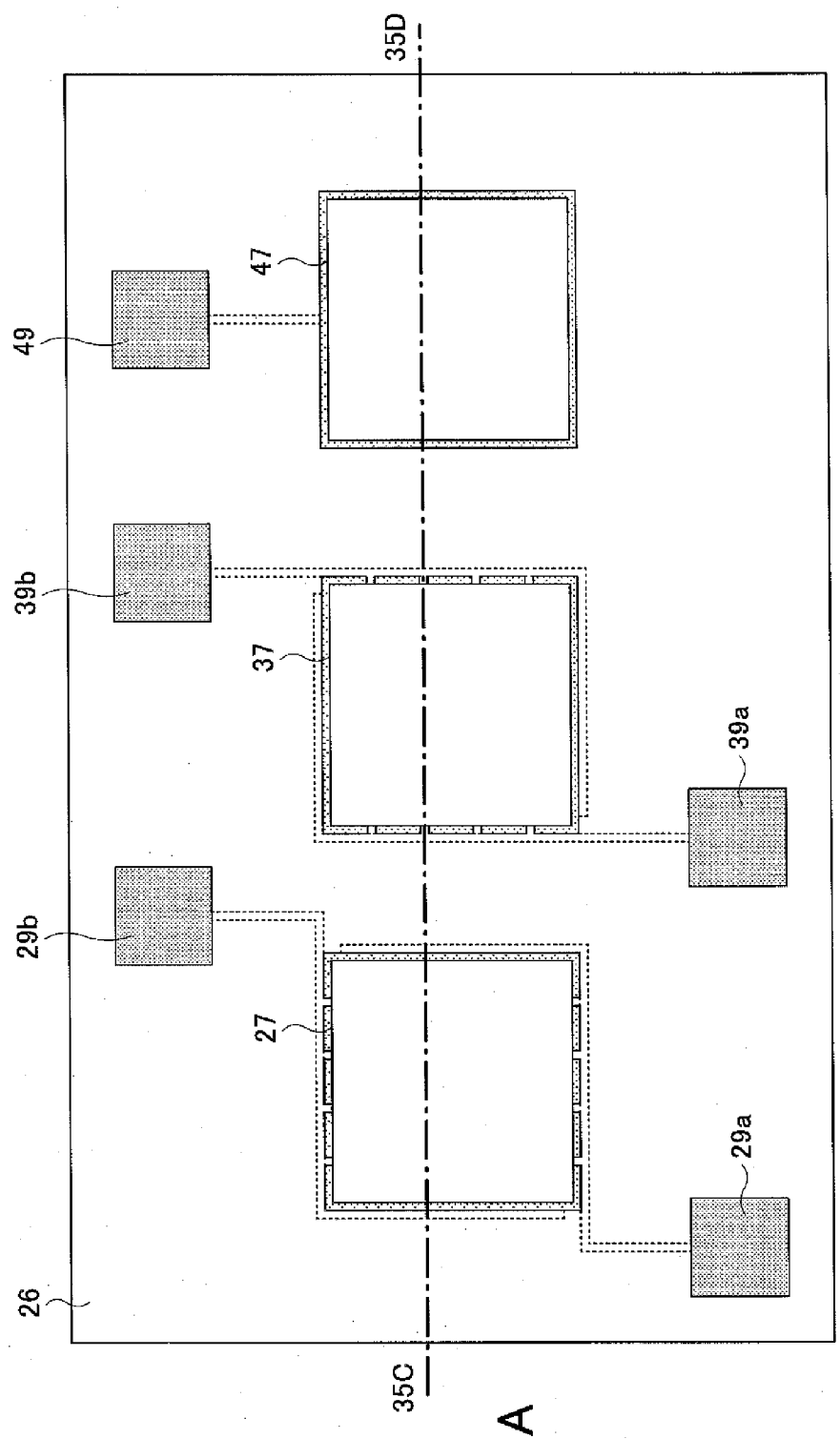
FIG. 35A is a top view illustrating the acceleration sensor according to the first embodiment in the manufacturing process.

Next, a resist pattern 63 is formed on a rear-surface of the silicon substrate 21 as illustrated in FIGS. 35A and 35B. The resist pattern 63 includes an opening 64 in an area of the silicon substrate 21 where the Z-axis direction acceleration sensor 13 is formed. Specifically, a photoresist is applied to a rear-surface of the silicon substrate 21, and the applied photoresist is prebaked, and then exposed to light for performing the development utilizing the exposure device, thereby forming the resist pattern 63. Note that FIG. 35A is a top view illustrating a process of forming the resist pattern 63, and FIG. 35B is a cross-sectional view taken along a dash-dot line 35C-35D in FIG. 35A.

Figure 36A:
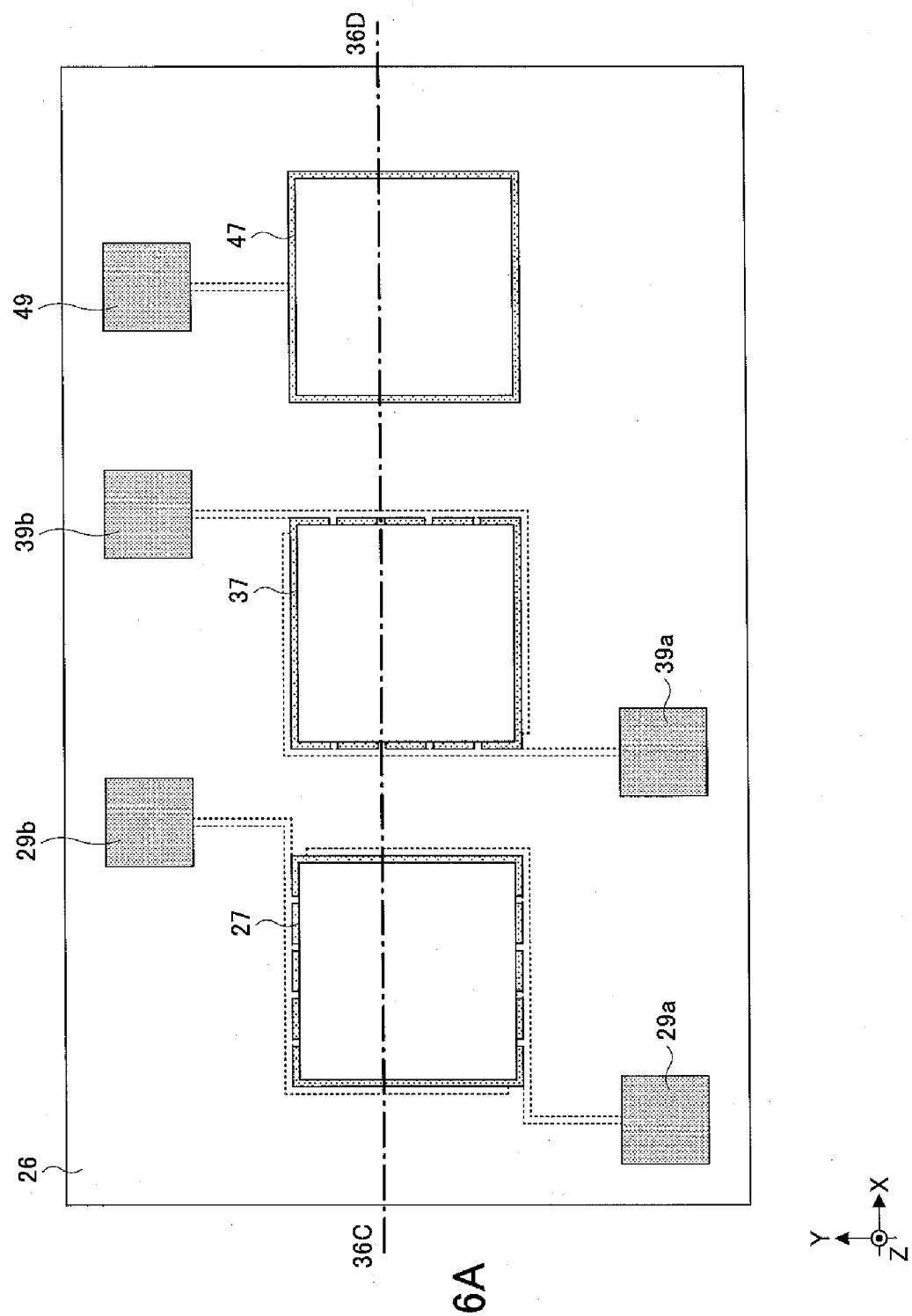
FIG. 36A is a top view illustrating the acceleration sensor according to the first embodiment in the manufacturing process.
Figure 36B:
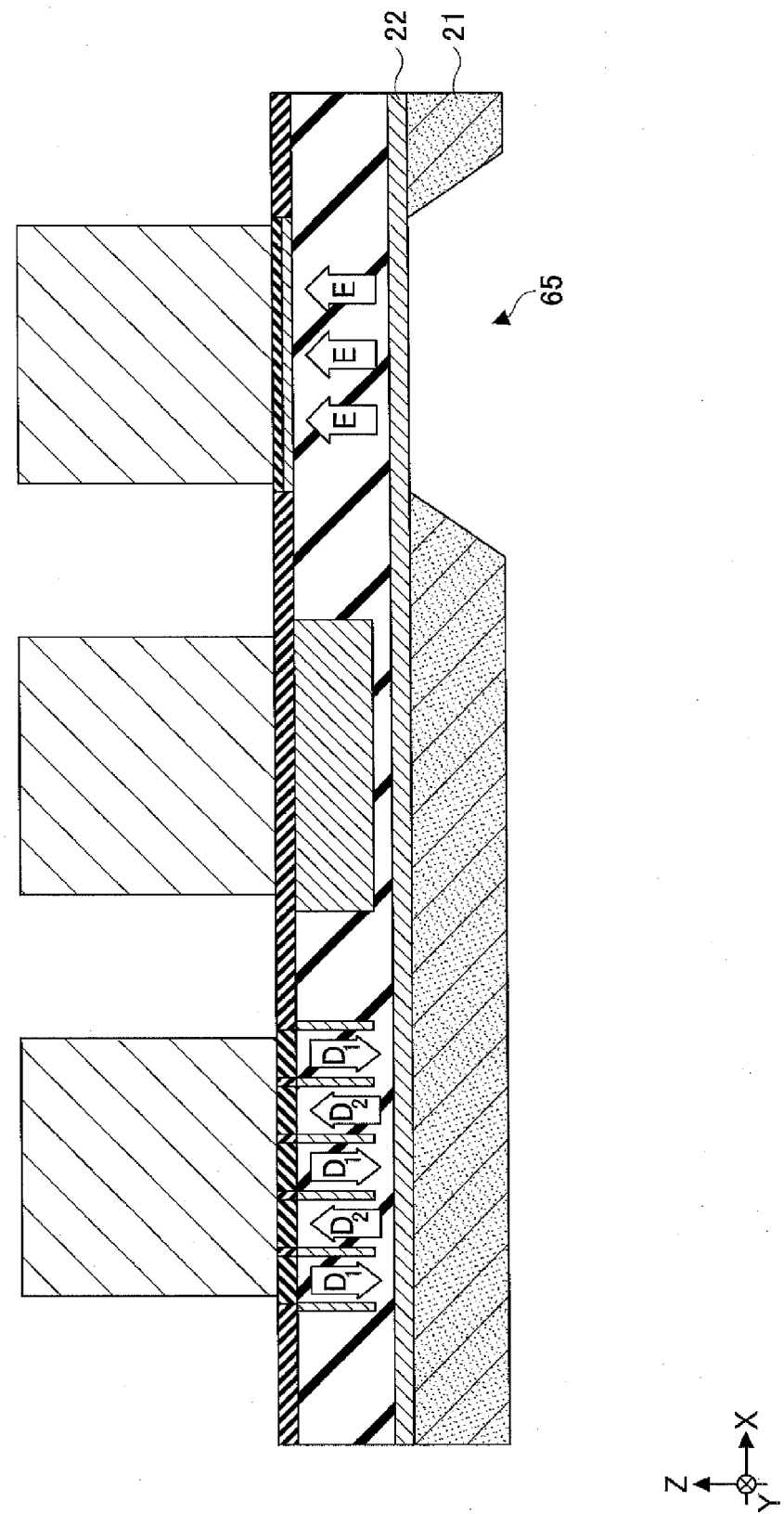
FIG. 36B is a cross-sectional view illustrating the acceleration sensor according to the first embodiment in the manufacturing process.

Next, a part of the silicon substrate 21 corresponding to the opening 64 (see FIG. 35B) of the resist pattern 63 is removed by wet etching from a rear side of the silicon substrate 63 as illustrated in FIGS. 36A and 36B. In this process, the part of the silicon substrate 21 is etched by using potassium hydroxide (KOH) as an etchant until a surface of the lower electrode 22 is exposed. As a result, an opening area 65 is formed in the silicon substrate 21. Thereafter, the resist pattern 63 is removed with an organic solvent, or the like. Note that FIG. 36A is a top view illustrating a process of removing the part of the silicon substrate 21 and the resist pattern 63, and FIG. 36B is a cross-sectional view taken along a dash-dot line 36C-36D in FIG. 36A.

Figure 37A:
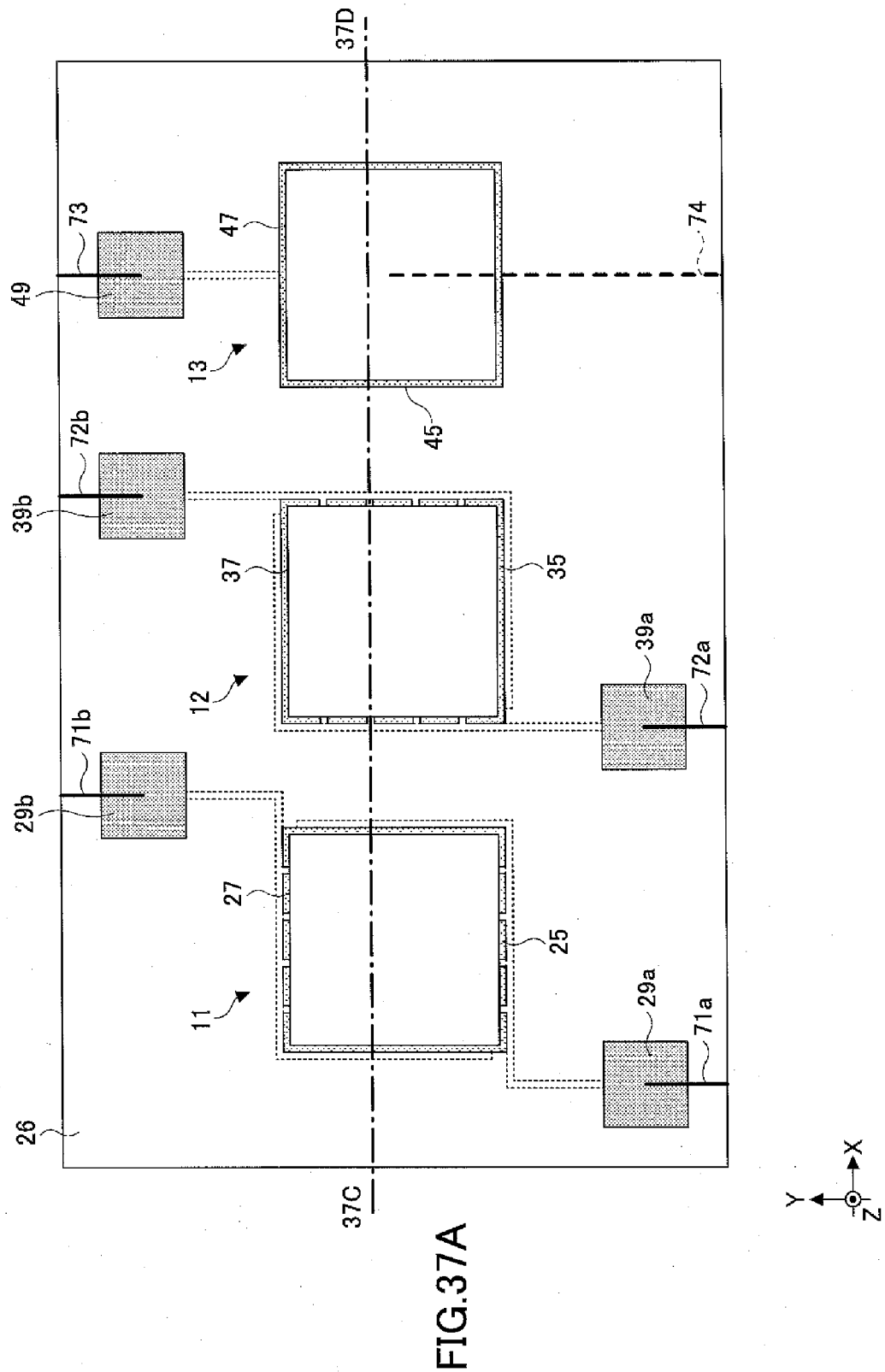
FIG. 37A is a top view illustrating the acceleration sensor according to the first embodiment in the manufacturing process.
Figure 37B:
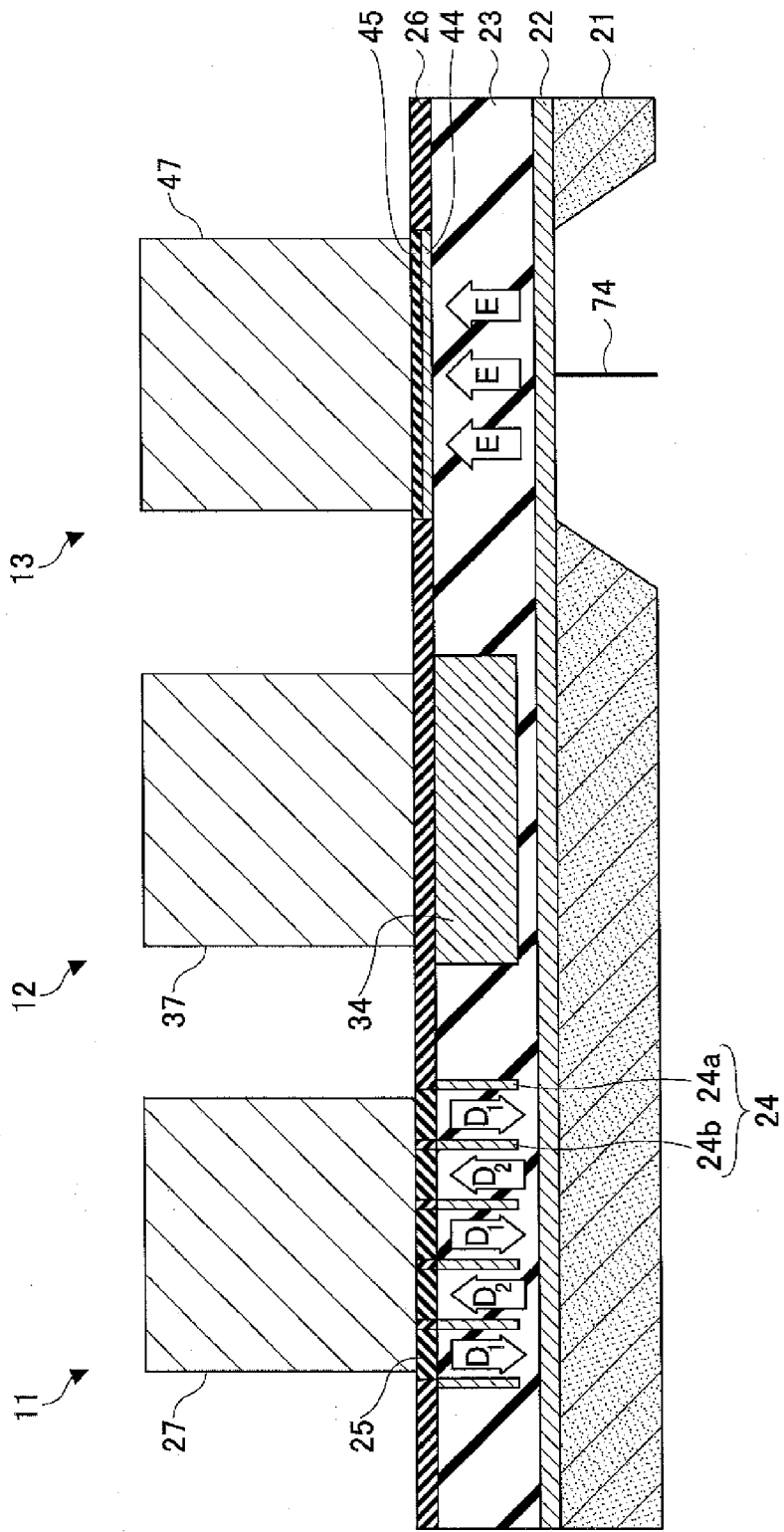
FIG. 37B is a cross-sectional view illustrating the acceleration sensor according to the first embodiment in the manufacturing process.

Next, wires 71a, 71b, 72a, 72b, 73 and 74 for connecting the electrode terminals 29a, 29b, 39a, 39b and 49, and the lower electrode 22 exposed from the opening area 65 with a not-illustrated charge-sensitive amplifier or booster circuit are formed as illustrated in FIGS. 37A and 37B. Specifically, the following wires are formed; the wire 71a for connecting the electrode terminal 29a with the charge-sensitive amplifier or booster circuit, the wire 71*b* for connecting the electrode terminal 29*b* with the charge-sensitive amplifier or booster circuit, the wire 72*a* for connecting the electrode terminal 39*a* with the charge-sensitive amplifier or booster circuit, the wire 72*b* for connecting the electrode terminal 39*b* with the charge-sensitive amplifier or booster circuit, the wire 73 for connecting the electrode terminal 49 with the charge-sensitive amplifier or booster circuit, and the wire 74 for connecting the lower electrode 22 with the charge-sensitive amplifier or booster circuit. Note that FIG. 37A is a top view illustrating a process of forming the wires 71*a*, 71*b*, 72*a*, 72*b*, 73 and 74, and FIG. 37B is a cross-sectional view taken along a dash-dot line 37C-37D in FIG. 37A. The acceleration sensor according to the first embodiment is manufactured in this fashion.

The acceleration sensor according to the first embodiment is configured to detect the acceleration in the X-axis direction by measuring the potential difference between the electrode terminal 29*a* and the electrode terminal 29*b* via the wires 71*a* and 71*b*. Further, the acceleration sensor according to the first embodiment is configured to detect the acceleration in the Y-axis direction by measuring the potential difference between the electrode terminal 39*a* and the electrode terminal 39*b* via the wires 72*a* and 72*b*. Moreover, the acceleration sensor according to the first embodiment is configured to detect the acceleration in the Z-axis direction by measuring the potential difference between the electrode terminal 49 and the lower electrode 22 via the wires 73 and 74.

[Second Embodiment]

Next, an acceleration sensor according to a second embodiment is described. The acceleration sensor according to the second embodiment includes an X-axis direction acceleration sensor, a Y-axis direction acceleration sensor, and a Z-axis direction acceleration sensor. With this configuration, the acceleration sensor according to the second embodiment is capable of detecting the acceleration in the X-axis direction, the Y-axis direction and the Z-axis direction; that is, the acceleration sensor according to the second embodiment is capable of detecting acceleration in three dimensions.

Figure 38:
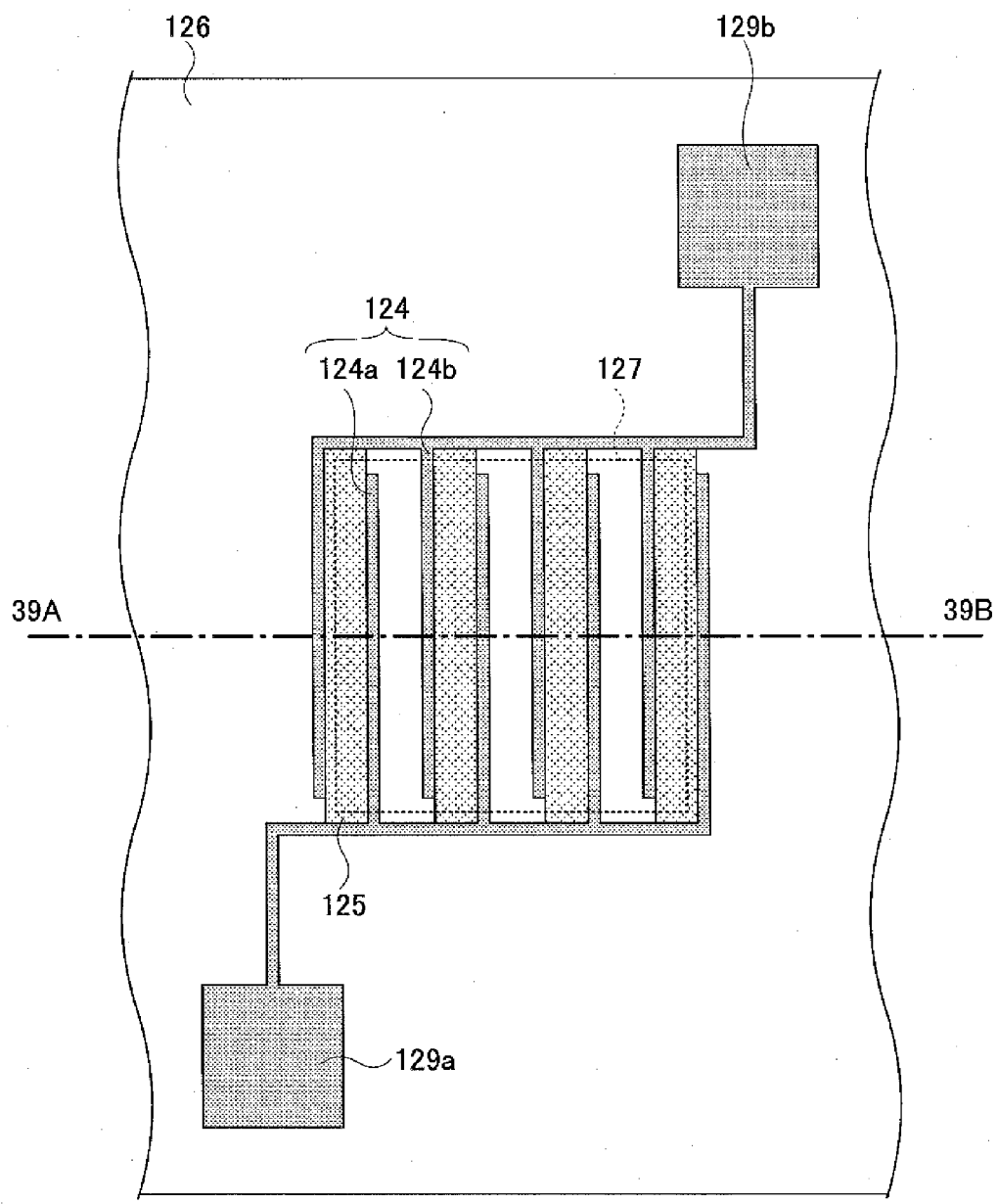
FIG. 38 is a top transparent view illustrating a major part of an acceleration sensor according to a second embodiment.
Figure 39:
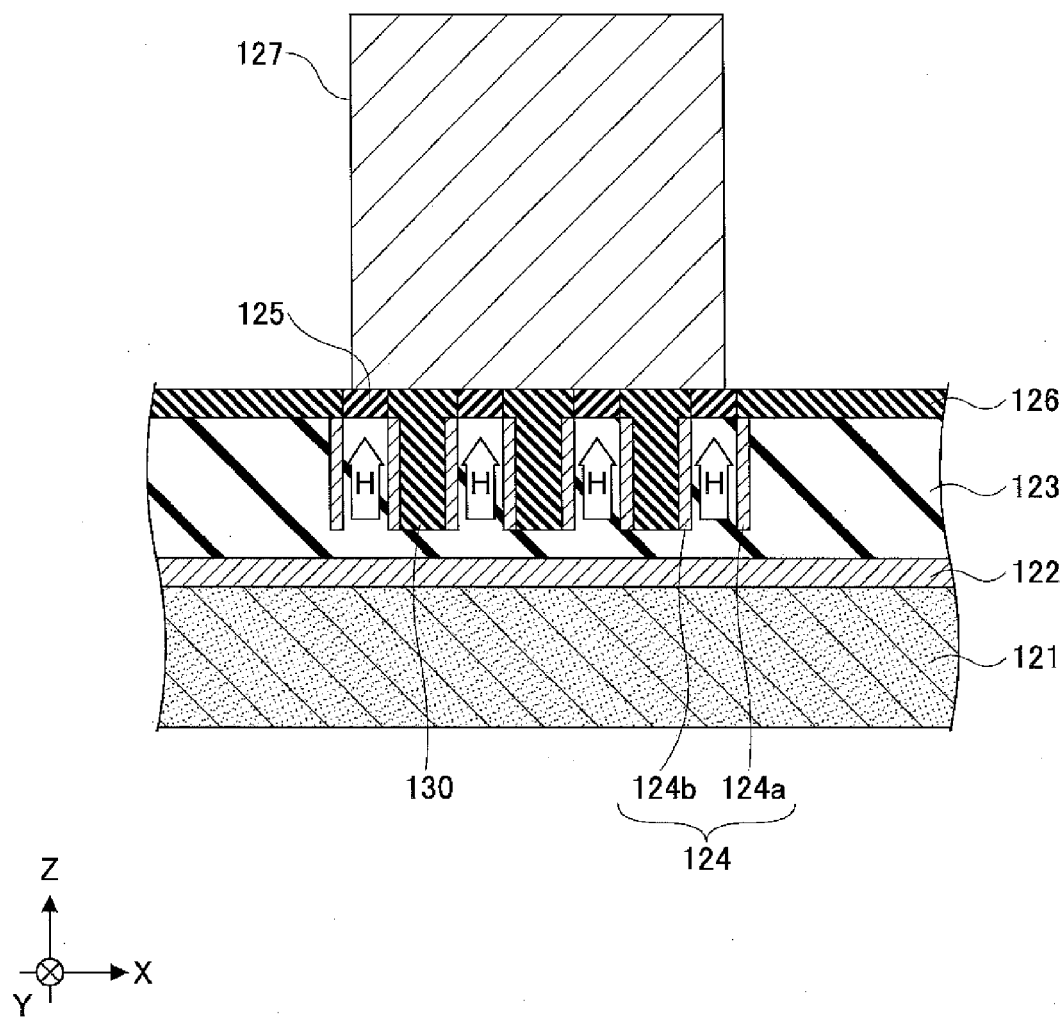
FIG. 39 is a cross-sectional view illustrating the major part of the acceleration sensor according to the second embodiment.

The X-axis direction acceleration sensor in the acceleration sensor according to the second embodiment is described with reference to FIGS. 38 and 39. Note that the Z-axis direction acceleration sensor utilized in the acceleration sensor according to the second embodiment is similar to the Z-axis direction acceleration sensor utilized in the acceleration sensor according to the first embodiment. FIG. 39 is a cross-sectional view taken along a dash-dot line 39A-39B in FIG. 38.

The X-axis direction acceleration sensor in the acceleration sensor according to the second embodiment includes a lower electrode 122 and a ferroelectric layer 123 serving as a piezoelectric layer formed on a silicon substrate 121, in which a sensing electrode 124 is formed inside the ferroelectric layer 123.

The sensing electrode 124 is formed of two comb-shaped electrodes 124*a* and 124*b* that are formed in an area in which the X-axis direction acceleration sensor is formed. Teeth of the comb-shaped electrode 24*a* and teeth of the comb-shaped electrode 24*b* are alternately arranged such that the teeth of the comb-shaped electrode 24*a* interpose between the corresponding adjacent teeth of the comb-shaped electrode 24*b*. The comb-shaped electrodes 124*a* and 124*b* forming the sensing electrode 124 are connected to respective electrode terminals 129*a* and 129*b*. More specifically, the comb-shaped electrodes 124*a* are connected to the electrode terminal 129*a* via an extracting electrode and the comb-shaped electrodes 124*b* are connected to the electrode terminal 129*b* via an extracting electrode.

Further, in the acceleration sensor according to the first embodiment, the ferroelectric layer 23 resides in the areas between the alternately arranged teeth of the comb-shaped electrodes 24*a* and 24*b*; however, in the acceleration sensor according to the second embodiment, the ferroelectric layer 123 resides in every other area between the alternately arranged teeth of the comb-shaped electrodes 124*a* and 124*b*, and a resin material layer 130 is formed in every other area between the alternately arranged teeth of the comb-shaped electrodes 124*a* and 124*b* where the ferroelectric layer 23 is not formed. Note that the ferroelectric layer 123 formed between the comb-shaped electrodes 124*a* and 124*b* is polarized along the directions indicated by thick arrows H.

Further, an insulator layer 125 is formed on the ferroelectric layer 123 interposing between the comb-shaped electrodes 124*a* and 124*b* in the X-axis direction acceleration sensor, and a weight part 127 is formed on the insulator layer 125 on the ferroelectric layer 123. Note that a resin material layer 126 is formed on the sensing electrodes 124, and also in areas of the ferroelectric layer 123 where the insulator layer 125 is not formed.

Further, the acceleration sensor according to the second embodiment includes the Y-axis direction acceleration sensor having a configuration similar to that of the X-axis direction acceleration sensor. The Y-axis direction acceleration sensor is arranged in a direction 90 degrees differing from the direction in which the X-axis direction acceleration sensor is arranged. Specifically, the direction in which the respective teeth of the comb-shaped electrodes 124*a* and 124*b* formed in the X-axis direction acceleration sensor extend and the direction in which the respective teeth of the comb-shaped electrodes formed in the Y-axis direction acceleration sensor extend may differ from each other by approximately 90 degrees. Thus, the teeth of the comb-shaped electrodes 124*a* and 124*b* formed in the X-axis direction acceleration sensor extend in the Y-axis direction perpendicular to the X-axis direction. The teeth of the comb-shaped electrodes formed in the Y-axis direction acceleration sensor extend in the X-axis direction perpendicular to the Y-axis direction.

In the acceleration sensor according to the second embodiment, the polarization directions in the ferroelectric layer 23 interposing between the teeth of the comb-shaped electrodes 124*a* and 124*b* are aligned in one direction. Accordingly, the polarization process may be simplified and the manufacturing process for forming the upper polarization electrode to induce polarization may also be simplified. Thus, the acceleration sensor according to the second embodiment includes the high sensitivity, and the acceleration sensor having the high sensitivity may be manufactured at low cost.

Note that the configuration and the fabrication method of the acceleration sensor according to the second embodiment other than those described above are similar to those of the acceleration sensor according to the first embodiment.

[Third Embodiment]

Next, an acceleration sensor according to a third embodiment is described. The acceleration sensor according to the third embodiment includes an X-axis direction acceleration sensor, a Y-axis direction acceleration sensor, and a Z-axis direction acceleration sensor. Since the acceleration sensor according to the third embodiment has the above configuration, the acceleration sensor according to the third embodiment is capable of detecting the acceleration in the X-axis direction, the Y-axis direction and the Z-axis direction. That is, the acceleration sensor according to the third embodiment is capable of detecting acceleration in three-dimensional directions.

Figure 40:
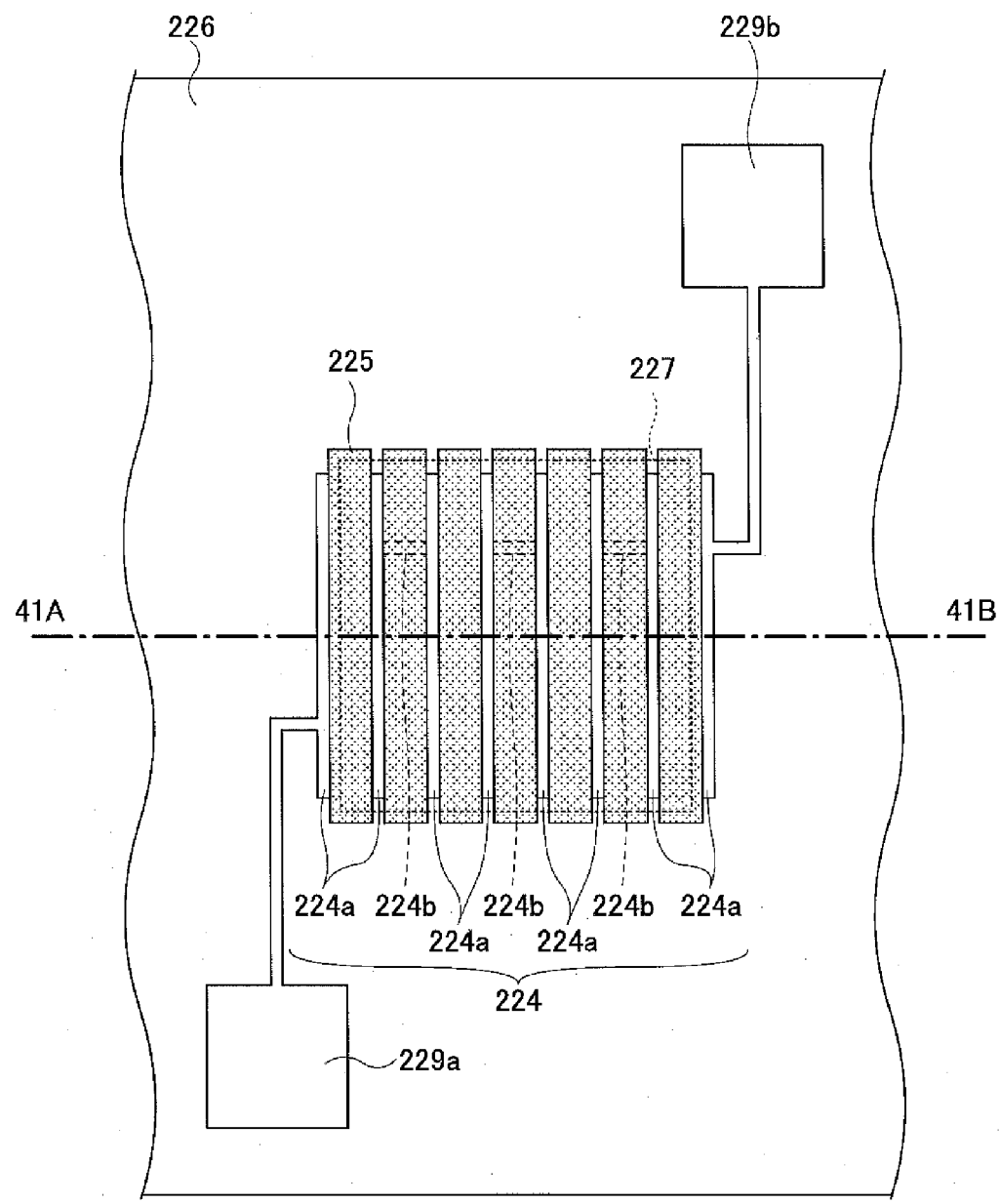
FIG. 40 is a top transparent view illustrating a major part of an acceleration sensor according to a third embodiment.
Figure 41:
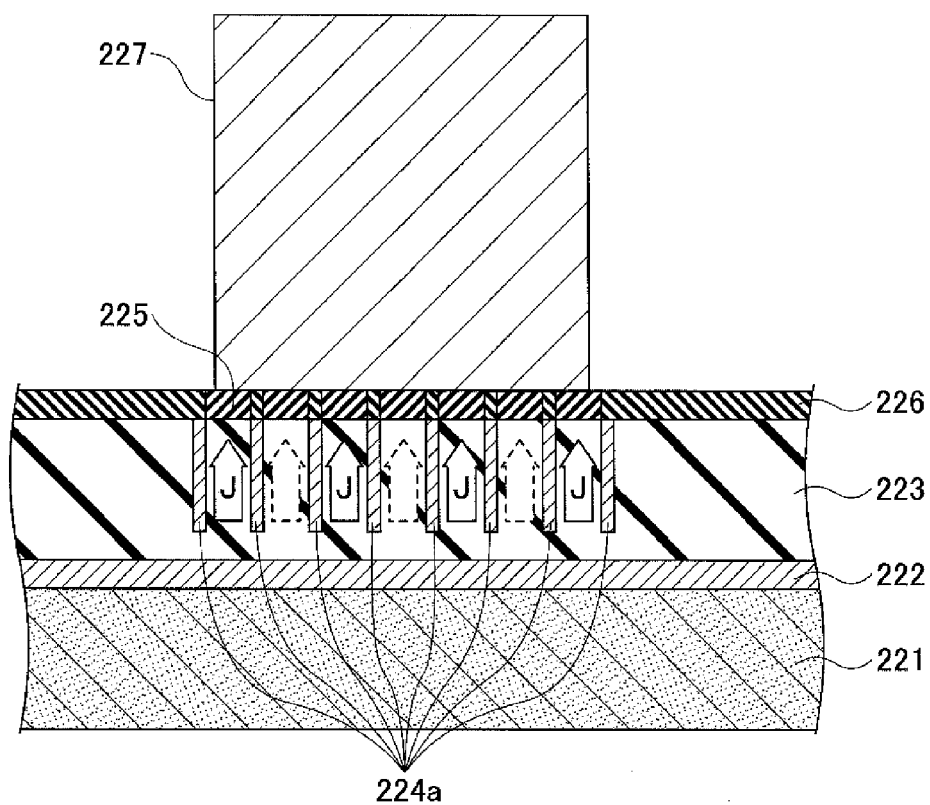
FIG. 41 is a cross-sectional view illustrating the major part of the acceleration sensor according to the third embodiment.

The X-axis direction acceleration sensor in the acceleration sensor according to the third embodiment is described below with reference to FIGS. 40 and 41. Note that the Z-axis direction acceleration sensor utilized in the acceleration sensor according to the third embodiment is similar to the Z-axis direction acceleration sensor utilized in the acceleration sensor according to the first embodiment. FIG. 41 is a cross-sectional view taken along a dash-dot line 41A-41B in FIG. 40.

The X-axis direction acceleration sensor in the acceleration sensor according to the third embodiment includes a lower electrode 222 and a ferroelectric layer 223 serving as a piezoelectric layer formed on a silicon substrate 221, in which a sensing electrode 224 is formed inside the ferroelectric layer 223.

The sensing electrode 224 includes connecting electrodes 224b configured to connect corresponding adjacent pairs of discrete sensing electrodes 224a formed perpendicular to the X-axis direction. Specifically, the connecting electrodes 224b connect every other pair of the adjacent discrete sensing electrodes 224a, respectively. One end of the sensing electrode 224 is connected to an electrode terminal 229a via an extracting electrode and the other end of the sensing electrode 224 is connected to an electrode terminal 229b via an extracting electrode. With this configuration, parts of the ferroelectric layer 223 sandwiched between the adjacent discrete sensing electrodes 224a are connected in series.

Further, the parts of the ferroelectric layer 223 interposing between the discrete sensing electrodes 224a are polarized in directions indicated by thick arrows J (see FIG. 41).

Further, an insulator layer 225 is formed on the ferroelectric layer 223 interposing between the discrete sensing electrodes 224a formed in the X-axis direction acceleration sensor, and a weight part 227 is formed on the insulator layer 225 on the ferroelectric layer 223. Note that a resin material layer 226 is formed on the sensing electrode 224, and also in areas of the ferroelectric layer 223 where the insulator layer 225 is not formed.

Further, the acceleration sensor according to the third embodiment includes the Y-axis direction acceleration sensor having a configuration similar to that of the X-axis direction acceleration sensor. The Y-axis direction acceleration sensor is arranged in a direction 90 degrees differing from the direction in which the X-axis direction acceleration sensor is arranged. Specifically, the direction in which the teeth of the discrete sensing electrodes 224a formed in the X-axis direction acceleration sensor extend and the direction in which the teeth of the discrete sensing electrodes 224a formed in the Y-axis direction acceleration sensor extend may differ from each other by approximately 90 degrees. Thus, the teeth of the discrete sensing electrodes 224a formed in the X-axis direction acceleration sensor extend in the Y-axis direction perpendicular to the X-axis direction. The teeth of the discrete sensing electrodes 224a formed in the Y-axis direction acceleration sensor extend in the X-axis direction perpendicular to the Y-axis direction.

Accordingly, the acceleration sensor according to the third embodiment includes a configuration in which the parts of the ferroelectric layer 223 that are sandwiched between the adjacent discrete sensing electrodes 224a are connected in series. With this configuration, high electromotive force may be generated by low acceleration and hence, the acceleration sensor having an even higher sensitivity may be produced.

Note that in the acceleration sensors according to the first to third embodiments, electric charges or electromotive force may be acquired from the piezoelectric layer as a result of external vibration. Accordingly, the acceleration sensors according to the first to third embodiments may also be utilized as a vibration power generator device utilized for sensors constituting a sensor network. Specifically, a vibration power generator device may be formed by connecting a rectifier circuit to the sensing electrodes of the acceleration sensors according to the first to third embodiments and storing the electrical charge in a secondary battery (i.e., a storage unit).

In the disclosed acceleration sensors and the disclosed method for manufacturing the acceleration sensors according to the first to third embodiments, the acceleration sensors having high toughness and high sensitivity may be produced. Further, the vibration power generator device incorporating such the disclosed acceleration sensors according to the first to third embodiments may be produced.

The acceleration sensors according to the first to third embodiments, the method for manufacturing the acceleration sensors according to the first to third embodiments, and the vibration power generator device incorporating the acceleration sensors according to the first to third embodiments that have been described so far are not limited to the disclosed embodiments. Various modifications or alterations may be made within the scope of the inventions described in the claims.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority or inferiority of the invention. Although the embodiments of the present invention have been described in detail, it should be understood that the various changes, substitutions, and alterations could be made hereto without departing from the spirit and scope of the invention.

What is claimed is:

1. An acceleration sensor comprising:
   a piezoelectric layer formed on a substrate; and
   a plurality of sensing electrodes formed in the piezoelectric layer, the piezoelectric layer interposing between the sensing electrodes and being polarized in a film thickness direction of the piezoelectric layer,
   wherein interval areas of the piezoelectric layer between the sensing electrodes are polarized in polarization directions that intersect with a direction in which acceleration is detected, and
   wherein the adjacent interval areas of the piezoelectric layer between the sensing electrodes are polarized in mutually opposite polarization directions.

2. The acceleration sensor as claimed in claim 1,
   wherein the respective sensing electrodes are formed inside grooves of the piezoelectric layer.

3. The acceleration sensor as claimed in claim 1, further comprising:
   a weight part formed via an insulator film on the piezoelectric layer interposing between the sensing electrodes.

4. The acceleration sensor as claimed in claim 1,
   wherein the piezoelectric layer is formed of a ferroelectric material.

5. The acceleration sensor as claimed in claim 1,
   wherein the sensing electrodes are configured to extend in directions intersecting with a direction in which acceleration is detected such that the sensing electrodes are arranged along the direction in which the acceleration is detected.

6. An acceleration sensor comprising:
at least two of the acceleration sensors as claimed in claim 5 including a first acceleration sensor and a second acceleration sensor,
wherein a first direction in which acceleration is detected by the first acceleration sensor intersects with a second direction in which acceleration is detected by the second acceleration sensor.

7. An acceleration sensor comprising:
two of the acceleration sensors as claimed in claim 5 including a first acceleration sensor and a second acceleration sensor; and
a third acceleration sensor,
wherein the first acceleration sensor detects acceleration in a first direction, the second acceleration sensor detects acceleration in a second direction intersecting the first direction, and the third acceleration sensor detects acceleration in a third direction intersecting the first direction and the second direction such that acceleration in three dimensional directions is detected.

8. The acceleration sensor as claimed in claim 1,
wherein the sensing electrodes include at least a first comb-shaped electrode and a second comb-shaped electrode, each of the first comb-shaped electrode and the second comb-shaped electrode including teeth-shaped electrodes, and
wherein the teeth-shaped electrodes of the first comb-shaped electrode and the teeth-shaped electrodes of the second comb-shaped electrode are alternately arranged such that the teeth-shaped electrodes of the first comb-shaped electrode interpose between the corresponding adjacent teeth-shaped electrodes of the second comb-shaped electrode.

9. The acceleration sensor as claimed in claim 1,
wherein the piezoelectric layer is formed in every other interval area between the sensing electrodes, and
wherein the interval areas of the piezoelectric layer between the sensing electrodes include polarization directions aligned in one direction perpendicular to a direction in which acceleration is detected.

10. The acceleration sensor as claimed in claim 1,
wherein every other two adjacent sensing electrodes of the sensing electrodes are mutually connected.

11. The acceleration sensor as claimed in claim 10,
wherein interval areas of the piezoelectric layer between the sensing electrodes include polarization directions aligned in one direction perpendicular to a direction in which acceleration is detected.

12. The acceleration sensor as claimed in claim 1, further comprising:
a lower electrode between the substrate and the piezoelectric layer, the lower electrode being configured to polarize the piezoelectric layer.

13. A vibration power generator device comprising:
the acceleration sensor as claimed in claim 1 from which electromotive force is acquired; and
a storage unit configured to store the acquired electromotive force.

14. A method for manufacturing an acceleration sensor, the method comprising:
depositing a lower electrode and a piezoelectric layer on a substrate;
forming a plurality of grooves in the piezoelectric layer;
forming an upper electrode in interval areas between the grooves of the piezoelectric layer;
applying a voltage between the upper electrode and the lower electrode to polarize the interval areas between the grooves of the piezoelectric layer; and
forming a plurality of sensing electrodes in the grooves of the piezoelectric layer,
wherein the upper electrode formed in the interval areas between the grooves of the piezoelectric layer includes a first upper electrode and a second upper electrode, and
wherein the adjacent interval areas between the grooves of the piezoelectric layer are polarized in mutually opposite directions via the sensing electrodes by applying different voltages to the first upper electrode and the second upper electrode.

15. The method as claimed in claim 14, further comprising:
forming an insulator layer, after having formed the sensing electrodes in the grooves of the piezoelectric layer, in the interval areas between the sensing electrodes formed in the grooves of the piezoelectric layer; and
forming a weight part on the insulator layer.

16. The method as claimed in claim 14,
wherein the sensing electrodes are configured to extend in directions intersecting a direction in which acceleration is detected such that the sensing electrodes are arranged along the direction in which the acceleration is detected.

17. The method as claimed in claim 14,
wherein the interval areas between the grooves of the piezoelectric layer are polarized in polarization directions aligned in one direction perpendicular to a direction in which acceleration is detected.

18. The method as claimed in claim 14,
wherein the sensing electrodes include a first comb-shaped electrode and a second comb-shaped electrode, each of the first comb-shaped electrode and the second comb-shaped electrode including teeth-shaped electrodes, and
wherein the teeth-shaped electrodes of the first comb-shaped electrode and the teeth-shaped electrodes of the second comb-shaped electrode are alternately arranged such that the teeth-shaped electrodes of the first comb-shaped electrode interposes between the corresponding adjacent teeth-shaped electrodes of the second comb-shaped electrode.

* * * * *